United States Patent
Mathuriya et al.

(10) Patent No.: US 11,863,184 B1
(45) Date of Patent: *Jan. 2, 2024

(54) ASYNCHRONOUS VALIDITY TREE CIRCUIT USING MULTI-FUNCTION THRESHOLD GATE WITH INPUT BASED ADAPTIVE THRESHOLD

(71) Applicant: Kepler Computing Inc., San Francisco, CA (US)

(72) Inventors: Amrita Mathuriya, Portland, OR (US); Nabil Imam, Atlanta, GA (US); Ikenna Odinaka, Durham, NC (US); Rafael Rios, Austin, TX (US); Rajeev Kumar Dokania, Beaverton, OR (US); Sasikanth Manipatruni, Portland, OR (US)

(73) Assignee: KEPLER COMPUTING INC., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/648,114

(22) Filed: Jan. 14, 2022

Related U.S. Application Data

(63) Continuation of application No. 17/647,963, filed on Jan. 13, 2022.

(51) Int. Cl.
*H03K 19/23* (2006.01)
*H03K 19/17784* (2020.01)
(Continued)

(52) U.S. Cl.
CPC ....... *H03K 19/23* (2013.01); *H03K 19/17744* (2013.01); *H03K 19/17784* (2013.01); *H03K 19/185* (2013.01)

(58) Field of Classification Search
CPC ........... H03K 19/185; H03K 19/17744; H03K 19/17784; H03K 19/23
See application file for complete search history.

(56) References Cited

U.S. PATENT DOCUMENTS

| | | | |
|---|---|---|---|
| 3,260,863 A | 7/1966 | Burns et al. | |
| 3,524,977 A | 8/1970 | Wang | |

(Continued)

FOREIGN PATENT DOCUMENTS

| | | | |
|---|---|---|---|
| JP | 2000156472 A | 6/2000 | |
| KR | 20160089141 A | 7/2016 | |

OTHER PUBLICATIONS

"Kepler Logic", Named for Amalie Emmy Noether @ https://en.wikipedia.org/wiki/Emmy_Noether.
(Continued)

*Primary Examiner* — Kurtis R Bahr
(74) *Attorney, Agent, or Firm* — MUGHAL GAUDRY & FRANLKIN PC

(57) ABSTRACT

Asynchronous circuit elements are described. Asynchronous circuit elements include a consensus element (c-element), completion tree, and validity tree. The c-element is implemented using adjustable threshold based multi-input capacitive circuitries. The completion tree comprises a plurality of c-elements organized in a tree formation. The validity tree comprises OR gates followed by c-elements. The multi-input capacitive circuitries include capacitive structures that may comprise linear dielectric, paraelectric dielectric, or ferroelectric dielectric. The capacitors can be planar or non-planar. The capacitors may be stacked vertically to reduce footprint of the various asynchronous circuitries.

20 Claims, 31 Drawing Sheets

(51) Int. Cl.
*H03K 19/185* (2006.01)
*H03K 19/17736* (2020.01)

(56) References Cited

U.S. PATENT DOCUMENTS

| | | | |
|---|---|---|---|
| 5,381,352 A | 1/1995 | Shou et al. | |
| 5,818,380 A | 10/1998 | Ito et al. | |
| 5,835,045 A | 11/1998 | Ogawa et al. | |
| 5,926,057 A | 7/1999 | Ogawa et al. | |
| 5,978,827 A | 11/1999 | Ichikawa | |
| 6,043,675 A | 3/2000 | Miyamoto | |
| 6,198,652 B1 | 3/2001 | Kawakubo et al. | |
| 6,208,282 B1 | 3/2001 | Miyamoto | |
| 7,837,110 B1 | 11/2010 | Hess et al. | |
| 7,897,454 B2 | 3/2011 | Wang et al. | |
| 8,247,855 B2 | 8/2012 | Summerfelt | |
| 9,276,040 B1 | 3/2016 | Marshall et al. | |
| 9,324,405 B2 | 4/2016 | Evans, Jr. et al. | |
| 9,697,882 B1 | 7/2017 | Evans, Jr. et al. | |
| 9,858,979 B1 | 1/2018 | Derner et al. | |
| 9,973,329 B2 | 5/2018 | Hood et al. | |
| 10,217,522 B2 | 2/2019 | Wang et al. | |
| 10,679,782 B2 | 6/2020 | Manipatruni et al. | |
| 10,944,404 B1 | 3/2021 | Manipatruni et al. | |
| 11,025,254 B1 * | 6/2021 | Manipatruni | H03K 19/16 |
| 11,036,581 B2 * | 6/2021 | Chen | G06F 11/1048 |
| 11,277,137 B1 * | 3/2022 | Manipatruni | H03K 19/185 |
| 11,303,280 B1 * | 4/2022 | Mathuriya | H01L 28/55 |
| 11,482,270 B1 | 10/2022 | Dokania et al. | |
| 2001/0052619 A1 | 12/2001 | Inoue et al. | |
| 2004/0183508 A1 | 9/2004 | Toyoda et al. | |
| 2015/0337983 A1 | 11/2015 | Dolenti et al. | |
| 2017/0212702 A1 * | 7/2017 | Zianbetov | G06F 12/0246 |
| 2017/0243917 A1 | 8/2017 | Manipatruni et al. | |
| 2017/0337983 A1 | 11/2017 | Wang et al. | |
| 2018/0076815 A1 | 3/2018 | Vigeant et al. | |
| 2018/0240583 A1 | 8/2018 | Manipatruni et al. | |
| 2019/0074295 A1 | 3/2019 | Schröder | |
| 2019/0181864 A1 * | 6/2019 | Lopes | H03K 19/00338 |
| 2019/0318775 A1 | 10/2019 | Rakshit et al. | |
| 2019/0348098 A1 | 11/2019 | El-Mansouri et al. | |
| 2020/0091414 A1 | 3/2020 | Liu et al. | |
| 2020/0210233 A1 | 7/2020 | Chen et al. | |

OTHER PUBLICATIONS

Fichtner, S. et al., "AlScN: A III-V semiconductor based ferroelectric", Journal of Applied Physics 125, 114103 (2019); https://doi.org/10.1063/1.5084945, 2019, 28 pages.

Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.

Muroga, S., "Threshold Logic and its Applications", New York, Wiley-Interscience. published 1971.

Nowick et al., "Asynchronous Design—Part 1: Overview and Recent Advances." IEEE Design & Test ( vol. 32, Issue: 3, Jun. 2015).

Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.

Sutherland et al., "Computers without Clocks," Scientific American. Aug. 1, 2002;287(2):62-69.

Non-Final Office Action dated Jul. 25, 2023 for U.S. Appl. No. 17/648,122.

Non-Final Office Action dated Sep. 13, 2023 for U.S. Appl. No. 17/648,112.

Notice of Allowance dated Aug. 15, 2023 for U.S. Appl. No. 17/648,121.

Notice of Allowance dated Aug. 18, 2023 for U.S. Appl. No. 17/647,963.

Notice of Allowance dated Aug. 30, 2023 for U.S. Appl. No. 17/648,122.

Non-Final Office Action dated Oct. 11, 2023 for U.S. Appl. No. 17/648,125.

Non-Final Office Action dated Sep. 20, 2023 for U.S. Appl. No. 17/648,115.

Non-Final Office Action dated Sep. 20, 2023 for U.S. Appl. No. 17/648,124.

Notice of Allowance dated Oct. 16, 2023 for U.S. Appl. No. 17/648,112.

* cited by examiner

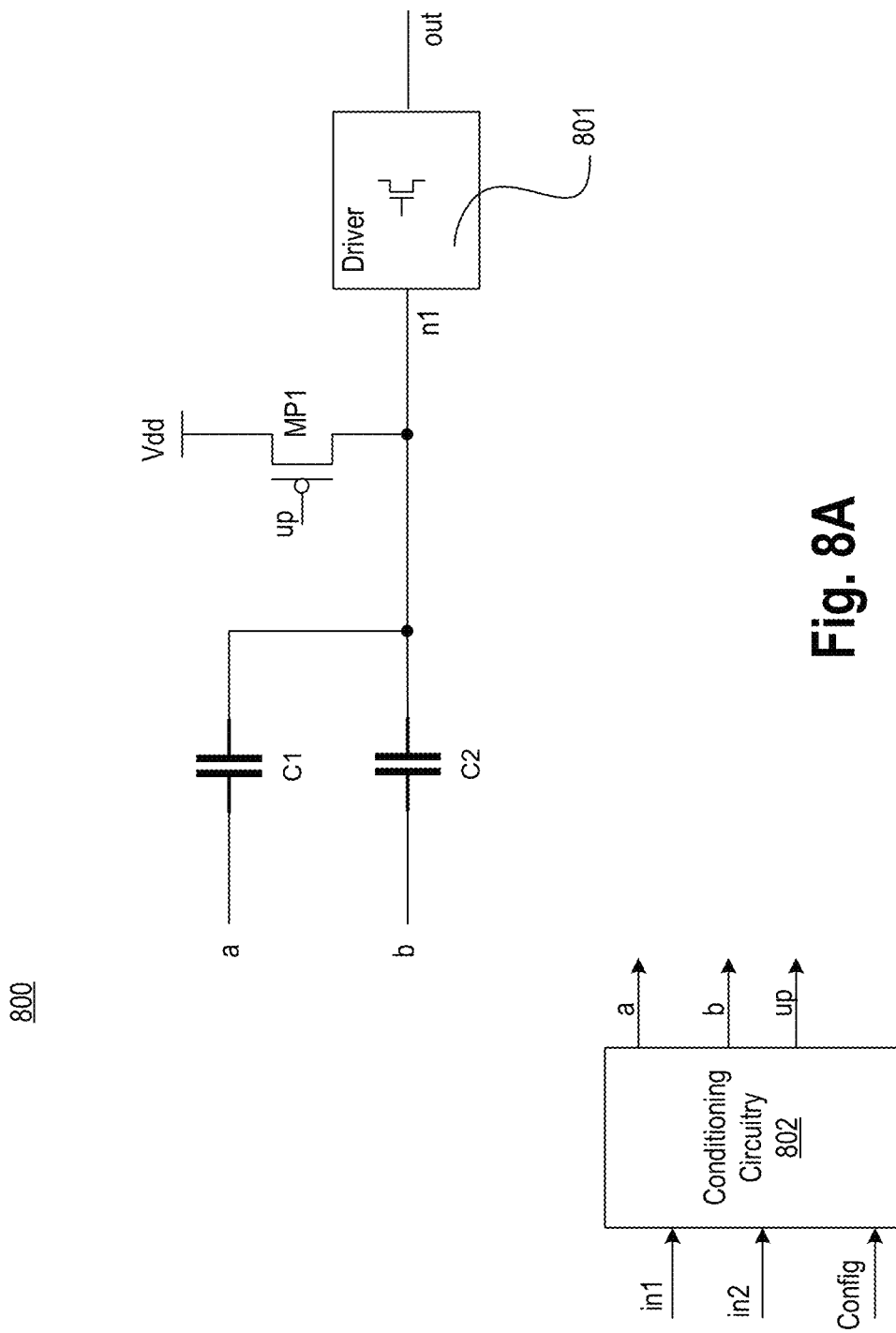

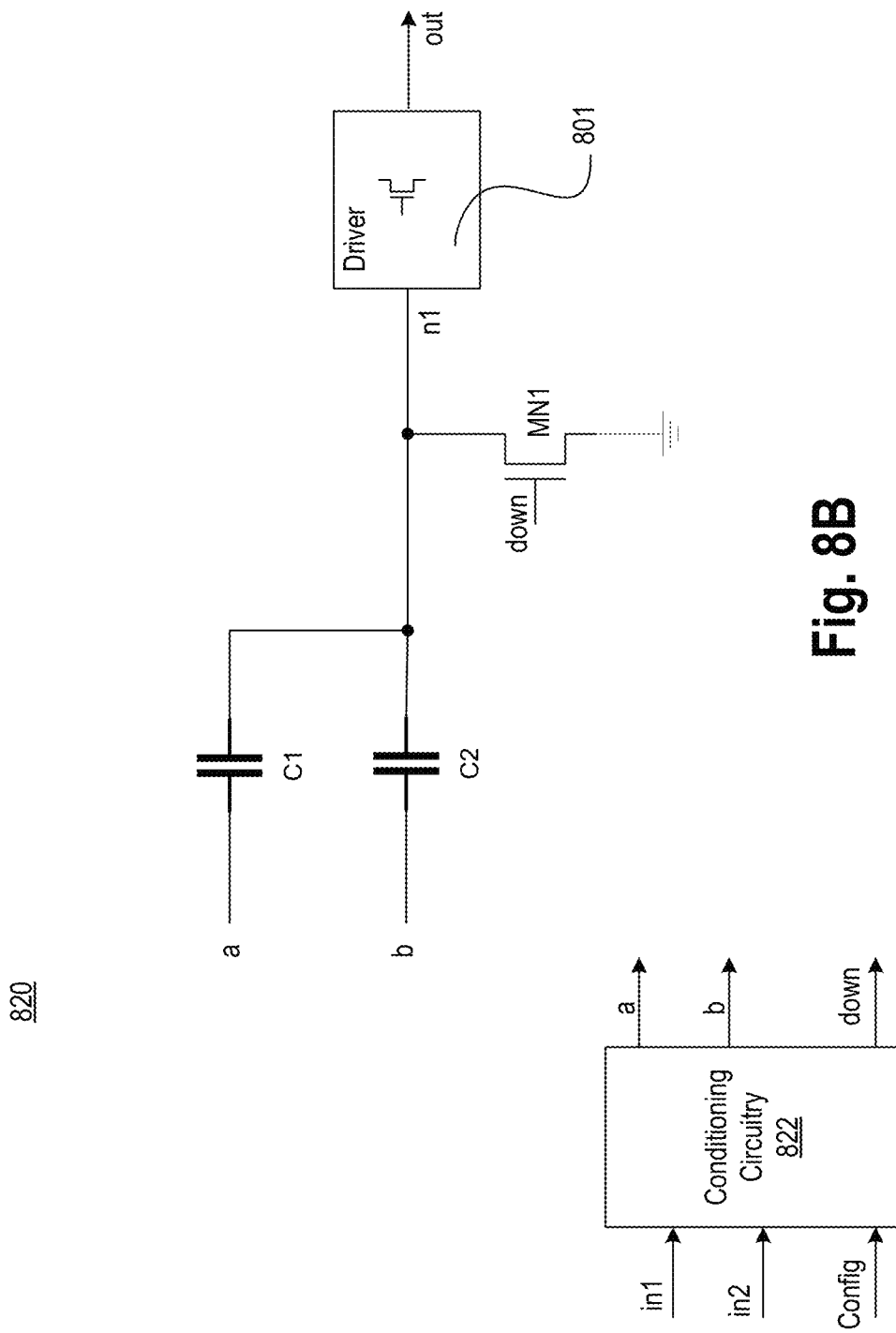

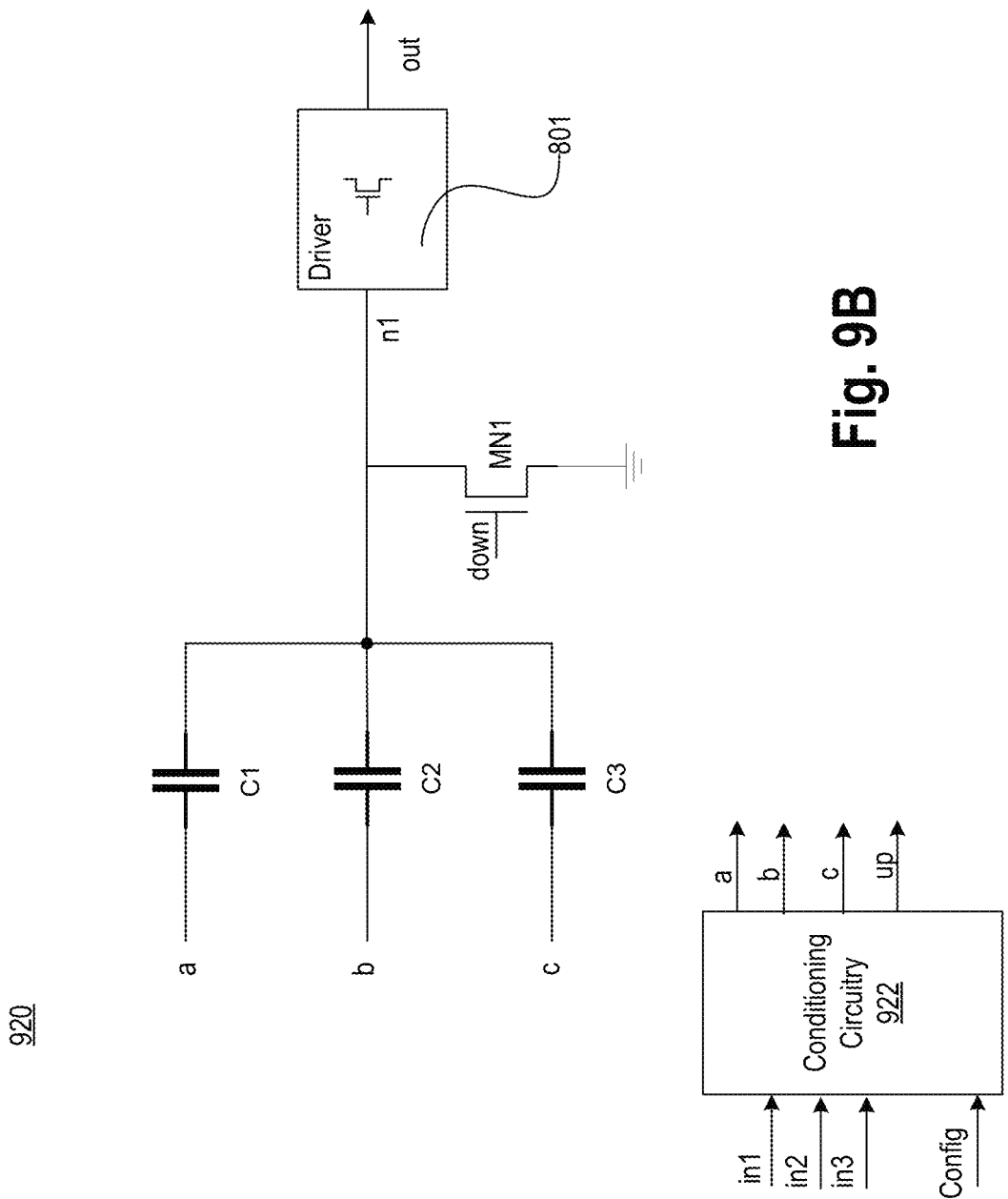

ASYNCHRONOUS VALIDITY TREE CIRCUIT USING MULTI-FUNCTION THRESHOLD GATE WITH INPUT BASED ADAPTIVE THRESHOLD

CLAIM FOR PRIORITY

This application is a continuation of, and claims the benefit of priority to U.S. patent application Ser. No. 17/647,963, filed on Jan. 13, 2022, and titled, "Asynchronous Consensus Circuit using Multi-Function Threshold Gate with Input Based Adaptive Threshold," and which is incorporated by reference in its entirety.

BACKGROUND

Logic circuits can be categorized as synchronous logic or asynchronous logic. Synchronous logic uses a global clock circuit to synchronize various logic components. For example, outputs of a combinational logic block are sampled by latches or flip-flops by a clock to generate synchronized data. Asynchronous logic does not use a global clock to synchronize its various logic components. Instead, asynchronous logic use handshaking protocols as data propagates from one logic component to another. Existing asynchronous logic use stacks of transistors between power supply rail and ground rail. Such circuits are challenging to use in low voltage conditions.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 8A illustrates a 2-input adjustable threshold gate with linear or paraelectric capacitors and a pull-up device on a summing node, in accordance with some embodiments.

FIG. 8B illustrates a 2-input adjustable threshold gate with linear or paraelectric capacitors and a pull-down device on a summing node, in accordance with some embodiments.

FIG. 9B illustrates a 3-input adjustable threshold gate with linear or paraelectric capacitors and a pull-down device on a summing node, in accordance with some embodiments.

DETAILED DESCRIPTION

Figure 1:
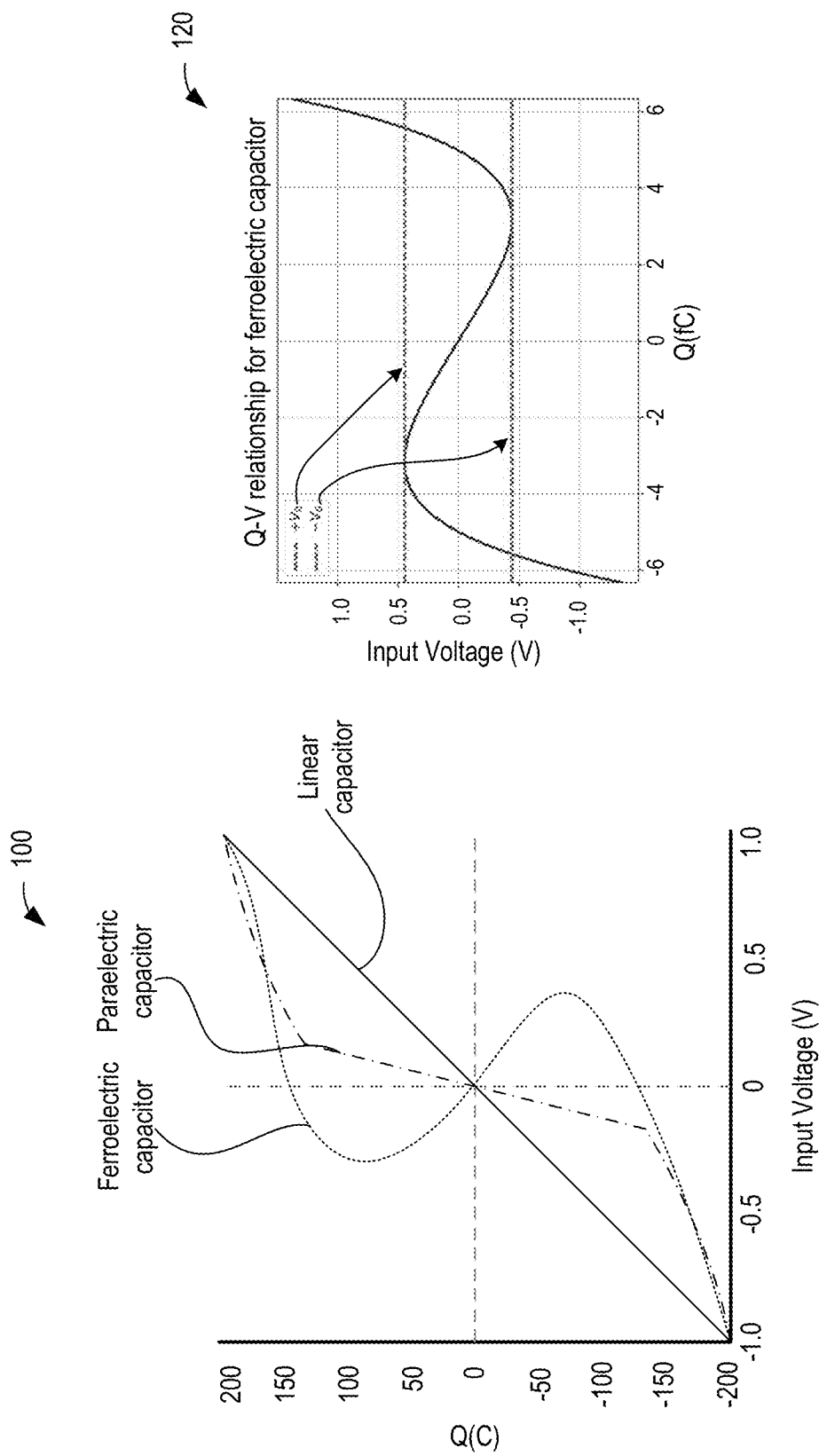
FIG. 1 illustrates a set of plots and showing behavior of a ferroelectric capacitor, a paraelectric capacitor, and a linear capacitor.

Some embodiments describe asynchronous circuits using threshold gate(s) and/or majority gate(s) (or minority gate(s)). The new class of asynchronous circuits can operate at lower power supply levels (e.g., less than 1V on advanced technology nodes) because stack of devices between a supply node and ground are significantly reduced compared to traditional asynchronous circuits. The asynchronous circuits here result in area reduction (e.g., 3× reduction compared to traditional asynchronous circuits) and provide higher throughput/mm$^2$ (e.g., 2× higher throughput compared to traditional asynchronous circuits). The threshold gate(s), majority/minority gate(s) can be implemented using capacitive input circuits. The capacitors of the capacitive input circuits can have linear dielectric or nonlinear polar material (e.g., paraelectric or ferroelectric) as dielectric. While the circuits here are described with reference to asynchronous circuits, the circuits can also be used in synchronous circuits. For example, combinational logic associated with synchronous circuits can use the asynchronous circuits discussed herein. In some embodiments, input signals to threshold or majority gates can be clock signals, which allow these asynchronous circuits to operate as synchronous circuits.

Some embodiments describe a consensus element (c-element) that outputs a consensus of inputs. For example, when inputs are all logic 1, then the output of the c-element is logic 1 and when inputs are all logic 0, then the output of the c-element is logic 0. In some embodiments, the output is state-holding when all inputs are not the same logic value. For example, a 3-input c-element is state holding when all three inputs are not the same logical value. In this case the output will be the output from a previous state. In some embodiments, the c-element is implemented with a majority or minority gate. As discussed herein, the majority or minority gate may be implemented by adjusting a threshold of a capacitive input circuit.

Some embodiments describe a completion tree which is a network or tree of c-elements. The output of the completion tree is a logic 1 when all inputs to the completion tree are logic 1, in accordance with some embodiments. The output of the completion tree is a logic 0 when all inputs to the completion tree are a logic 0, in accordance with some embodiments. The output of the completion tree is state-holding when all inputs are not the same logic value.

Some embodiments describe a validity tree. In some embodiments, the validity tree comprises OR-gates and c-elements coupled in a tree-like arrangement where the OR gates receive the inputs and the output of the OR gates are input to the c-elements. In some embodiments, the OR gates are implemented as threshold gates whose threshold is programmed or adjusted to generate an OR function. An output of a validity tree is logic 1 when all input bits are valid, in accordance with some embodiments. The output of the validity tree is logic 0 when all input bits are neutral. When the inputs bits are either valid or neutral, the output of the validity tree holds its state, in accordance with some embodiments. In various embodiments, an individual input comprises two bits, 'f' and 't'. For example, a data input channel X includes a first bit X.f and a second bit X.t. An individual input X has a valid 0 state if X.f is logic 1 and if X.t is logic 0, in accordance with some embodiments. An individual input X has a valid 1 state if X.f is logic 0 and if X.t is logic 1, in accordance with some embodiments. An individual input X has a neutral state if X.f is logic 0 and if X.t is logic 0, in accordance with some embodiments.

Some embodiments provide an apparatus and configuring scheme where capacitive input circuit can be programmed to perform different logic functions by adjusting the switching threshold of the capacitive input circuit. These capacitive circuits can become the basic building blocks for the c-element, the completion tree, and/or the validity tree. Digital inputs are received by respective capacitors on first terminals of those capacitors. In various embodiments, these capacitors comprise linear dielectric, paraelectric dielectric material, or ferroelectric dielectric material. The second terminals of the capacitors are connected to a summing node, in accordance with various embodiments. In some embodiments, a pull-up and/or pull-down device is coupled to the summing node. The pull-up and/or pull-down devices are controlled separately.

In some embodiments, during a reset phase, depending on the type of capacitor (linear, paraelectric, or ferroelectric), the inputs to the capacitive input circuit are conditioned and the pull-up or pull-down device is turned on or off. As such the threshold of the capacitive input circuit is set. In some embodiments, when the capacitors have linear dielectric or paraelectric dielectric, one of pull-up or pull-down devices may couple to the summing node. In some embodiments, when the capacitors have ferroelectric dielectric then both pull-up and pull-down devices may couple to the summing node. In one such embodiment, the pull-up and pull-down devices are turned on and off in a sequence and inputs are conditioned to adjust the threshold of the capacitive input circuit. After the reset phase, an evaluation phase follows, in accordance with some embodiments. In the evaluation phase, the output of the capacitive input circuit is determined based on the inputs and the logic function configured during the reset phase, in accordance with various embodiments. For example, the capacitive input circuit may operate as a NAND/AND gate, NOR/OR gate, majority/minority, threshold gate, or other complex gates based on its threshold configuration. In various embodiments, during the evaluation phase, the pull-up and pull-down devices coupled to the summing node are turned off. In some embodiments, all input capacitors have the same capacitance (e.g., same weight or ratio). In some embodiments, the input capacitors may have different capacitance. In that case, the switching threshold for the input capacitor circuit is modified differently by the reset phase. In some embodiments, a different logic gate can be realized by sequencing turning on/off of the pull-up and pull-down devices and changing inputs to the input capacitor circuit during the reset phase.

While the embodiments are described with reference to up-to 5-input capacitive circuit using equal ratio for the capacitance, the same idea can be expanded to any number of input capacitive circuit with equal or unequal ratio for capacitances. In various embodiments, the capacitances are nonlinear capacitors. For example, instead of linear dielectric, the capacitors include nonlinear dielectric material. Examples of nonlinear dielectric material include ferroelectric material and paraelectric material.

In some embodiments, the capacitor are planar capacitors. In some embodiments, the capacitors are pillar or trench capacitors. In some embodiments, the capacitors are vertically stacked capacitors to reduce the overall footprint of the multi-input capacitive circuit. In some embodiments, the transistors (MP1 and/or MN1) that charge or discharge the summing node n1 are planar or non-planar transistors. In some embodiments, transistors MP1 and/or MN1 are fabricated in the front-end of the die on a substrate. In some embodiments, when the capacitors have ferroelectric material, one of the transistors (e.g., MP1 or MN1) is fabricated in the front-end of the die while another one of the transistors is fabricated in the backend such that the stack of capacitors is between the frontend of the die and the backend of the die or between the two transistors. As such, the footprint of the multi-input capacitive circuit may be a footprint of a single transistor or slightly more than that. The various possible implementations of the c-element, the completion tree, and the validity tree using the adjustable threshold gate-based logic circuit allows for lower power and smaller area based asynchronous circuits compared to traditional asynchronous circuits.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

FIG. 1 illustrates a set of plots showing behavior of a ferroelectric capacitor, a ferroelectric capacitor, and a linear capacitor. Plot 100 compares the transfer function for a linear capacitor, a ferroelectric (PE) capacitor (a nonlinear capacitor) and a ferroelectric (FE) capacitor (a nonlinear capacitor). Here, x-axis is input voltage or voltage across the capacitor, while the y-axis is the charge on the capacitor. The ferroelectric material can be any suitable low voltage FE material that allows the FE material to switch its state by a low voltage (e.g., 100 mV). Threshold in the FE material has a highly nonlinear transfer function in the polarization vs. voltage response. The threshold is related to: a) nonlinearity of switching transfer function; and b) the squareness of the FE switching. The nonlinearity of switching transfer function is the width of the derivative of the polarization vs. voltage plot. The squareness is defined by the ratio of the remnant polarization to the saturation polarization, perfect squareness will show a value of 1. The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a nonlinear dielectric. The squareness of the FE switching can also be changed by the granularity of an FE layer. A perfectly epitaxial, single crystalline FE layer will show higher squareness (e.g., ratio is closer to 1) compared to a polycrystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

Plot 120 shows the charge and voltage relationship for a ferroelectric capacitor. A capacitor with ferroelectric material (also referred to as a FEC) is a nonlinear capacitor with its potential $V_F(Q_F)$ as a cubic function of its charge. Plot 120 illustrates characteristics of an FEC. Plot 120 is a charge-voltage (Q-V) plot for a block of $Pb(Zr_{0.5}Ti_{0.5})O_3$ of area $(100\ nm)^2$ and thickness 30 nm (nanometer). Plot 120 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). In some embodiments, the FE material is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, $BaTiO_3$, $KNbO_3$, $NaTaO_3$, etc. may be used for the FE material. Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3-2%. For chemically substituted $BiFeO3$, $BrCrO3$, $BuCoO3$ class of materials, La or rare earth substitution into the Bi site can tune the spontaneous distortion. In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between (or sandwiched between) conductive oxides. In various embodiments, when FE material is a perovskite, the conductive oxides are of the type AA'BB'O$_3$. A' is a dopant for atomic site A, it can be an element from the Lanthanides series. B' is a dopant for atomic site B, it can be an element from the transition metal elements, especially Sc, Ti, V, Cr, Mn, Fe, Co, Ni, Cu, Zn. A' may have the same valency of site A, with a different ferroelectric polarizability. In various embodiments, when metallic perovskite is used for the FE material, conductive oxides can include one or more of: IrO$_2$, RuO$_2$, PdO$_2$, OsO$_2$, or ReO$_3$. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is –0.05 or 0.5, and y is 0.95), HfZrO2, Hf—Si—O, La-substituted PbTiO3, PMN-PT based relaxor ferroelectrics.

In some embodiments, the FE material comprises one or more of: Hafnium (Hf), Zirconium (Zr), Aluminum (Al), Silicon (Si), their oxides or their alloyed oxides. In some embodiments, FE material includes one or more of: Al(1–x)Sc(x)N, Ga(1–x)Sc(x)N, Al(1–x)Y(x)N or Al(1–x–y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, FE material includes one or more of: Bismuth ferrite (BFO), lead zirconate titanate (PZT), BFO with doping material, or PZT with doping material, wherein the doping material is one of Nb or La; and relaxor ferroelectrics such as PMN-PT.

In some embodiments, the FE material includes Bismuth ferrite (BFO) with a doping material where in the doping material is one of Lanthanum, or any element from the lanthanide series of the periodic table. In some embodiments, FE material includes lead zirconium titanate (PZT), or PZT with a doping material, wherein the doping material is one of La, Nb. In some embodiments, FE material includes a relaxor ferro-electric including one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST).

In some embodiments, the FE material includes Hafnium oxides of the form, Hf1–x Ex Oy where E can be Al, Ca, Ce, Dy, Er, Gd, Ge, La, Sc, Si, Sr, Sn, or Y. In some embodiments, the FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are 'n' octahedral layers in thickness can be used. In some embodiments, the FE material comprises organic material. For example, polyvinylidene fluoride or polyvinylidene difluoride (PVDF).

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. In some embodiments, the paraelectric material includes one of: SrTiO3, Ba(x)Sr(y)TiO3 (where x is –0.5, and y is 0.95), BaTiO3, HfZrO2, Hf—Si—O, La-substituted PbTiO3, or PMN-PT based relaxor ferroelectrics.

Figure 2:
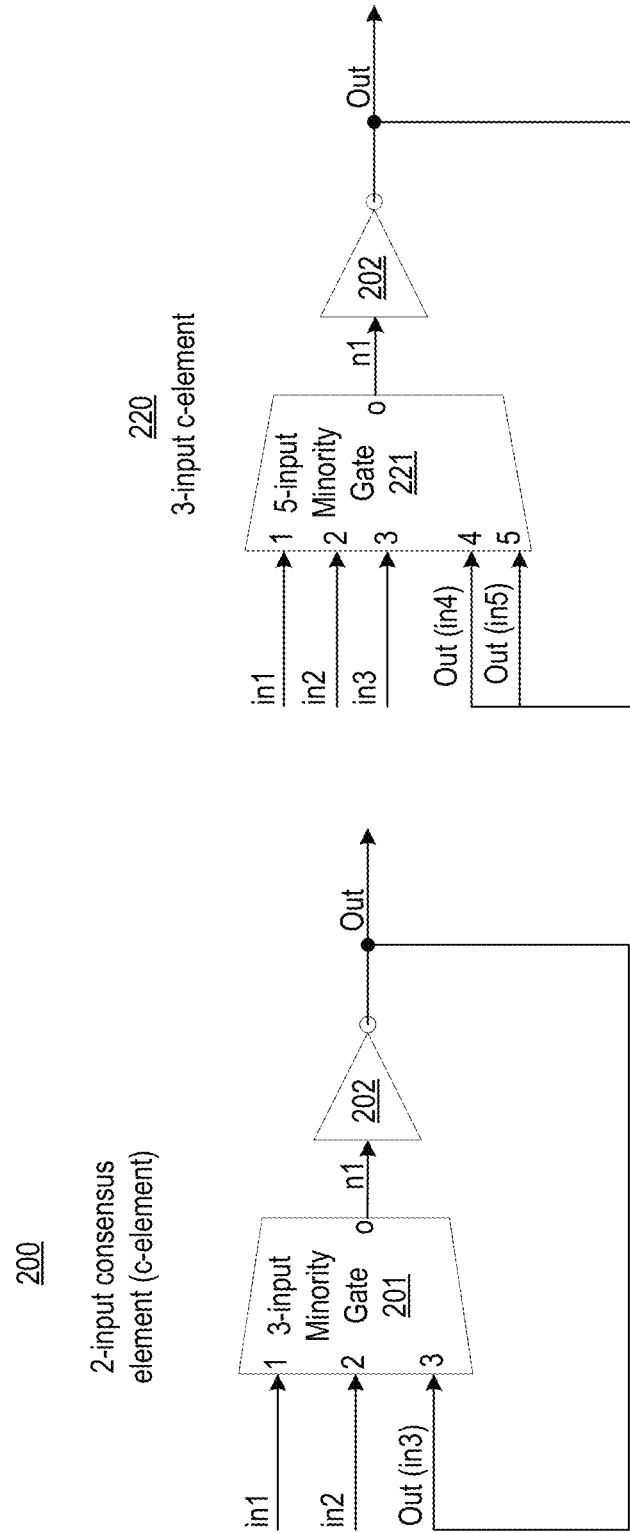
FIG. 2A illustrates a 2-input consensus element (c-element) comprising a 3-input minority gate and an inverter, where an adjustable threshold gate is programmed as a 3-input minority gate, in accordance with some embodiments.
FIG. 2B illustrates a 3-input c-element comprising a 5-input minority gate and an inverter, where an adjustable threshold gate is programmed as a 5-input minority gate, in accordance with some embodiments.

FIG. 2A illustrates 2-input consensus element (c-element) 200 comprising a 3-input minority gate and an inverter, where an adjustable threshold gate is programmed as a 3-input minority gate, in accordance with some embodiments. In some embodiments, c-element 200 comprises 3-input minority gate 201 and inverter 202. Inputs to 3-input minority gate 201 are in1, in2, and output "out" of inverter 202. Input in1 is connected to input pin 1, input in2 is connected to input pin 2, and output "out" (which is the third input in3) is connected to input pin 3. Output (o) of 3-input minority gate 201 is provided to node n1 which is input to inverter 202.

In various embodiments, c-element 200 outputs on node "out" a consensus of inputs in1 and in2. For example, when inputs in1 and in2 are all logic 1, then the output "out" of c-element 200 is logic 1, and when inputs in1 and in2 are all logic 0, then the output "out" of the c-element 200 is logic 0.

In some embodiments, the output is state-holding when all inputs (e.g., in1 and in2) are not the same logic value. For example, a 3-input c-element is state holding when all three inputs are not the same logical value. In this case the output will be the output from a previous state (e.g., holding logic 0 or 1 from a previous state). In various embodiments, 3-input minority gate 201 is implemented as an inverted threshold gate which is configured or programmed to have a threshold of 2 to implement a minority gate. The inverted threshold gate is a capacitive input circuit where capacitors can have linear dielectric, paraelectric dielectric or ferroelectric dielectric, in accordance with various embodiments.

FIG. 2B illustrates 3-input c-element 220 comprising a 5-input minority gate and an inverter, where an adjustable threshold gate is programmed as a 5-input minority gate, in accordance with some embodiments. In some embodiments, c-element 220 comprises 5-input minority gate 221 and inverter 202. Inputs to 5-input minority gate 221 are in1, in2, in3, and output "out" of inverter 202. Output of 5-input minority gate 221 is provided to node n1 which is input to inverter 202. Two of the inputs (inputs '4' and '5') of 5-input minority gate 221 are connected to node "out". In some embodiments, input in1 is connected to input pin 1, input in2 is connected to input pin 2, input in3 is connected to input pin 3, output "out" (which is the fourth input in4) is connected to input pin 4, and output "out" (which is the fifth input in5) is connected to input pin 5.

In various embodiments, c-element 220 outputs on node "out" a consensus of inputs in1, in2, and in3. For example, when inputs in1, in2, and in3 are all logic 1, then the output "out" of c-element 220 is logic 1, and when inputs in1, in2, and in3 are all logic 0, then the output "out" of the c-element 220 is logic 0. In some embodiments, the output "out" is state-holding when one of the inputs (e.g., one of in1, in2, or in3) is a logic 1 and one of the inputs (e.g., one of in1, in2, or in3) is a logic 0. The output is state-holding when all inputs are not the same logic value. In various embodiments, 5-input minority gate 221 is implemented as an inverted threshold gate which is configured or programmed to have a threshold of 3 to implement a minority gate. In some embodiments, the inverted threshold gate is a capacitive input circuit where capacitors can have linear dielectric, paraelectric dielectric or ferroelectric dielectric. While the embodiments here illustrate a 2-input c-element and a 3-input c-element, other number of inputs can be used too. In one such embodiment, the threshold of the capacitive input circuits can be adjusted to perform a desired function according to the number of inputs of the c-element.

Figure 3:
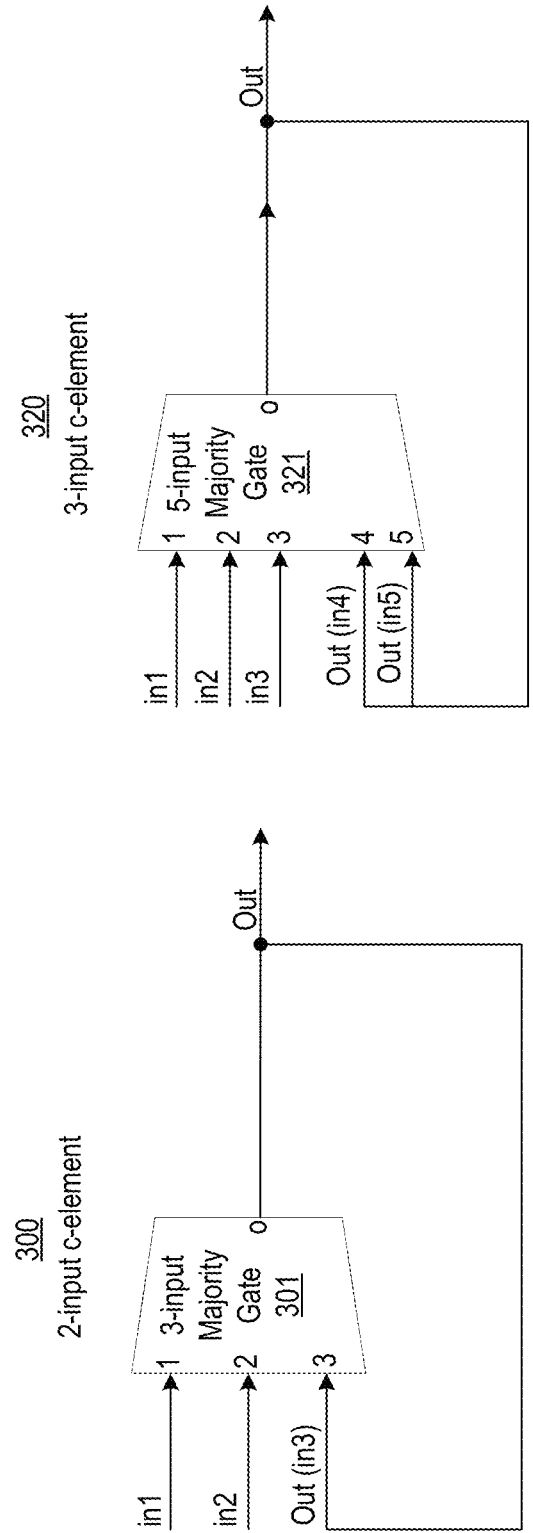
FIG. 3A illustrates a 2-input c-element comprising a 3-input majority gate, where an adjustable threshold gate is programmed as a 3-input majority gate, in accordance with some embodiments.
FIG. 3B illustrates a 3-input c-element comprising a 5-input majority gate, where an adjustable threshold gate is programmed as a 5-input majority gate, in accordance with some embodiments.

FIG. 3A illustrates 2-input c-element 300 comprising a 3-input majority gate, where an adjustable threshold gate is programmed as a 3-input majority gate, in accordance with some embodiments. 2-input c-element 300 is like 2-input c-element 200 but without inverter 202 and 3-input minority gate replaced with a 3-input majority gate. In some embodiments, inputs to 3-input majority gate 301 are in1, in2, and output "out". Input in1 is connected to input pin 1, input in2 is connected to input pin 2, and output "out" (which is the third input in3) is connected to input pin 3. In various embodiments, c-element 300 outputs on node "out" a consensus of inputs in1 and in2. For example, when inputs in1 and in2 are all logic 1, then the output "out" of c-element 300 is logic 1, and when inputs in1 and in2 are all logic 0, then the output "out" of the c-element 300 is logic 0. In some embodiments, the output "out" is state-holding when one of the inputs (e.g., one of in1 or in2) is a logic 1 and one of the inputs (e.g., one of in1 or in2) is a logic 0. The output is state-holding when all inputs are not the same logic value In various embodiments, 3-input majority gate 301 is implemented as a threshold gate which is configured or programmed to have a threshold of 2 to implement a majority gate. In some embodiments, the threshold gate is a capacitive input circuit where capacitors can have linear dielectric, paraelectric dielectric or ferroelectric dielectric.

FIG. 3B illustrates 3-input c-element 320 comprising a 5-input majority gate, where an adjustable threshold gate is programmed as a 5-input majority gate, in accordance with some embodiments. Inputs to 5-input majority gate 321 are in1, in2, in3, and output "out". Two of the inputs of 5-input majority gate 321 are connected to node "out". In some embodiments, input in1 is connected to input pin 1, input in2 is connected to input pin 2, input in3 is connected to input pin 3, output "out" (which is the fourth input in4) is connected to input pin 4, and output "out" (which is the fifth input in5) is connected to input pin 5.

In various embodiments, c-element 320 outputs on node "out" a consensus of inputs in1, in2, and in3. For example, when inputs in1, in2, and in3 are all logic 1, then the output "out" of c-element 320 is logic 1, and when inputs in1, in2, and in3 are all logic 0, then the output "out" of the c-element 320 is logic 0. In some embodiments, the output "out" is state-holding when one of the inputs (e.g., one of in1, in2, or in3) is a logic 1 and one of the inputs (e.g., one of in1, in2, or in3) is a logic 0. The output is state-holding when all the inputs are not the same logic value. In various embodiments, 5-input majority gate 321 is implemented as a threshold gate which is configured or programmed to have a threshold of 3 to implement a majority gate. In some embodiments, the threshold gate is a capacitive input circuit where capacitors can have linear dielectric, paraelectric dielectric or ferroelectric dielectric.

Figure 4:
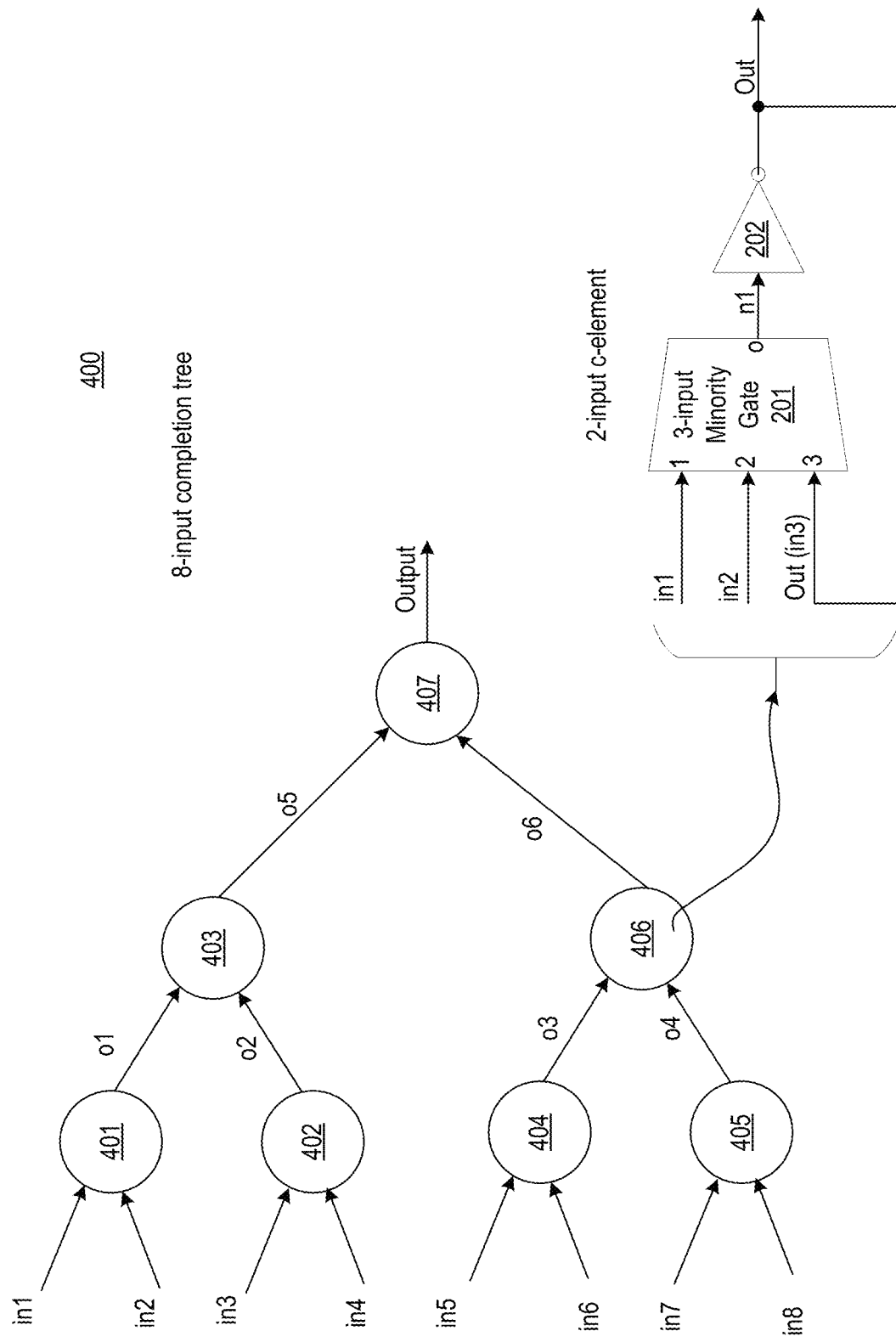
FIG. 4 illustrates an 8-input completion tree comprising c-elements, in accordance with some embodiments.

FIG. 4 illustrates 8-input completion tree 400 comprising c-elements, in accordance with some embodiments. In various embodiments, 8-input completion tree 400 is a network or tree of c-elements (e.g., c-elements 200, 220, 300, 320). The output of the completion tree is a logic 1 when all inputs to the completion tree are logic 1, in accordance with some embodiments. The output of the completion tree is a logic 0 when all inputs to the completion tree are a logic 0, in accordance with some embodiments. The output of the completion tree is state-holding when the inputs have at least one input having logic 1 and one input having logic 0. The output is state-holding when all the inputs are not the same logic value.

In some embodiments, 8-input completion tree 400 comprises c-elements 401, 402, 403, 404, 405, 406, and 407. In some embodiments, c-element 401 receives inputs in1 and in2 and generates an output o1 which is indicative of a consensus of inputs in1 and in2. In some embodiments, c-element 402 receives inputs in3 and in4 and generates an output o2 which is indicative of a consensus of inputs in3 and in4. In some embodiments, c-element 403 receives outputs o1 and o2 and generates an output o5 which is a consensus of outputs o1 and o2. In some embodiments, c-element 404 receives inputs in5 and in6 and generates an output o3 which is indicative of a consensus of inputs in5 and in6. In some embodiments, c-element 405 receives inputs in7 and in8 and generates an output o4 which is indicative of a consensus of inputs in7 and in8. In some embodiments, c-element 406 receives outputs o3 and o4 and generates an output o6 which is a consensus of outputs o3 and o4. In some embodiments, c-element 407 receives outputs o5 and o6 and generates a final output which is a consensus of outputs o5 and o6. The c-elements of the completion tree can be implemented according to any of c-element implementations discussed herein.

Figure 5:
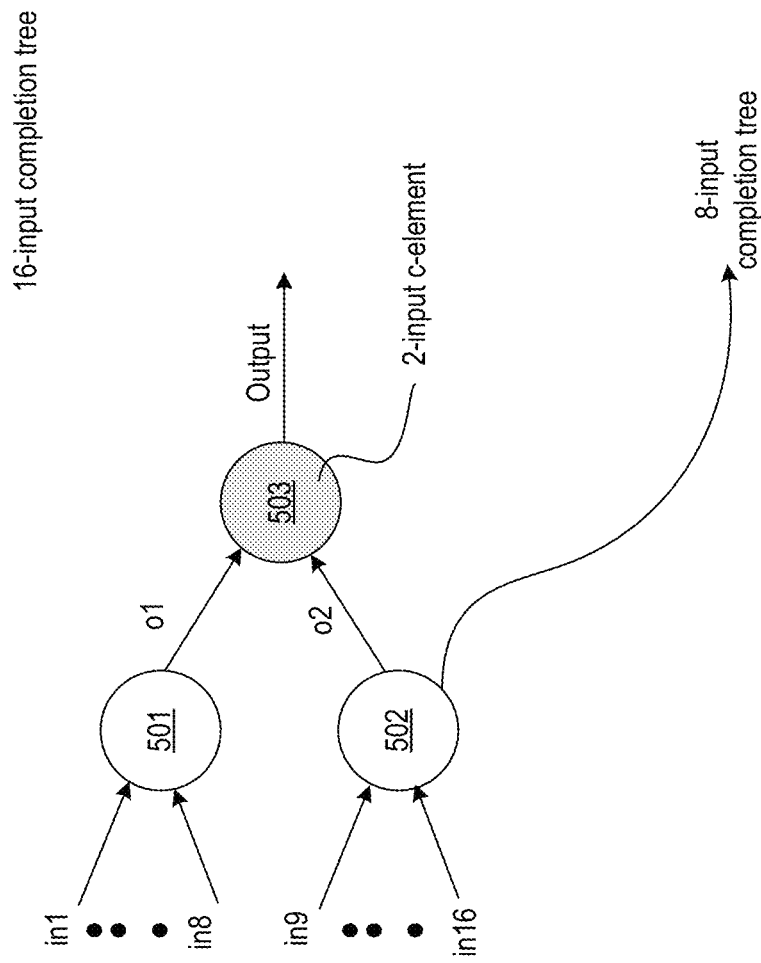
FIG. 5 illustrates a 16-input completion tree comprising the 8-input completion trees and a c-element, in accordance with some embodiments.

FIG. 5 illustrates 16-input completion tree 500 comprising the 8-input completion trees and a c-element, in accordance with some embodiments. 16-input completion tree 500 provides an example of how an N-input completion tree can be constructed. In some embodiments, 16-input completion tree 500 comprises first 8-input completion tree 501, second 8-input completion tree 502, and 2-input c-element 503. In some embodiments, first 8-input completion tree 501 and second 8-input completion tree 502 is according to 8-input completion tree 400.

In some embodiments, 8-input completion tree 501 receives a first set of eight inputs in1, in2, in3, in4, in5, in6, in7, and in8, and generates an output o1 which indicates a completion function of a first set of eight inputs. For example, output o1 is 1 when all inputs in1, in2, in3, in4, in5, in6, in7, and in8 are logic 1. Output o1 is 0 when all inputs in1, in2, in3, in4, in5, in6, in7, and in8 are logic 0. Output o1 holds its logic state when at least one input and at least one output to 8-input completion tree 501 is a logic 1 and a logic 0. In some embodiments, 8-input completion tree 502 receives a second set of eight inputs in9, in10, in11, in12, in13, in14, in15, and in16, and generates an output o1 which indicates a completion function of the second set of eight inputs. For example, output o2 is 1 when all inputs in9, in10, in11, in12, in13, in14, in15, and in16 are logic 1. Output o1 is 0 when all inputs in9, in10, in11, in12, in13, in14, in15, and in16 are logic 0. Output o1 holds its logic state when at least one input and at least one output to 8-input completion tree 502 is a logic 1 and a logic 0. In various embodiments, 2-input c-element 503 receives outputs o1 and o2 and generates Output which indicates a consensus of outputs o1 and o2. 2-input c-element 503 can be any of one of c-elements 200, 220, 300, 320. While the various illustrate two examples of completion tree, the concept can be applied to an N-input completion tree.

Figure 6:
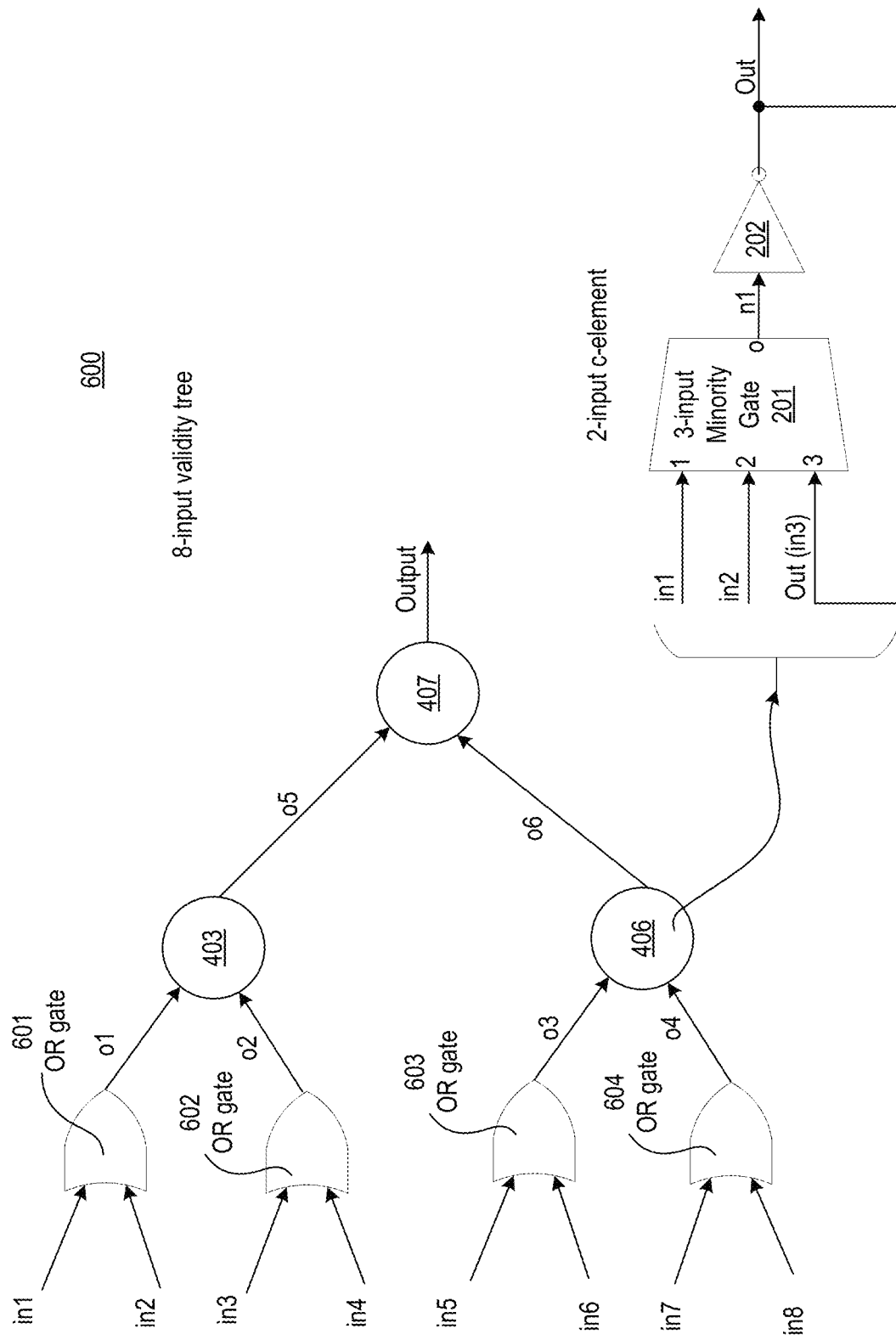
FIG. 6 illustrates an 8-input validity tree comprising OR-gates and c-elements, in accordance with some embodiments.

FIG. 6 illustrates 8-input validity tree 600 comprising OR gates and c-elements, in accordance with some embodiments. In some embodiments, 8-input validity tree 600 comprises OR gates 601, 602, 603, and 604, and c-elements 403, 406, and 407. In some embodiments, 8-input validity tree 600 is like 8-input completion tree 600 but for OR gates that replace c-elements 401, 402, 404, and 405.

In some embodiments, OR gates receive the inputs. For example, OR gate 601 receives inputs in1 and in2 and generates output o1 which is an OR function of inputs in1 and in2. In some embodiments, OR gate 602 receives inputs in3 and in4 and generates output o2 which is an OR function of inputs in3 and in4. In some embodiments, OR gate 603 receives inputs in5 and in6 and generates output o3 which is an OR function of inputs in5 and in6. In some embodiments, OR gate 604 receives inputs in7 and in8 and generates output o4 which is an OR function of inputs in7 and in8. The outputs of the OR gates are input to the c-elements.

In some embodiments, c-element 403 receives outputs o1 and o2 and generates an output o5 which is a consensus of outputs o1 and o2. In some embodiments, c-element 406 receives outputs o3 and o4 and generates an output o6 which is a consensus of outputs o3 and o4. In some embodiments, c-element 407 receives outputs o5 and o6 and generates a final output which is a consensus of outputs o5 and o6.

In some embodiments, the OR gates are implemented as threshold gates whose threshold is programmed or adjusted to generate an OR function. In some embodiments, the output of 8-input validity tree 600 is logic 1 when all input bits are valid, in accordance with some embodiments. The output of 8-input validity tree 600 is logic 0 when all input bits are neutral. When the inputs bits are either valid or neutral, the output of 8-input validity tree 600 holds its state, in accordance with some embodiments. In various embodiments, an individual input comprises two bits, 'f' and 't'. For example, a data input channel X includes a first bit X.f and a second bit X.t. In this example, would in1 be X.f and in2 be X.t. An individual input X has a valid 0 state if X.f is logic 1 and if X.t is logic 0, in accordance with some embodiments. An individual input X has a valid 1 state if X.f is logic 0 and if X.t is logic 1, in accordance with some embodiments. An individual input X has a neutral state if X.f is logic 0 and if X.t is logic 0, in accordance with some embodiments.

Figure 7:
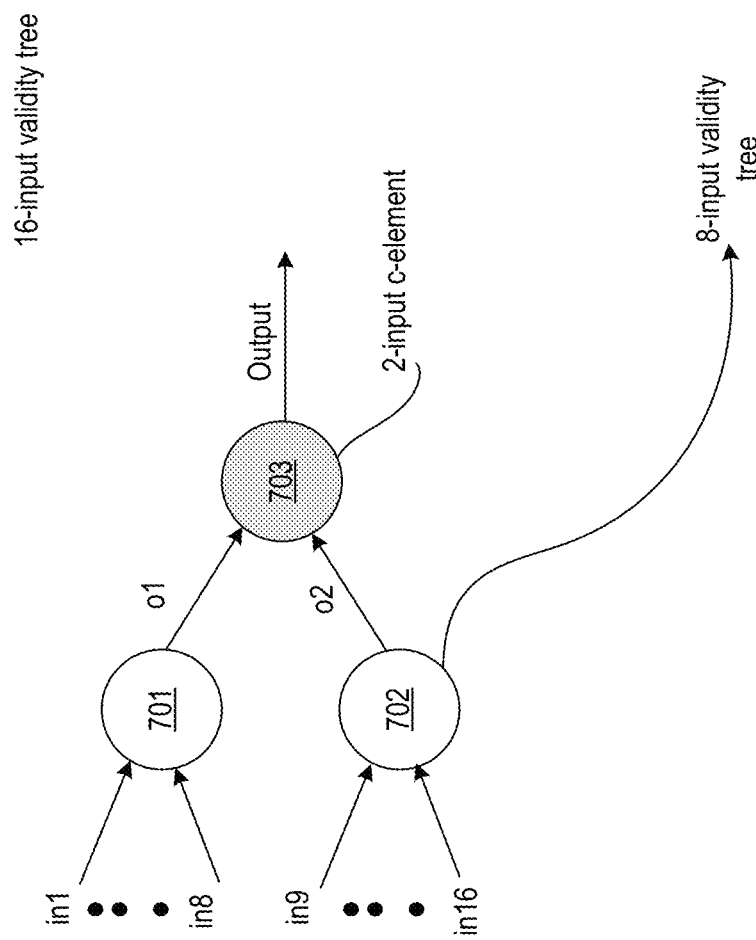
FIG. 7 illustrates a 16-input validity tree comprising the 8-input validity tree and a c-element, in accordance with some embodiments.

FIG. 7 illustrates 16-input validity tree 700 comprising the 8-input validity trees and a c-element, in accordance with some embodiments. In some embodiments, 16-input completion tree 700 comprises first 8-input validity tree 701, second 8-input validity tree 702, and 2-input c-element 703. In some embodiments, first 8-input validity tree 701 and second 8-input validity tree 702 is according to 8-input validity tree 600.

In some embodiments, 8-input completion tree 701 receives a first set of eight inputs in1, in2, in3, in4, in5, in6, in7, and in8, and generates an output o1 which indicates a validity function of the first set of eight inputs. In some embodiments, 8-input completion tree 702 receives a second set of eight inputs in9, in10, in11, in12, in13, in14, in15, and in16, and generates an output o1 which indicates a validity function of the first set of eight inputs. In various embodiments, 2-input c-element 703 receives outputs o1 and o2 and generates Output which indicates a consensus of outputs o1 and o2. 2-input c-element 703 can be any of one of c-elements 200, 220, 300, 320. While the various illustrate two examples of validity tree, the concept can be applied to an N-input validity tree.

The following section describes various embodiments of adjustable threshold gate that can be used as basis for the c-element, completion tree, and/or validity tree, in accordance with various embodiments.

FIG. 8A illustrates a 2-input adjustable threshold gate 800 with linear or paraelectric capacitors and a pull-up device on a summing node, in accordance with some embodiments. In some embodiments, 2-input capacitive circuit 800 comprises a first input (a), a second input (b), summing node (n1), first capacitor C1, second capacitor C2, pull-up-device MP1, driver 801, and output (out) coupled as shown. In some embodiments, the first capacitor C1 includes a first terminal coupled to the first input and a second terminal coupled to the summing node n1. In some embodiments, the second capacitor C2 includes a third terminal coupled to the second input and a fourth terminal coupled to the summing node n1. In some embodiments, the pull-up device MP1 is coupled to the summing node n1 and a power supply rail Vdd, wherein the pull-up device MP1 is controlled by a first control (up).

In various embodiments, during the reset phase, node n1 is pulled-up by transistor MP1 to Vdd, and inputs 'a' and 'b' are conditioned via conditioning circuit 802 to adjust the threshold of 2-input capacitive circuit 800. Conditioning circuitry 802 may receive inputs in1 and in2, and configuration setting (e.g., reset or evaluation) to determine the outputs 'a', 'b', and control "up". During the evaluation phase, in1 is passed on to output 'a' and in2 is passed on to 'b'. During the reset phase, depending on a desired threshold, outputs 'a' and 'b' are conditioned.

Here the term threshold generally refers to a number that indicates a number of inputs that should be set to logic high to perform a function of a threshold gate. For instance, by turning on/off the pull-up device MP1 and conditioning the inputs 'a' and 'b' during a reset phase, the charge at node n1 is set so that in an evaluation phase when the pull-up device MP1 is disabled, the input capacitive circuit attains a desired function. In one instance, when the threshold is set to 2 in a reset phase by a particular sequencing of turning on/off the pull-up device and conditioning of the inputs 'a' and 'b; it means that during an evaluation phase when both inputs 'a' and 'b' are logic high, then voltage on node n1 is logic high. Continuing with this example, when any of the inputs 'a' and 'b' is a logic low, then the voltage on node n1 resolves to logic low. As such, 2-input capacitive circuit 800 is programmed or configured as a AND gate at node n1 and a NAND gate at output out.

Likewise, when the threshold is set to 1 in a reset phase by a particular sequencing of turning on/off the pull-up device and conditioning of the inputs 'a' and 'b; it means that during an evaluation phase when either input 'a' and 'b' is logic high, then voltage on node n1 is logic high. Continuing with this example, when both the inputs 'a' and 'b' are a logic low, then the voltage on node n1 resolves to logic low. As such, 2-input capacitive circuit 800 is programmed or configured as an OR gate at node n1 and a NOR gate at output out. So, the same circuit can be used as a AND/NAND or OR/NOR gate by conditioning the inputs and resetting or setting the voltage on the summing node during a reset phase. Subsequently, in the evaluation phase the circuit will behave as AND/NAND or OR/NOR gate.

In some embodiments, conditioning circuitry 802 turns off the pull-up device MP1 during an evaluation phase separate from the reset phase. The reset phase or evaluation phase are indicated by the logic level of Config. For example, conditioning circuitry 802 sets the first control (up) to logic high (Vdd) and the second control (down) to logic low (ground) during an evaluation phase (e.g., Config is set to logic 1). Likewise, in a reset phase, Config is set to 0. This is just an example, and the logic level of Config can be modified to present the evaluation phase and the reset phase.

Table 1 illustrates that when inputs 'a' and 'b' are conditioned as logic 1 and pull-up device MP1 is enabled during the reset phase, then the threshold is set to 1. In the evaluation phase, 2-input capacitive circuit 800 can then behave as a NOR gate. Here, the capacitors comprise linear dielectric. Note, this example assumes equal weights (or substantially equal) for C1 and C2 (e.g., C1=C2). In some embodiments, the threshold may change (e.g., from 1 to 2) when the ratio of capacitances of capacitors C1 and C2 are modified.

TABLE 1

| Input 'a' | Input 'b' | First control (Up) | Threshold |
|---|---|---|---|
| 0 | 0 | 0 (enable MP1) | 0 |
| 1 | 0 | 0 (enable MP1) | 0 |
| 1 | 1 | 0 (enable MP1) | 1 |

A threshold of 0 means that the capacitive-input circuit is an always on circuit regardless of the logic levels of the inputs. In one such embodiment, during the evaluation phase for the circuit configured with threshold of zero, the logic value on node n1 is logic 1, and the logic value on output out is logic 0 (assuming the driver is an inverter).

When the capacitors comprise paraelectric material, different thresholds are achieved compared to the linear dielectric material for the same input conditioning.

Table 2 illustrates that when inputs 'a' and 'b' are conditioned as logic 1 and pull-up device MP1 is enabled during the reset phase, then the threshold is set to 1. In the evaluation phase, 2-input capacitive circuit 800 can then behave as a NOR gate. In some embodiments, when inputs 'a' and 'b' are conditioned as logic 1 and logic 0, respectively, and pull-up device MP1 is enabled during the reset phase, then the threshold is set to 1. In the evaluation phase, 2-input capacitive circuit 800 can then behave as an OR/NOR gate when the threshold is set to 1. In some embodiments, when inputs 'a' and 'b' are conditioned as logic 0 and pull-up device MP1 is enabled during the reset phase, then the threshold is set to 0. Note, this example assumes equal weights (or substantially equal) for C1 and C2 (e.g., C1=C2). In some embodiments, the threshold may change (e.g., from 1 to 2 or to some other level) when the ratio of capacitances of capacitors C1 and C2 are modified. Table 2 is the case when capacitors are paraelectric capacitors.

TABLE 2

| Input 'a' | Input 'b' | First control (Up) | Threshold |
|---|---|---|---|
| 0 | 0 | 0 (enable MP1) | 0 |
| 1 | 0 | 0 (enable MP1) | 1 |
| 1 | 1 | 0 (enable MP1) | 1 |

While the embodiment of FIG. 8A illustrates an inverter as driver 801, driver 801 can be any suitable logic. In some embodiments, driver 801 is a non-inverting circuit such as a buffer, AND, OR, a capacitive input circuit, or any non-inverting circuit. In some embodiments, driver 801 is an inverting circuit such as an inverter, NAND, NOR, XOR, XNOR, or any inverting circuit etc. In some embodiments, driver 801 is a multiplexer that connects summing nodes of other capacitive circuits to its inputs. In some embodiments, one or more inputs of the multiplexer are driven from a transistor-based logic. As such, the multiplexer can selectively output a desired output. In some embodiments, driver 801 is another capacitive input circuit where one of the inputs is coupled to the summing node n1 and other input(s) are coupled to other inputs. As such, complex logic can be formed with configurable threshold and thus function(s).

FIG. 8B illustrates 2-input adjustable threshold gate 820 with linear or paraelectric capacitors and a pull-down device on a summing node, in accordance with some embodiments. Compared to FIG. 8A, here pull-up device MP1 is removed and replaced with a pull-down device MN1 coupled to summing node n1 and ground supply terminal.

In various embodiments, during the reset phase, node n1 is pulled-down by transistor MN1 to ground, and inputs 'a' and 'b' are conditioned via conditioning circuit 822 to adjust the threshold of 2-input capacitive circuit 820. Table 3 illustrates input conditioning that provides a threshold of 2 when capacitors are linear capacitors. Conditioning circuitry 822 may receive inputs in1 and in2, and configuration setting (e.g., reset or evaluation) to determine the outputs 'a', 'b', and down. During the evaluation phase, in1 is passed on to output 'a' and in2 is passed on to 'b'. During the reset phase, depending on a desired threshold, outputs 'a' and 'b' are conditioned.

TABLE 3

| Input 'a' | Input 'b' | Second control (down) | Threshold |
|---|---|---|---|
| 0 | 0 | 1 (enable MN1) | 2 |
| 1 | 0 | 1 (enable MN1) | 2 |
| 1 | 1 | 1 (enable MN1) | 2 |

In this case, when inputs 'a' and 'b' are conditioned as shown in Table 3 and pull-down device MN1 is enabled during the reset phase, then the threshold is set to 2. In the evaluation phase, 2-input capacitive circuit 820 can then behave as an NAND gate. Note, this example assumes equal weights for C1 and C2 (e.g., C1=C2). In some embodiments, the threshold may change (e.g., from 2 to 1) when the ratio of capacitances of capacitors C1 and C2 are modified.

Table 4 illustrates input conditioning that provides a threshold of 2. When the capacitors comprise paraelectric material, different thresholds are achieved compared to the linear dielectric material for the same input conditioning. Table 4 is the case when capacitors comprise paraelectric material.

Conditioning circuitry 822 may receive inputs in1 and in2, and configuration setting (e.g., reset or evaluation) to determine the outputs 'a', 'b', and down. During the evaluation phase, in1 is passed on to output 'a' and in2 is passed on to 'b'. During the reset phase, depending on a desired threshold, outputs 'a' and 'b' are conditioned.

TABLE 4

| Input 'a' | Input 'b' | Second control (down) | Threshold |
|---|---|---|---|
| 0 | 0 | 1 (enable MN1) | 2 |
| 1 | 0 | 1 (enable MN1) | 2 |
| 1 | 1 | 1 (enable MN1) | 3 |

In this case, when inputs 'a' and 'b' are conditioned as shown in Table 4 and pull-down device MN1 is enabled during the reset phase, then the threshold is set to 2. In the evaluation phase, 2-input capacitive circuit 820 can then behave as an AND or NAND gate. In some embodiments, when inputs 'a' and 'b' are conditioned as logic 1 and pull-down device MN1 is enabled during the reset phase, then the threshold is set to 3. In the evaluation phase, when the threshold is higher than the number of inputs, 2-input capacitive circuit 820 behaves as a disconnected circuit where internal node n1 is floating and the output of driver out may be a don't care logic value. Note, this example assumes equal weights for C1 and C2 (e.g., C1=C2). In some embodiments, the threshold may change (e.g., from 2 to 1) when the ratio of capacitances of capacitors C1 and C2 are modified.

While the embodiments are illustrated with reference to same capacitances for first capacitor C1 and the second capacitor C2, the threshold can be affected by changing the capacitive ratio of C1 and C2. For example, the input conditioning scheme and the pull-up and pull-down device control can result in a different threshold than that in Table 4 when the capacitive ratio of C1 and C2 is not 1:1. Overall, the configuring scheme of various embodiments herein provide the flexibility of programming the threshold for 2-input capacitive circuit 820 in a reset phase to achieve a certain logic function in the evaluation phase.

Figure 9A:
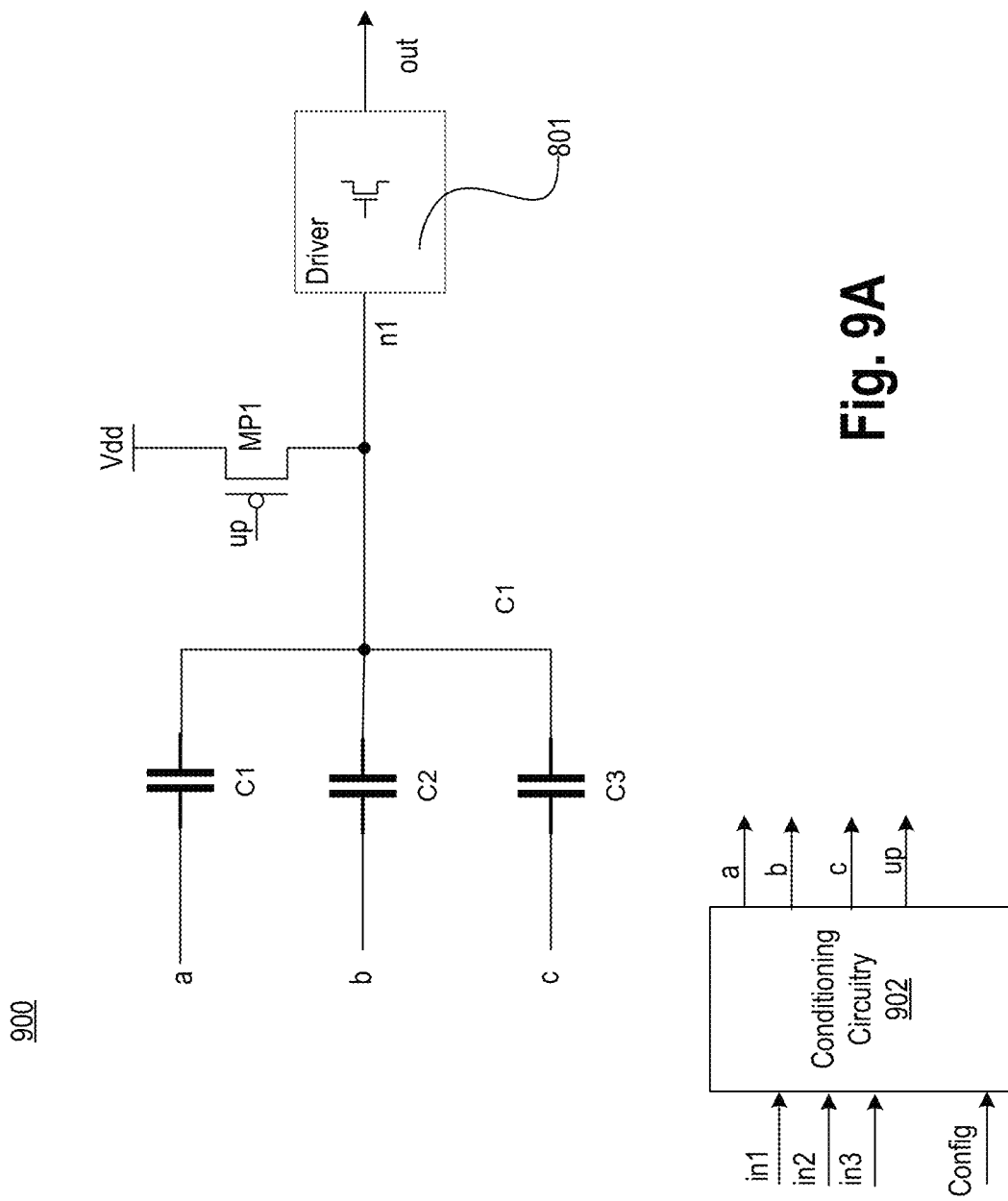
FIG. 9A illustrates a 3-input adjustable threshold gate with linear or paraelectric capacitors and a pull-up device on a summing node, in accordance with some embodiments.

FIG. 9A illustrates 3-input adjustable threshold gate 900 with linear or paraelectric capacitors and a pull-up device on a summing node, in accordance with some embodiments. 3-input capacitive circuit 900 is like 2-input capacitive circuit 800 but for additional input 'c' and associated capacitor C3. In some embodiments, a first terminal of capacitor C3 is coupled to input 'c' while a second terminal of capacitor C3 is coupled to summing node n1. Conditioning circuit 902 is replaced with a conditioning circuit 902. Conditioning circuitry 902 may receive inputs in1, in2, and in3 and configuration setting (e.g., reset or evaluation) to determine the outputs 'a', 'b', 'c', and up. During the evaluation phase, in1 is passed on to output 'a', in2 is passed on to 'b', and in3 is passed on to 'c'. During the reset phase, depending on a desired threshold, outputs 'a', 'b', and 'c' are conditioned.

In some embodiments, by turning on/off the pull-up device MP1 and conditioning the inputs 'a', 'b', and 'c' during a reset phase, the charge at node n1 is set so that in an evaluation phase when the pull-up device is disabled, 3-input capacitive circuit 900 attains a desired function.

In one instance, when the threshold is set to 2 in a reset phase by a particular sequencing of turning on/off the pull-up device and conditioning of the inputs 'a', 'b', and 'c'; it means that during an evaluation phase when at least two of the three inputs 'a', 'b', and 'c' are logic high, then voltage on node n1 is logic high. Continuing with this example, when at least two inputs of the three inputs 'a' 'b', and 'c' is a logic low, then the voltage on node n1 resolves to logic low. As such, 3-input capacitive circuit 900 is programmed or configured as a majority gate at node n1 and a minority gate at output out (when the driver circuitry is an inverter). In some cases, depending upon the leakage balance of pull-up transistor MP1 as it impacts charge on the summing node n1, 3-input capacitive circuit 900 may lose its majority logic functionality over time. This loss in functionality of the majority function can be restored by resetting the summing node n1 via transistor MP1, in accordance with some embodiments.

In some embodiments, when the threshold is set to 3 in a reset phase by a particular sequencing of turning on/off the pull-up device and conditioning of the inputs 'a', 'b', and 'c'; it means that during an evaluation phase when all three inputs 'a', 'b', and 'c' are logic high, then voltage on node n1 is logic high. Continuing with this example, when any of the three inputs 'a' 'b', and 'c' is a logic low, then the voltage on node n1 resolves to logic low. As such, 3-input capacitive circuit 900 is programmed or configured as a 3-input AND at node n1 and a 3-input NAND gate at output out (assuming the driver circuitry is an inverter).

In some embodiments, when the threshold is set to 1 in a reset phase by a particular sequencing of turning on/off the pull-up device and conditioning of the inputs 'a' and 'b; it means that during an evaluation phase when any of the inputs 'a' 'b', or 'c' is logic high, then voltage on node n1 is logic high. Continuing with this example, when all inputs 'a', 'b', or 'c' is a logic low, then the voltage on node n1 resolves to logic low. As such, 3-input capacitive circuit 900 is programmed or configured as an OR gate at node n1 and a NOR gate at output out.

So, the same circuit can be used as a majority/minority gate, AND/NAND or OR/NOR gate by conditioning the inputs and resetting or setting the voltage on the summing node during a reset phase. Subsequently, in the evaluation phase the circuit will behave as a 3-input majority/minority, 3-input AND/NAND or 3-input OR/NOR gate.

In some embodiments, conditioning circuitry 902 sets the threshold to 0 in a reset phase by enabling the pull-up device MP1 and providing logic 1 to the first input 'a', logic 0 to the second input 'b', and logic 0 to the third input 'c'. In some embodiments, conditioning circuitry 902 sets the threshold to 0 in a reset phase by turning on or enabling the pull-up device MP1 and providing logic 0 to all inputs 'a', 'b', and 'c'. A threshold of 0 means that the capacitive-input circuit is an always on circuit regardless of the logic levels of inputs. In one such embodiment, during the evaluation phase for the circuit configured with threshold of zero, the logic value on node n1 is logic 1, and the logic value on output out is logic 0 (assuming the driver is an inverter).

In some embodiments, conditioning circuitry 902 (or any other conditioning circuit) sets the threshold to 4. A threshold of 4 for a 3-input capacitive circuit means that capacitive input circuit is an always off circuit regardless of the logic levels of the inputs. In one such embodiment, during the evaluation phase for the circuit configured with threshold of n+1 (e.g., 4, where 'n' is the number of capacitive inputs), the logic value on node n1 is floating and may eventually discharge to ground or charge to supply level. In some embodiments, the voltage on node n1 is zero volts regarding of input setting when the threshold in 4 (e.g., n+1).

Table 5 illustrates that when inputs 'a', 'b', and 'c' are conditioned and pull-up device MP1 is enabled during the reset phase, then the threshold is set to 0, 1, or 2. In this example, the capacitors comprise linear dielectric.

TABLE 5

| 'a' | 'b' | 'c' | First control (Up) | Threshold |
|---|---|---|---|---|
| 0 | 0 | 0 | 0 (enable MP1) | 0 |
| 1 | 0 | 0 | 0 (enable MP1) | 0 |
| 1 | 1 | 0 | 0 (enable MP1) | 1 |
| 1 | 1 | 1 | 0 (enable MP1) | 2 |

In the evaluation phase, 3-input capacitive circuit 900 can then behave as an OR/NOR gate (when threshold is 1) or a majority/minority gate (when threshold is 2). Note, this example assumes equal weights for C1, C2, and C3 (e.g., C1=C2=C3). In some embodiments, the threshold may change (e.g., from 1 to 2) when the ratio of capacitances of capacitors C1, C2, and/or C3 are modified.

Table 6 illustrates that when inputs 'a', 'b', and 'c' are conditioned and pull-up device MP1 is enabled during the reset phase, then the threshold is set to 0, 1, or 2. When the capacitors comprise paraelectric material, different thresholds are achieved compared to the linear dielectric material for the same input conditioning. Table 6 is the case when capacitors comprise paraelectric material.

TABLE 6

| 'a' | 'b' | 'c' | First control (Up) | Threshold |
|---|---|---|---|---|
| 0 | 0 | 0 | 0 (enable MP1) | 0 |
| 1 | 0 | 0 | 0 (enable MP1) | 1 |
| 1 | 1 | 0 | 0 (enable MP1) | 1 |
| 1 | 1 | 1 | 0 (enable MP1) | 2 |

In the evaluation phase, 3-input capacitive circuit 900 can then behave as a logic1/logic0 driver (when threshold is 0), an OR/NOR gate (when threshold is 1), a minority/minority gate (when threshold is 2). Note, this example assumes equal weights for C1, C2, and C3 (e.g., C1=C2=C3). In some embodiments, the threshold may change (e.g., from 1 to 2 or to another other value) when the ratio of capacitances of capacitors C1, C2, and/or C3 are modified.

FIG. 9B illustrates a 3-input adjustable threshold gate 920 with linear or paraelectric capacitors and a pull-down device on a summing node, in accordance with some embodiments. Compared to FIG. 9A, here the pull-up device MP1 is removed and pull-down device MN1 is added which is coupled to node n1 and ground supply rail. In various embodiments, during the reset phase, node n1 is pulled-down by MN1 to ground, and inputs 'a', 'b', and 'c' are conditioned via configuration circuit 922 to adjust the threshold of 3-input capacitive circuit 920. Conditioning circuitry 922 may receive inputs in1, in2, and in3 and configuration setting(s) (e.g., reset or evaluation) to determine the outputs 'a', 'b', 'c', and down. During the evaluation phase, in1 is passed on to output 'a', in2 is passed on to 'b', and in3 is passed on to 'c'. During the reset phase, depending on a desired threshold, outputs 'a', 'b', and 'c' are conditioned. Table 7 illustrates that when inputs 'a', 'b', and 'c' are conditioned and pull-down device MN1 is enabled during the reset phase, then the threshold is set to 2 or 3. In this example, the capacitors comprise linear dielectric material.

TABLE 7

| 'a' | 'b' | 'c' | Second control (down) | Threshold |
|---|---|---|---|---|
| 0 | 0 | 0 | 1 (enable MN1) | 2 |
| 1 | 0 | 0 | 1 (enable MN1) | 3 |
| 1 | 1 | 0 | 1 (enable MN1) | 3 |
| 1 | 1 | 1 | 1 (enable MN1) | 3 |

In the evaluation phase, 3-input capacitive circuit 920 can then behave as a majority/majority gate (when threshold is 2) or an AND/NAND gate (when threshold is 3). Note, this example assumes equal weights for C1, C2, and C3 (e.g., C1=C2=C3). In some embodiments, the threshold may change (e.g., from 3 to 2 or to 1) when the ratio of capacitances of capacitors C1, C2, and/or C3 are modified.

Table 8 illustrates that when inputs 'a', 'b', and 'c' are conditioned and pull-down device MN1 is enabled during the reset phase, then the threshold is set to 2, 3, or 4. When the capacitors comprise paraelectric material, different thresholds are achieved compared to the linear dielectric material for the same input conditioning. Table 8 is the case when capacitors comprise paraelectric material.

TABLE 8

| 'a' | 'b' | 'c' | Second control (down) | Threshold |
|---|---|---|---|---|
| 0 | 0 | 0 | 1 (enable MN1) | 2 |
| 1 | 0 | 0 | 1 (enable MN1) | 3 |
| 1 | 1 | 0 | 1 (enable MN1) | 3 |
| 1 | 1 | 1 | 1 (enable MN1) | 4 |

In the evaluation phase, 3-input capacitive circuit 920 can then behave as a logic1/logic0 driver (when threshold is 0), a majority/majority gate (when threshold is 2), an AND/NAND gate (when threshold is 3), or a disconnected circuit (when threshold is 4). Note, this example assumes equal weights for C1, C2, and C3 (e.g., C1=C2=C3). In some embodiments, the threshold may change (e.g., from 3 to 2 or to 1, or any other value) when the ratio of capacitances of capacitors C1, C2, and/or C3 are modified.

Figure 10A:
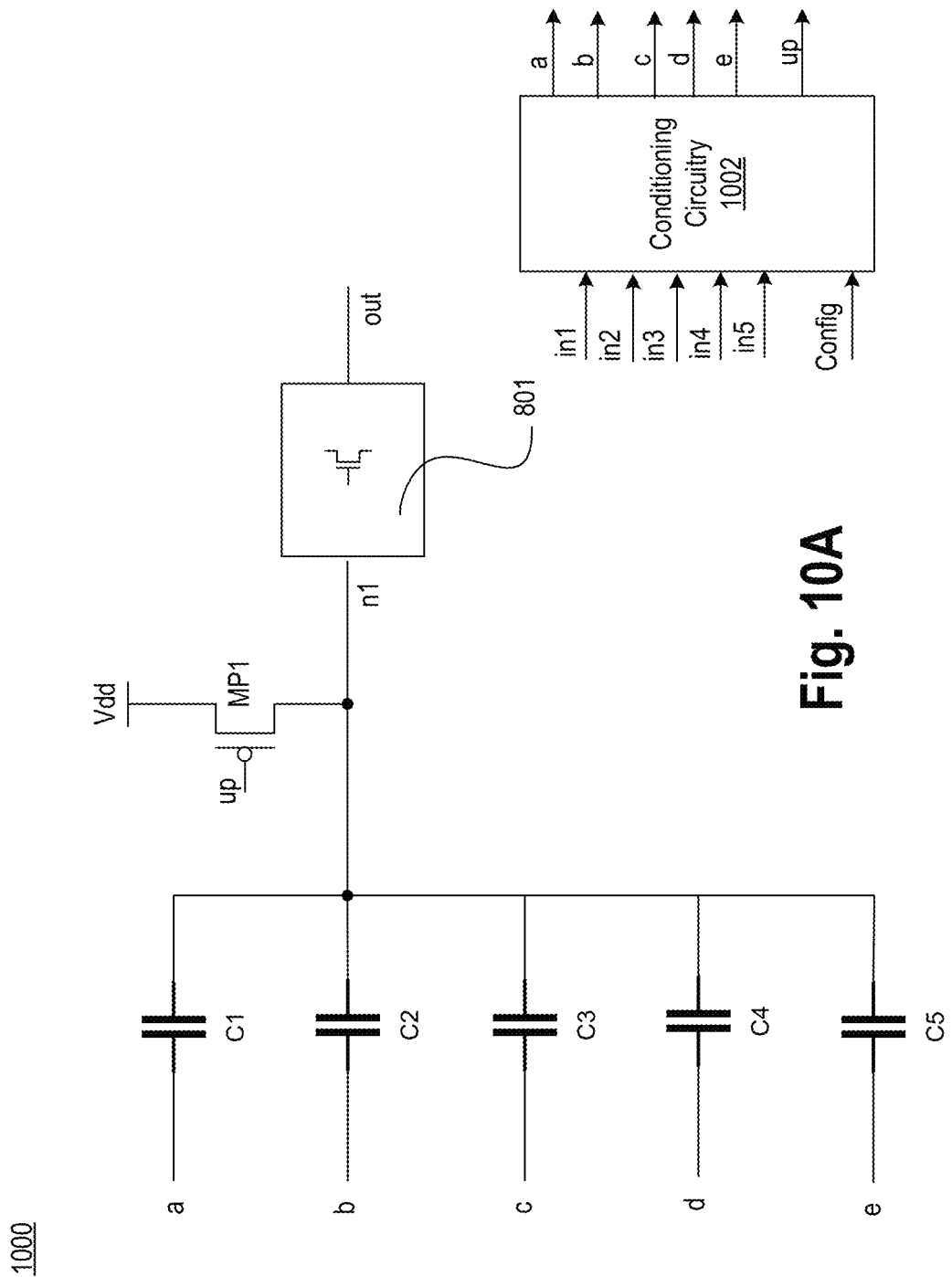
FIG. 10A illustrates a 5-input adjustable threshold gate with linear or paraelectric capacitors and a pull-up device on a summing node, in accordance with some embodiments.

FIG. 10A illustrates 5-input adjustable threshold gate 1000 with linear or paraelectric capacitors and a pull-up device on a summing node, in accordance with some embodiments. FIG. 10A is comparable to FIG. 9A, but for additional input 'd' and associated capacitor C4 and additional input 'e' and associated capacitor C5. In some embodiments, a first terminal of capacitor C4 is coupled to input 'd' while a second terminal of capacitor C4 is coupled to summing node n1. In some embodiments, a first terminal of capacitor C5 is coupled to input 'e' while a second terminal of capacitor C5 is coupled to summing node n1. Conditioning circuit 902 is replaced with a conditioning circuit 1002. Conditioning circuitry 1002 may receive inputs in1, in2, in3, in4, and in5 and configuration setting (e.g., reset or evaluation) to determine the outputs 'a', 'b', 'c', 'd', 'e', and control "up". During the evaluation phase, in1 is passed on to output 'a', in2 is passed on to 'b', in3 is passed on to 'c', in4 is passed on to 'd', and in5 is passed on to 'e'. During the reset phase, depending on a desired threshold, outputs 'a', 'b', 'c' 'd', and 'e' are conditioned.

In various embodiments, during the reset phase, node n1 is pulled-up by MP1 to Vdd, and inputs 'a', 'b', 'c', 'd', and 'e' are conditioned via configuration circuitry 1002 to adjust the threshold of 5-input capacitive circuit 1000. Conditioning circuitry 1002 may receive inputs in1, in2, in3, in4, and in5 and configuration setting (e.g., reset or evaluation) to determine the outputs 'a', 'b', 'c', 'd', 'e', and control "up". During the evaluation phase, in1 is passed on to output 'a', in2 is passed on to 'b', in3 is passed on to 'c', in4 is passed on to 'd', and in5 is passed on to 'e'. During the reset phase, depending on a desired threshold, outputs 'a', 'b', 'c' 'd', and 'e' are conditioned. Table 9 illustrates that when inputs 'a', 'b', 'c', 'd', and 'e' are conditioned and pull-up device MP1 is enabled during the reset phase, then the threshold is set to 1 or 3. In this example, the capacitors comprise linear dielectric material.

TABLE 9

| 'a' | 'b' | 'c' | 'd' | 'e' | First control (Up) | Threshold |
|---|---|---|---|---|---|---|
| 0 | 0 | 0 | 0 | 0 | 0 (enable MP1) | 0 |
| 1 | 0 | 0 | 0 | 0 | 0 (enable MP1) | 0 |
| 1 | 1 | 0 | 0 | 0 | 0 (enable MP1) | 0 |
| 1 | 1 | 1 | 0 | 0 | 0 (enable MP1) | 1 |
| 1 | 1 | 1 | 1 | 0 | 0 (enable MP1) | 2 |
| 1 | 1 | 1 | 1 | 1 | 0 (enable MP1) | 3 |

In the evaluation phase, 5-input capacitive circuit 1000 can then behave as an OR/NOR gate (when threshold is 1), a majority-0/minority-0 gate (when threshold is 2), or a majority/minority gate (when threshold is 3). Note, this example assumes equal weights for C1, C2, C3, C4, and C5 (e.g., C1=C2=C3=C4=C5). In some embodiments, the threshold may change (e.g., from 1 to 2 or to 3, 4, or 5) when the ratio of capacitances of capacitors C1, C2, C3, C4, and/or C5 are modified.

Table 10 illustrates that when inputs 'a', 'b', 'c', 'd', and 'e' are conditioned and the pull-up device MP1 is enabled during the reset phase, then the threshold is set to 1 or 3. When the capacitors comprise paraelectric material, different thresholds are achieved compared to the linear dielectric material for the same input conditioning. Table 10 is the case when capacitors comprise paraelectric material.

TABLE 10

| 'a' | 'b' | 'c' | 'd' | 'e' | First control (Up) | Threshold |
|---|---|---|---|---|---|---|
| 0 | 0 | 0 | 0 | 0 | 0 (enable MP1) | 0 |
| 1 | 0 | 0 | 0 | 0 | 0 (enable MP1) | 1 |
| 1 | 1 | 0 | 0 | 0 | 0 (enable MP1) | 1 |
| 1 | 1 | 1 | 0 | 0 | 0 (enable MP1) | 2 |
| 1 | 1 | 1 | 1 | 0 | 0 (enable MP1) | 2 |
| 1 | 1 | 1 | 1 | 1 | 0 (enable MP1) | 3 |

In the evaluation phase, 5-input capacitive circuit 1000 can then behave as an always on circuit that drives a constant logic value on node n1 (when threshold is 0), an OR/NOR gate (when threshold is 1), a majority-0/minority-0 gate or a threshold gate (when threshold is 2), or a majority/minority gate (when threshold is 3). Note, this example assumes equal weights for C1, C2, C3, C4, and C5 (e.g., C1=C2=C3=C4=C5). In some embodiments, the threshold may change (e.g., from 1 to 2 or to 3, 4, or 5 or any other value) when the ratio of capacitances of capacitors C1, C2, C3, C4, and/or C5 are modified.

Figure 10B:
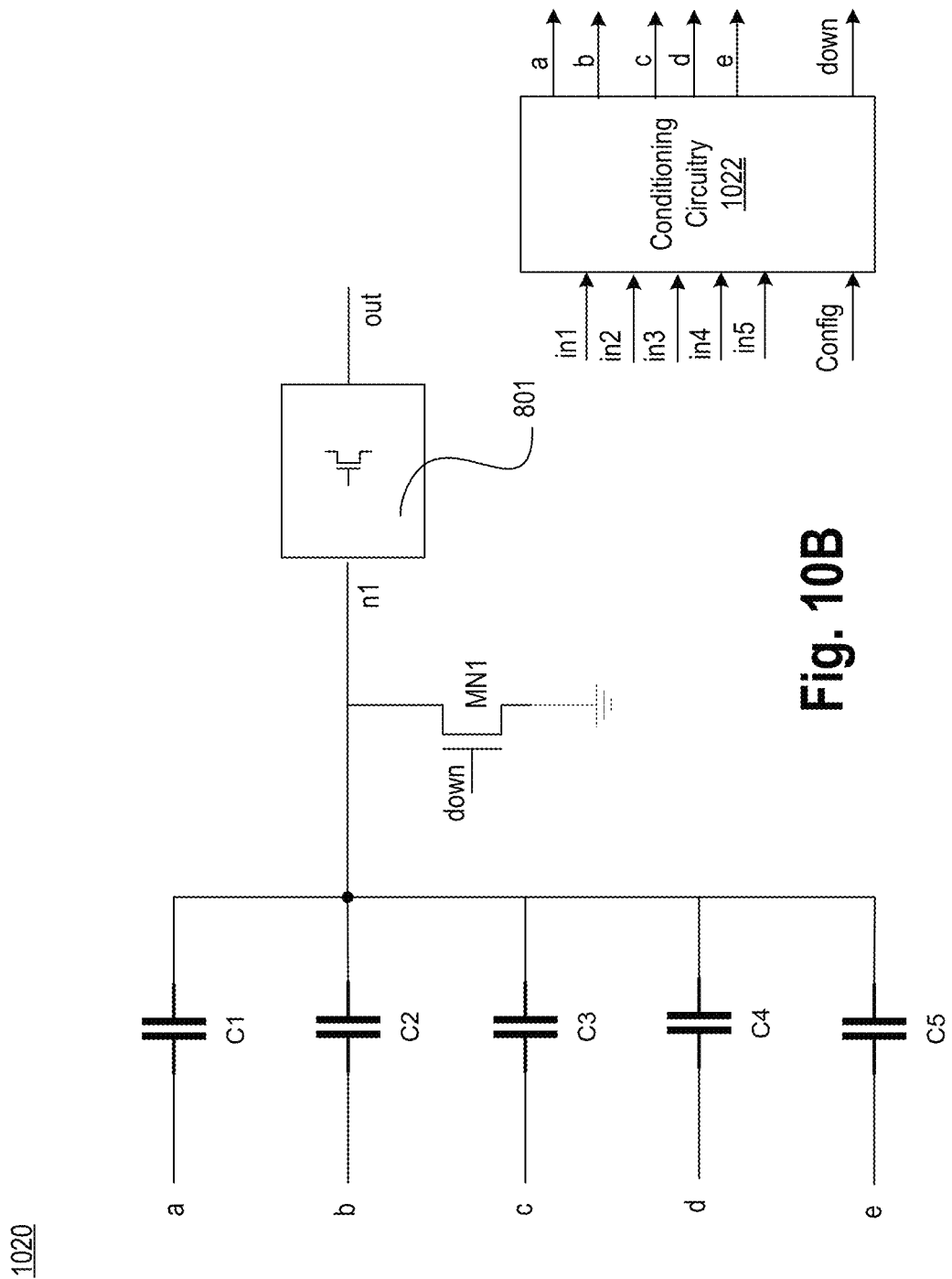
FIG. 10B illustrates a 5-input adjustable threshold gate with linear or paraelectric capacitors and a pull-down device on a summing node, in accordance with some embodiments.

FIG. 10B illustrates 5-input adjustable threshold gate 1020 with linear or paraelectric capacitors and a pull-down device on a summing node, in accordance with some embodiments. Compared to FIG. 10A, here pull-up device MP1 is removed and pull-down device MN1 is coupled to node n1 and ground power supply rail. In various embodiments, during the reset phase, node n1 is pulled-down by MN1 to ground, and inputs 'a', 'b', 'c', 'd' and 'e' are conditioned via configuration circuit 1022 to adjust the threshold of 5-input capacitive circuit 1000. Conditioning circuitry 1022 may receive inputs in1, in2, in3, in4, and in5 and configuration setting (e.g., reset or evaluation) to determine the outputs 'a', 'b', 'c', 'd', 'e', and control "down". During the evaluation phase, in1 is passed on to output 'a', in2 is passed on to 'b', in3 is passed on to 'c', in4 is passed on to 'd', and in5 is passed on to 'e'. During the reset phase, depending on a desired threshold, outputs 'a', 'b', 'c' 'd', and 'e' are conditioned. Table 11 illustrates that when inputs 'a', 'b', 'c', 'd', and 'e' are conditioned and pull-down device MN1 is enabled during the reset phase, then the threshold is set to 3, 4, or 5. In this example, the capacitors comprise linear dielectric material.

TABLE 11

| 'a' | 'b' | 'c' | 'd' | 'e' | Second control (down) | Threshold |
|---|---|---|---|---|---|---|
| 0 | 0 | 0 | 0 | 0 | 1 (enable MN1) | 3 |
| 1 | 0 | 0 | 0 | 0 | 1 (enable MN1) | 4 |
| 1 | 1 | 0 | 0 | 0 | 1 (enable MN1) | 5 |
| 1 | 1 | 1 | 0 | 0 | 1 (enable MN1) | 5 |
| 1 | 1 | 1 | 1 | 0 | 1 (enable MN1) | 5 |
| 1 | 1 | 1 | 1 | 1 | 1 (enable MN1) | 5 |

In the evaluation phase, 5-input capacitive circuit 1020 can then behave as a majority/minority gate (when threshold is 3) or a threshold gate (when threshold is 4), or an AND/NAND gate (when threshold is 5). Note, this example assumes equal weights for C1, C2, C3, C4, and C5 (e.g., C1=C2=C3=C4=C5). In some embodiments, the threshold may change (e.g., from 3 to 2 or to 1, 4, or 5 or any other value) when the ratio of capacitances of capacitors C1, C2, C3, C4 and/or C5 are modified.

While the various embodiments illustrate the first input 'a', second input 'b', third input 'c', fourth input 'd', and/or fifth input 'e', these inputs are labeled for reference purposes and can be swapped in any order assuming all capacitors have the same capacitance. Input associated with capacitors of the same capacitance can be swapped with one another, in accordance with some embodiments. While the embodiments are illustrated for capacitive input circuits with up to 5 inputs, the adaptive or configurable threshold for the capacitive circuit can be achieved for any number of inputs (e.g., n number of inputs) using the scheme discussed herein.

Table 12 illustrates that when inputs 'a', 'b', 'c', 'd', and 'e' are conditioned and pull-down device MN1 is enabled during the reset phase, then the threshold is set to 3, 4, 5, or 6. When the capacitors comprise paraelectric material, different thresholds are achieved compared to the linear dielectric material for the same input conditioning. Table 12 is the case when capacitors comprise paraelectric material.

TABLE 12

| 'a' | 'b' | 'c' | 'd' | 'e' | Second control (down) | Threshold |
|---|---|---|---|---|---|---|
| 0 | 0 | 0 | 0 | 0 | 1 (enable MN1) | 3 |
| 1 | 0 | 0 | 0 | 0 | 1 (enable MN1) | 4 |
| 1 | 1 | 0 | 0 | 0 | 1 (enable MN1) | 4 |
| 1 | 1 | 1 | 0 | 0 | 1 (enable MN1) | 5 |
| 1 | 1 | 1 | 1 | 0 | 1 (enable MN1) | 5 |
| 1 | 1 | 1 | 1 | 1 | 1 (enable MN1) | 6 |

In the evaluation phase, 5-input capacitive circuit 1020 can then behave as a majority/minority gate (when threshold is 3), a threshold gate (when threshold is 4), an AND/NAND gate (when threshold is 5), or a disconnected circuit (when threshold is 6). Note, this example assumes equal weights for C1, C2, C3, C4, and C5 (e.g., C1=C2=C3=C4=C5). In some embodiments, the threshold may change (e.g., from 3 to 2 or to 1, 4, or 5 or any other value) when the ratio of capacitances of capacitors C1, C2, C3, C4 and/or C5 are modified.

Figure 11:
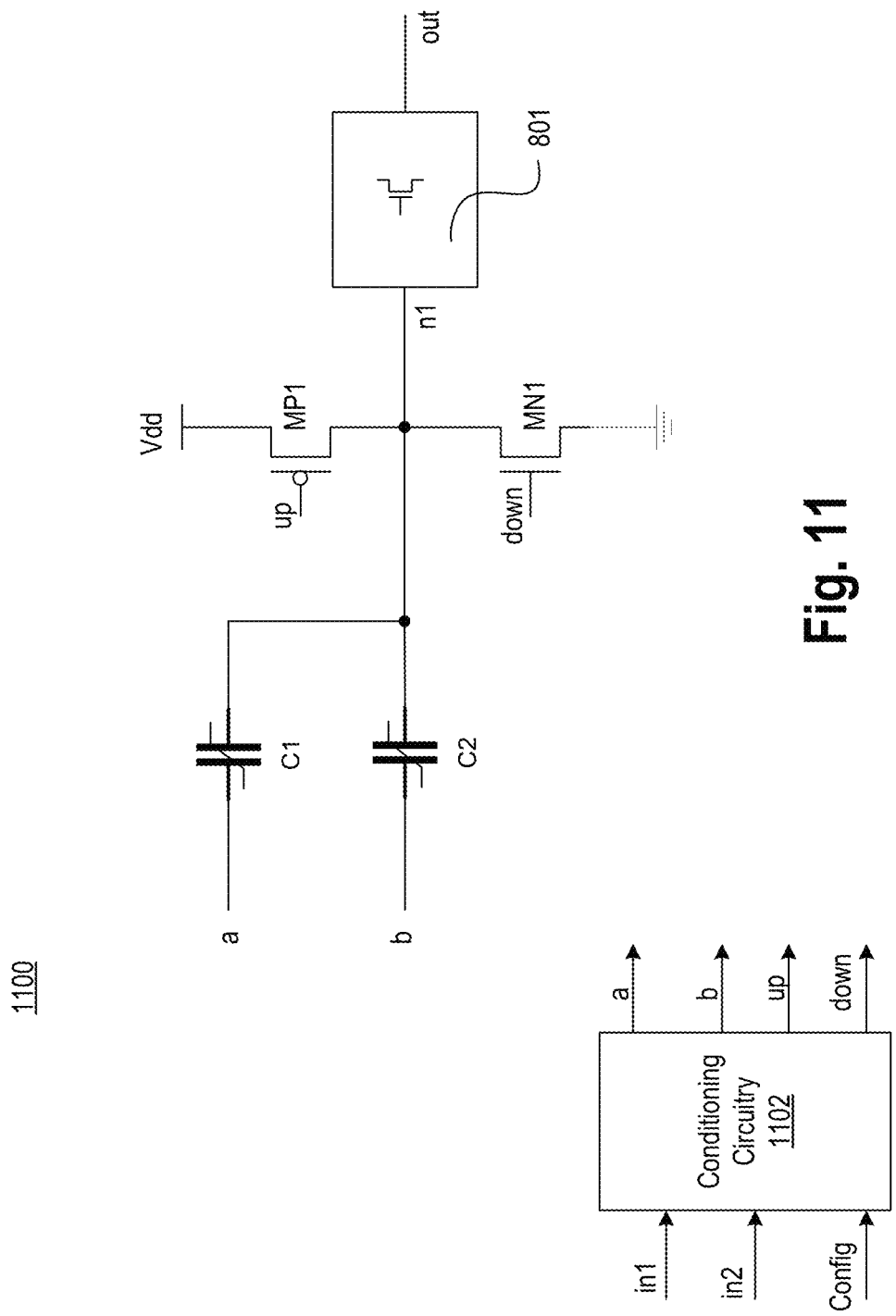
FIG. 11 illustrates a 2-input adjustable threshold gate with ferroelectric capacitors and a pull-down device and a pull-up device on a summing node, in accordance with some embodiments.

FIG. 11 illustrates 2-input adjustable threshold gate 1100 with ferroelectric capacitors and a pull-down device and a pull-up device on a summing node, in accordance with some embodiments. In some embodiments, 2-input capacitive circuit 1100 comprises a first input (a), a second input (b), summing node (n1), first capacitor C1, second capacitor C2, pull-up-device MP1, pull-down device MN1, driver 801, and output (out) coupled as shown. In some embodiments, the first capacitor C1 includes a first terminal coupled to the first input and a second terminal coupled to the summing node n1. In some embodiments, the second capacitor C2 includes a third terminal coupled to the second input and a fourth terminal coupled to the summing node n1. In some embodiments, the pull-up device MP1 is coupled to the summing node n1 and a power supply rail Vdd, wherein the pull-up device MP1 is controlled by a first control (up). In some embodiments, the pull-down device MN1 is coupled to the summing node n1 and a ground, wherein the pull-down device is controlled by a second control (down).

In some embodiments, conditioning circuitry 1102 is provided which is used to control or condition the first input, the second input, the first control, and the second control during a reset phase to adjust a threshold of 2-input capacitive circuit 1100. Conditioning circuitry 1102 may receive inputs in1 and in2, and configuration setting (e.g., reset or evaluation) to determine the outputs 'a', 'b', up, and down. During the evaluation phase, in1 is passed on to output 'a' and in2 is passed on to 'b'. During the reset phase, depending on a desired threshold, outputs 'a' and 'b' are conditioned. In various embodiments, the pull-up device MP1 and pull-down device MN1 are turn on in a sequence during reset phase while inputs to the capacitors are kept constant for a particular threshold setting. In some embodiments, for different input values, the threshold can be configured differently. The sequence of turning on the pull-up device MP1 first and then the pull-down device MN1 can be reversed to readjust the threshold of the circuit. In various embodiments, the pull-up device MP1 and pull-down device MN1 are turned off after the reset phase is complete.

Here the term threshold generally refers to a number that indicates a number of inputs that should be set to logic high to perform a function of a threshold gate. For instance, by turning on/off one or more of the pull-up device MP1 and/or pull-down device MN1, and conditioning the inputs 'a' and 'b' during a reset phase, the charge at node n1 is set so that in an evaluation phase when the pull-up and pull-down devices (MP1 and MN1) are disabled, the input capacitive circuit attains a desired function.

In one instance, when the threshold is set to 2 in a reset phase by a particular sequencing of turning on/off the pull-up and/or the pull-down devices and conditioning of the inputs 'a' and 'b; it means that during an evaluation phase when both inputs 'a' and 'b' are logic high, then voltage on node n1 is logic high. Continuing with this example, when any of the inputs 'a' and 'b' is a logic low, then the voltage on node n1 resolves to logic low. As such, 2-input capacitive circuit 1100 is programmed or configured as a AND gate at node n1 and a NAND gate at output out.

Likewise, when the threshold is set to 1 in a reset phase by a particular sequencing of turning on/off the pull-up and the pull-down devices and conditioning of the inputs 'a' and 'b; it means that during an evaluation phase when either input 'a' and 'b' is logic high, then voltage on node n1 is logic high. Continuing with this example, when both the inputs 'a' and 'b' is a logic low, then the voltage on node n1 resolves to logic low. As such, 2-input capacitive circuit 1100 is programmed or configured as an OR gate at node n1 and a NOR gate at output out. So, the same circuit can be used as an AND/NAND or OR/NOR gate by conditioning the inputs and resetting or setting the voltage on the summing node during a reset phase. Subsequently, in the evaluation phase the circuit will behave as AND/NAND or OR/NOR gate.

In some embodiments, conditioning circuitry 1102 turns off the pull-up device MP1 and the pull-down device MN1 during an evaluation phase separate from the reset phase. The reset phase or evaluation phase are indicated by the logic level of Config. For example, conditioning circuitry 1102 sets the first control (up) to logic high (Vdd) and the second control (down) to logic low (ground) during an evaluation phase (e.g., Config is set to logic 1). Likewise, in a reset phase, Config is set to 0. This is just an example, and the logic level of Config can be modified to present the evaluation phase and the reset phase.

In some embodiments, conditioning circuitry 1102 sets the threshold to 0 in a reset phase by first enabling or turning on the pull-down device MN1, and then turning on or enabling the pull-up device MP1, and providing logic 0 to the first input and the second input. A threshold of 0 means that the capacitive input circuit is an always on circuit regardless of the logic levels of inputs. In one such embodiment, during the evaluation phase for the circuit configured with threshold of zero, the logic value on node n1 is logic 1, and the logic value on output out is logic 0 (assuming the driver is an inverter).

In some embodiments, conditioning circuitry 1102 sets the threshold to 1 in a reset phase by first enabling or turning on the pull-down device MN1, and then turning on the pull-up device MP1, and providing logic 1 to the first input 'a' and logic 0 to the second input 'b'. In some embodiments, conditioning circuitry 1102 sets the threshold to 1 in a reset phase by first enabling or turning on the pull-up device MP1, and then turning on or enabling the pull-down device MN1, and providing logic 0 to the first input 'a' and to the second input 'b'.

In some embodiments, conditioning circuitry 1102 sets the threshold to 2 in a reset phase by first enabling or turning on the pull-up device MP1, and then turning on the pull-down device MN1, and providing logic 1 to the first input 'a' and logic 0 the second input 'b'. In some embodiments, conditioning circuitry 1102 sets the threshold to 2 in a reset phase by first enabling or turning on the pull-down device MN1, and then turning on the pull-up device MP1, and providing logic 1 (e.g., Vdd) to the first input 'a' and to the second input 'b'.

In some embodiments, conditioning circuitry 1102 sets the threshold to 3 in a reset phase by first enabling or turning on the pull-up device MP1, and then turning on or enabling the pull-down device MN1, and providing logic 1 to the first input and the second input. A threshold of 3 for a 2-input capacitive circuit means that capacitive input circuit is an always off circuit regardless of the logic levels of inputs. In one such embodiment, during the evaluation phase for the circuit configured with threshold of n+1 (e.g., 3, where 'n' is the number of capacitive inputs), the logic value on node n1 is floating or drifting and the charge on that node may eventually discharge to ground. In some cases, the voltage on node n1 may charge to supply level via the pull-up device when the node n1 is floating. For example, initially the voltage on the floating node discharges to zero voltages, but then it may charge up via leakage to the supply voltage over time. In some embodiments, when the threshold is n+1, the capacitive input circuit may not turn on even when the inputs to the capacitors are changing. In some embodiments, the voltage on node n1 is zero volts regarding of input setting when the threshold in n+1.

In some embodiments, a logic decides about the kind of logic function to configure 2-input capacitive circuit 1100. For example, a control logic block or a conditioning circuit 1102 may determine whether 2-input capacitive circuit 1100 is to behave as an AND/NAND gate, an OR/NOR gate, an always-on circuit, or a disconnected circuit.

In some embodiments, control logic block or a conditioning circuit 1102 places 2-input capacitive circuit 1100 in a reset phase. In the reset phase, the inputs 'a' and 'b' and controls for the pull-up device MP1 and pull-down device MN1 are set or conditioned to configure or adjust the threshold for the 2-input capacitive circuit. In some embodiments, control logic block or conditioning circuit 1102 may adjust a threshold of 2-input capacitive circuit 1100 to configure the 2-input capacitive circuit 1100 as a particular logic function. When the input capacitors are ferroelectric capacitors (because they include ferroelectric material for their dielectric), control logic block or conditioning circuit 1102 sequences the turning on of the pull-up device MP1 and the pull-down device MN1 to achieve a particular threshold for a given set of inputs to the capacitors. In some embodiments, the pull-up device MP1 is turned on before the pull-down device MN1. In some embodiments, the pull-down device MN1 is turned on before the pull-up device MP1.

Table 13 illustrates an example of input conditioning to set various thresholds during a reset phase for 2-input capacitive circuit 1100. In various embodiments, during the sequence one of pull-up or pull-down device is on at a time to avoid crossbar current or short circuit current. For example, when the pull-down device MN1 is enabled, the pull-up device MP1 is disabled. Likewise, when the pull-up device MP1 is enabled, the pull-down device MN1 is disabled. Here, time T3 (or event T3) occurs after time T2 (or event T2) which occurs after time T1 (or event T1). In some embodiments, the separation between T1, T2, and T3 is between ½ cycle to 1 cycle, where a cycle is in GHz (e.g., 1 GHz or more).

TABLE 13

| Input 'a' | Input 'b' | Time T1 | Time T2 | Time T3 | Threshold |
|---|---|---|---|---|---|
| 0 | 0 | 1 (enable MN1) | 0 (disable MN1) | 0 (enable MP1) | 0 |
| 1 | 0 | 1 (enable MN1) | 0 (disable MN1) | 0 (enable MP1) | 1 |
| 1 | 1 | 1 (enable MN1) | 0 (disable MN1) | 0 (enable MP1) | 2 |
| 0 | 0 | 0 (enable MP1) | 1 (disable MP1) | 1 (enable MN1) | 1 |
| 1 | 0 | 0 (enable MP1) | 1 (disable MP1) | 1 (enable MN1) | 2 |
| 1 | 1 | 0 (enable MP1) | 1 (disable MP1) | 1 (enable MN1) | 3 |

While the embodiments are illustrated with reference to same capacitances for first capacitor C1 and the second capacitor C2, the threshold can be affected by changing the capacitive ratio of C1 and C2. For example, the input conditioning scheme and the pull-up and pull-down device control can result in a different threshold than that in Table 13 when the capacitive ratio of C1 and C2 is not 1:1. Overall, the configuring scheme of various embodiments herein provide the flexibility of programming the threshold for 2-input capacitive circuit 1100 in a reset phase to achieve a certain logic function in the evaluation phase.

In some embodiments, control logic block or a conditioning circuit 1102 releases the reset phase and allows the 2-input capacitive circuit to evaluate the inputs in the evaluation phase. Table 14 illustrates a logic function achieved in the evaluation phase by configuring or adjusting the threshold in the reset phase for 2-input capacitive circuit 1100. In various embodiments, the pull-up device MP1 and the pull-down device MN1 are disabled during the evaluation phase.

TABLE 14

| Threshold | Logic Function on node n1 | Logic function on node "out" |
|---|---|---|
| 3 | Logic 0 | Logic 1 |
| 2 | AND | NAND |
| 1 | OR | NOR |
| 0 | Logic 1 | Logic 0 |

Figure 12:
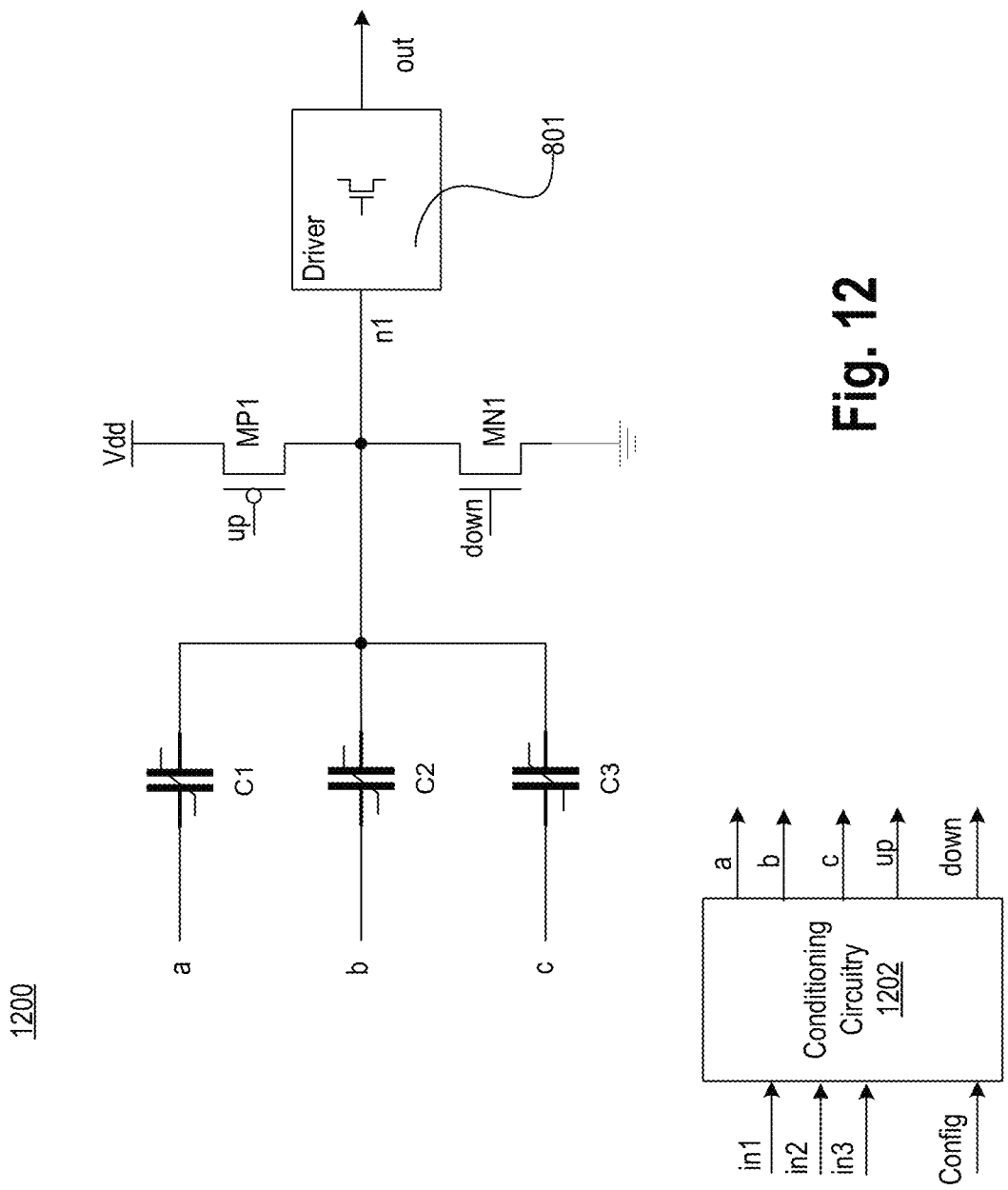
FIG. 12 illustrates a 3-input adjustable threshold gate with ferroelectric capacitors and a pull-down device and a pull-up device on a summing node, in accordance with some embodiments.

FIG. 12 illustrates 3-input adjustable threshold gate 1200 with ferroelectric capacitors and a pull-down device and a pull-up device on a summing node, in accordance with some embodiments. 3-input capacitive circuit 1200 is like 2-input capacitive circuit 1100 but for additional input 'c' and associated capacitor C3. In some embodiments, a first terminal of capacitor C3 is coupled to input 'c' while a second terminal of capacitor C3 is coupled to summing node n1. Conditioning circuit 1102 is replaced with a conditioning circuit 1202. Conditioning circuitry 1202 may receive inputs in1, in2, and in3 and configuration setting (e.g., reset or evaluation) to determine the outputs 'a', 'b', 'c', controls "up", and "down". During the evaluation phase, in1 is passed on to output 'a', in2 is passed on to 'b', and in3 is passed on to 'c'. During the reset phase, depending on a desired threshold, outputs 'a', 'b', and 'c' are conditioned.

In some embodiments, by turning on/off the pull-up device MP1 and pull-down device MN1 in a sequence, and conditioning the inputs 'a', 'b', and 'c' during a reset phase, the charge at node n1 is set. As such, in an evaluation phase when the pull-up and the pull-down devices (MP1 and MN1) are disabled, 3-input capacitive circuit 300 attains a desired function.

In some embodiments, conditioning circuitry 1202 sets the threshold to 0 in a reset phase by first enabling or turning on the pull-down device MN1, and then turning on or enabling the pull-up device MP1, and providing logic 0 to the first input 'a', logic 0 to the second input 'b', and logic 0 to the third input 'c'. A threshold of 0 means that the capacitive input circuit is an always on circuit regardless of the logic levels of inputs. In one such embodiment, during the evaluation phase for the circuit configured with threshold of zero, the logic value on node n1 is logic 1, and the logic value on output out is logic 0 (assuming the driver is an inverter).

In some embodiments, conditioning circuitry 1202 sets the threshold to 1 in a reset phase by first enabling or turning on the pull-down device MN1, and then turning on or enabling the pull-up device MP1, and providing logic 1 to the first input 'a', logic 0 to the second input 'b', and logic 0 to the third input 'c'. In some embodiments, conditioning circuitry 1202 sets the threshold to 1 in a reset phase by first enabling or turning on the pull-up device MP1, and then turning on or enabling the pull-down device MN1, and providing logic 0 to the first input 'a', logic 0 to the second input 'b', and logic 0 to the third input 'c'. In some embodiments, when the threshold is set to 1 in a reset phase by a particular sequencing of turning on/off the pull-up and the pull-down devices and conditioning of the inputs 'a', 'b', and 'c'; it means that during an evaluation phase when any of the inputs 'a' 'b', or 'c' is logic high, then voltage on node n1 is logic high. Continuing with this example, in the evaluation phase when all inputs 'a', 'b', or 'c' are a logic low, then the voltage on node n1 resolves to logic low. As such, 3-input capacitive circuit 1200 is programmed or configured as an OR gate at node n1 and a NOR gate at output out (assuming the driver circuitry is an inverter).

In some embodiments, conditioning circuitry 1202 sets the threshold to 2 in a reset phase by first enabling or turning on the pull-down device MN1, and then turning on or enabling the pull-up device MP1, and providing logic 1 to the first input 'a', logic 1 to the second input 'b', and logic 0 to the third input 'c'. In some embodiments, conditioning circuitry 1202 sets the threshold to 2 in a reset phase by first enabling or turning on the pull-up device MP1, and then turning on or enabling the pull-down device MN1, and providing logic 1 to the first input 'a', logic 0 to the second input 'b', and logic 0 to the third input 'c'. In some embodiments, when the threshold is set to 2 in a reset phase by a particular sequencing of turning on/off the pull-up and the pull-down devices and conditioning of the inputs 'a', 'b', and 'c'; it means that during an evaluation phase when at least two of the three inputs 'a', 'b', and 'c' are logic high, then voltage on node n1 is logic high. Continuing with this example, when at least two inputs of the three inputs 'a' 'b', and 'c' is a logic low, then the voltage on node n1 resolves to logic low. As such, 3-input capacitive circuit 1200 is programmed or configured as a majority gate at node n1 and a minority gate at output out (when the driver circuitry is an inverter). In some cases, depending upon the leakage balance of pull-up transistor MP1 and pull-down MN1 as it impacts charge on the summing node n1, 3-input capacitive circuit 1200 may lose its majority logic functionality over time. This loss in functionality of the majority function can be restored by resetting the summing node n1 via transistors MP1 and MN1, in accordance with some embodiments.

In some embodiments, conditioning circuitry 1202 sets the threshold to 3 in a reset phase by first enabling or turning on the pull-down device MN1, and then turning on or enabling the pull-up device MP1, and providing logic 1 to the first input 'a', logic 1 to the second input 'b', and logic 1 to the third input 'c'. In some embodiments, conditioning circuitry 1202 sets the threshold to 3 in a reset phase by first enabling or turning on the pull-up device MP1, and then turning on or enabling the pull-down device MN1, and providing logic 1 to the first input 'a', logic 1 to the second input 'b', and logic 0 to the third input 'c'. In some embodiments, when the threshold is set to 3 in a reset phase by a particular sequencing of turning on/off the pull-up and the pull-down devices and conditioning of the inputs 'a', 'b', and 'c'; it means that during an evaluation phase when all three inputs 'a', 'b', and 'c' are logic high, then voltage on node n1 is logic high. Continuing with this example, when any of the three inputs 'a' 'b', and 'c' is a logic low, then the voltage on node n1 resolves to logic low. As such, 3-input capacitive circuit 1200 is programmed or configured as a 3-input AND at node n1 and a 3-input NAND gate at output out (assuming the driver circuitry is an inverter).

In some embodiments, conditioning circuitry 1202 sets the threshold to 4 in a reset phase by first enabling or turning on the pull-up device MP1, and then turning on or enabling the pull-down device MN1, and providing logic 1 to the first input 'a', the second input 'b', and the third input 'c'. A threshold of 4 for a 3-input capacitive circuit means that capacitive input circuit is an always off circuit regardless of the logic levels of the inputs. In one such embodiment, during the evaluation phase for the circuit configured with threshold of n+1 (e.g., 4, where 'n' is the number of capacitive inputs), the logic value on node n1 is floating and may eventually discharge to ground or charge to supply level. In some embodiments, the voltage on node n1 is zero volts regarding of input setting when the threshold in 4 (e.g., n+1).

So, the same circuit can be used as a majority/minority gate, AND/NAND, OR/NOR, always-on gate, or a disconnected gate by conditioning the inputs and resetting or setting the voltage on the summing node during a reset phase. Subsequently, in the evaluation phase the circuit will behave as a 3-input majority/minority, a 3-input AND/NAND, a 3-input OR/NOR gate, a 3-input always-on gate, or a 3-input disconnected gate.

In some embodiments, a logic decides about the kind of logic function to configure 3-input capacitive circuit 1200. For example, a control logic block or a conditioning circuit 1202 may determine whether 3-input capacitive circuit 1200 is to behave as an always-on circuit, always disconnected circuit, a majority/minority, an AND/NAND gate, or an OR/NOR gate. In some embodiments, control logic block or conditioning circuit 1202 may adjust a threshold of 3-input capacitive circuit 1200 to configure the 3-input capacitive circuit 1200 as a particular logic function.

In some embodiments, control logic block or a conditioning circuit 1202 places 3-input capacitive circuit 1200 in a reset phase. In the reset phase, the inputs 'a', 'b', and 'c' and controls for the pull-up device MP1 and pull-down device MN1 are set or conditioned to configure or adjust the threshold for the 3-input capacitive circuit. In some embodiments, control logic block or a conditioning circuit 1202 may adjust a threshold of 3-input capacitive circuit 1200 to configure the 3-input capacitive circuit 1200 as a particular logic function. When the input capacitors are ferroelectric capacitors (because they include ferroelectric material for their dielectric), control logic block or a conditioning circuit 1202 sequences the turning on of the pull-up device MP1 and the pull-down device MN1 to achieve a particular threshold for a given set of inputs to the capacitors. In some embodiments, the pull-up device MP1 is turned on before the pull-down device MN1. In some embodiments, the pull-down device MN1 is turned on before the pull-up device MP1.

Table 15 illustrates an example of input conditioning to set various thresholds during a reset phase for 3-input capacitive circuit 1200. In various embodiments, during the sequence one of pull-up or pull-down device is on at a time to avoid crossbar current or short circuit current. For example, when the pull-down device MN1 is enabled, the pull-up device MP1 is disabled. Likewise, when the pull-up device MP1 is enabled, the pull-down device MN1 is disabled. Here, time T3 (or event T3) occurs after time T2 (or event T2) which occurs after time T1 (or event T1). In some embodiments, the separation between T1, T2, and T3 is between ½ cycle to 1 cycle, where a cycle is in GHz (e.g., 1 GHz or more).

TABLE 15

| 'a' | 'b' | 'c' | T1 | T2 | T3 | Threshold |
|---|---|---|---|---|---|---|
| 0 | 0 | 0 | 1 (enable MN1) | 0 (disable MN1) | 0 (enable MP1) | 0 |
| 1 | 0 | 0 | 1 (enable MN1) | 0 (disable MN1) | 0 (enable MP1) | 1 |
| 1 | 1 | 0 | 1 (enable MN1) | 0 (disable MN1) | 0 (enable MP1) | 2 |
| 1 | 1 | 1 | 1 (enable MN1) | 0 (disable MN1) | 0 (enable MP1) | 3 |
| 0 | 0 | 0 | 0 (enable MP1) | 1 (disable MP1) | 1 (enable MN1) | 1 |
| 1 | 0 | 0 | 0 (enable MP1) | 1 (disable MP1) | 1 (enable MN1) | 2 |
| 1 | 1 | 0 | 0 (enable MP1) | 1 (disable MP1) | 1 (enable MN1) | 3 |
| 1 | 1 | 1 | 0 (enable MP1) | 1 (disable MP1) | 1 (enable MN1) | 4 |

While the embodiments are illustrated with reference to the same capacitances for the first capacitor C1, the second capacitor C2, and the third capacitor C3, the threshold can be affected by changing the capacitive ratio of C1, C2, and C3 relative to one another. For example, the input conditioning scheme and the pull-up and pull-down device control can result in a different threshold than that in Table 15 when the capacitive ratio of C1, C2, and C3 is not 1:1:1. Overall, the configuring scheme of various embodiments herein provide the flexibility of programming or adjusting the threshold for 3-input capacitive circuit 1200 in a reset phase to achieve a certain logic function in the evaluation phase.

In some embodiments, control logic block or a conditioning circuit 1202 releases the reset phase and allows 3-input capacitive circuit to evaluate the inputs in the evaluation phase. Table 16 illustrates a logic function achieved in the evaluation phase by configuring the threshold in the reset phase for 3-input capacitive circuit 1200. In various embodiments, the pull-up device MP1 and the pull-down device MN1 are disabled during the evaluation phase.

TABLE 16

| Threshold | Logic Function on node n1 | Logic function on node "out" |
|---|---|---|
| 0 | Logic 1 | Logic 0 |
| 1 | OR | NOR |
| 2 | Majority | Minority |
| 3 | AND | NAND |
| 4 | Logic 0 | Logic 1 |

Figure 13:
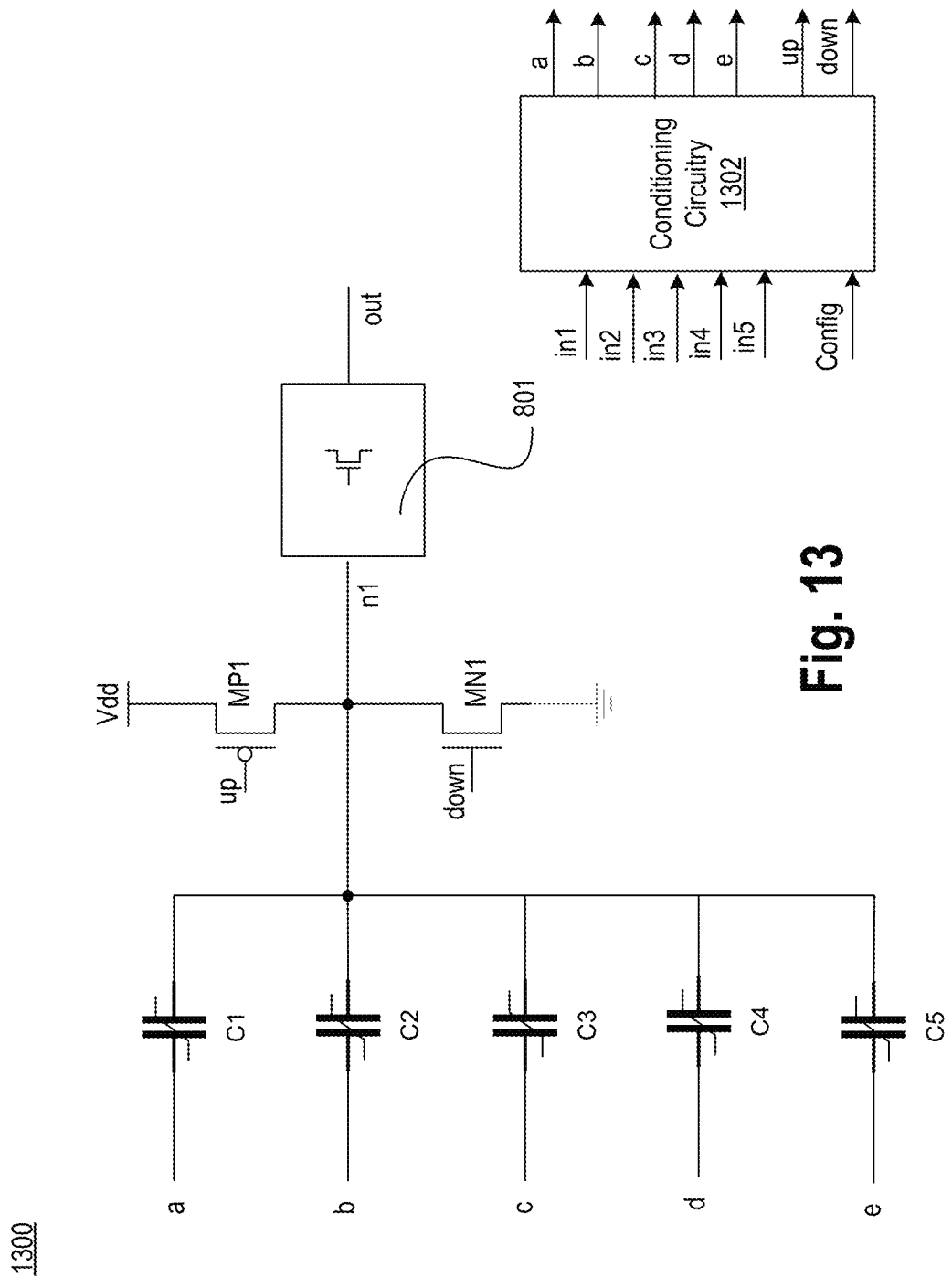
FIG. 13 illustrates a 5-input adjustable threshold gate with ferroelectric capacitors and a pull-down device and a pull-up device on a summing node, in accordance with some embodiments.

FIG. 13 illustrates 5-input adjustable threshold gate 1300 with ferroelectric capacitors and a pull-down device and a pull-up device on a summing node, in accordance with some embodiments. 5-input capacitive circuit 1300 is like 3-input capacitive circuit 1100 but for additional inputs 'd' and 'e' and associated capacitors C4 and C5. In some embodiments, a first terminal of capacitor C4 is coupled to input 'd' while a second terminal of capacitor C4 is coupled to summing node n1. In some embodiments, a first terminal of capacitor C5 is coupled to input 'e' while a second terminal of capacitor C5 is coupled to summing node n1. Conditioning circuit 1202 is replaced with a conditioning circuit 1302. Conditioning circuitry 1302 may receive inputs in1, in2, in3, in4, and in5 and configuration setting (e.g., reset or evaluation) to determine the outputs 'a', 'b', 'c', 'd', 'e', controls "up", and "down". During the evaluation phase, in1 is passed on to output 'a', in2 is passed on to 'b', in3 is passed on to 'c', in4 is passed on to 'd', and in5 is passed on to 'e'. During the reset phase, depending on a desired threshold, outputs 'a', 'b', 'c' 'd', and 'e' are conditioned.

In some embodiments, by turning on/off the pull-up device MP1 and pull-down device MN1 in a sequence, and conditioning the inputs 'a', 'b', 'c', 'd', and 'e' during a reset phase, the charge at node n1 is set. As such, in an evaluation phase when the pull-up and pull-down devices (MP1 and MN1) are disabled, 5-input capacitive circuit 500 attains a desired function.

In some embodiments, conditioning circuitry 1302 sets the threshold to 0 in a reset phase by first enabling or turning on the pull-down device MN1, and then turning on or enabling the pull-up device MP1, and providing logic 0 to the first input 'a', logic 0 to the second input 'b', and logic 0 to the third input 'c', logic 0 to the fourth input 'd', and logic 0 to the fifth input 'e'. A threshold of 0 means that conditioning circuitry 1302 is an always on circuit regardless of the logic levels of inputs. In one such embodiment, during the evaluation phase for the circuit configured with threshold of zero, the logic value on node n1 is logic 1, and the logic value on output out is logic 0 (assuming the driver is an inverter).

In some embodiments, conditioning circuitry 1302 sets the threshold to 1 in a reset phase by first enabling or turning on the pull-down device MN1, and then turning on or enabling the pull-up device MP1, and providing logic 1 to the first input 'a', logic 0 to the second input 'b', and logic 0 to the third input 'c', logic 0 to the fourth input 'd', and logic 0 to the fifth input 'e'. In some embodiments, conditioning circuitry 1302 sets the threshold to 1 in a reset phase by first enabling or turning on the pull-up device MP1, and then turning on or enabling the pull-down device MN1, and providing logic 0 to the first input 'a', logic 0 to the second input 'b', and logic 0 to the third input 'c', logic 0 to the fourth input 'd', and logic 0 to the fifth input 'e'. In some embodiments, when the threshold is set to 1 in a reset phase by a particular sequencing of turning on/off the pull-up and the pull-down devices and conditioning of the inputs 'a' 'b', 'c', 'd', and 'e'; it means that during an evaluation phase when any of the inputs 'a' 'b', 'c', 'd', or 'e' is logic high, then voltage on node n1 is logic high. Continuing with this example, when all inputs 'a', 'b', 'c' 'd', or 'e' is a logic low, then the voltage on node n1 resolves to logic low. As such, 5-input capacitive circuit 1300 is programmed or configured as an OR gate at node n1 and an NOR gate at output out.

In some embodiments, conditioning circuitry 1302 sets the threshold to 2 in a reset phase by first enabling or turning on the pull-down device MN1, and then turning on or enabling the pull-up device MP1, and providing logic 1 to the first input 'a', logic 1 to the second input 'b', and logic 0 to the third input 'c', logic 0 to the fourth input 'd', and logic 0 to the fifth input 'e'. In some embodiments, conditioning circuitry 1302 sets the threshold to 2 in a reset phase by first enabling or turning on the pull-up device MP1, and then turning on or enabling the pull-down device MN1, and providing logic 1 to the first input 'a', logic 0 to the second input 'b', and logic 0 to the third input 'c', logic 0 to the fourth input 'd', and logic 0 to the fifth input 'e'. In one instance, when the threshold is set to 2 in a reset phase by a particular sequencing of turning on/off the pull-up and the pull-down devices and conditioning of the inputs 'a', 'b', 'c', 'd', and 'e'; it means that during an evaluation phase when at least two of the five inputs 'a', 'b' 'c', 'd', and 'e' are logic high, then voltage on node n1 is logic high. Continuing with this example, when one or zero inputs of the five inputs 'a' 'b', 'c', 'd', and 'e' are a logic high, then the voltage on node n1 resolves to logic low. As such, 5-input capacitive circuit 1300 is programmed or configured as a 5-input majority 0 gate-like logic (e.g., a threshold gate with a threshold of 2) at node n1 and a 5-input minority 0 gate-like logic (e.g., an inverted threshold gate with a threshold of 2) at output out.

In some embodiments, conditioning circuitry 1302 sets the threshold to 3 in a reset phase by first enabling or turning on the pull-down device MN1, and then turning on or enabling the pull-up device MP1, and providing logic 1 to the first input 'a', logic 1 to the second input 'b', and logic 1 to the third input 'c', logic 0 to the fourth input 'd', and logic 0 to the fifth input 'e'. In some embodiments, conditioning circuitry 1302 sets the threshold to 3 in a reset phase by first enabling or turning on the pull-up device MP1, and then turning on or enabling the pull-down device MN1, and providing logic 1 to the first input 'a', logic 1 to the second input 'b', and logic 0 to the third input 'c', logic 0 to the fourth input 'd', and logic 0 to the fifth input 'e'. In one instance, when the threshold is set to 3 in a reset phase by a particular sequencing of turning on/off the pull-up and/or the pull-down devices and conditioning of the inputs 'a', 'b', 'c', 'd', and 'e'; it means that during an evaluation phase when at least three of the five inputs 'a', 'b' 'c', 'd', and 'e' are logic high, then voltage on node n1 is logic high. Continuing with this example, when at least two inputs of the five inputs 'a' 'b', 'c', 'd', and 'e' is a logic low (or 2 or fewer inputs are logic high), then the voltage on node n1 resolves to logic low. As such, 5-input capacitive circuit 1300 is programmed or configured as a 5-input majority gate logic at node n1 and a 5-input minority gate logic at output out (assuming driver circuitry 801 is an inverter).

In some embodiments, conditioning circuitry 1302 sets the threshold to 4 in a reset phase by first enabling or turning on the pull-down device MN1, and then turning on or enabling the pull-up device MP1, and providing logic 1 to the first input 'a', logic 1 to the second input 'b', and logic 1 to the third input 'c', logic 1 to the fourth input 'd', and logic 0 to the fifth input 'e'. In some embodiments, conditioning circuitry 1302 sets the threshold to 4 in a reset phase by first enabling or turning on the pull-up device MP1, and then turning on or enabling the pull-down device MN1, and providing logic 1 to the first input 'a', logic 1 to the second input 'b', and logic 1 to the third input 'c', logic 0 to the fourth input 'd', and logic 0 to the fifth input 'e'. In some embodiments, when the threshold is set to 4 in a reset phase by a particular sequencing of turning on/off the pull-up and the pull-down devices and conditioning of the inputs 'a', 'b', 'c', 'd', and 'e'; it means that during an evaluation phase when at least four inputs from the five inputs 'a', 'b' 'c', 'd' and 'e' are logic high, then voltage on node n1 is logic high. Continuing with this example, when three or fewer inputs from the five inputs 'a' 'b', 'c', 'd' and 'e' are logic high, then the voltage on node n1 resolves to logic low. As such, 5-input capacitive circuit 1300 is programmed or configured as a 5-input majority 1 gate-like logic (e.g., a threshold gate with a threshold of 4) at node n1 and a 5-input minority 1 gate-like logic (e.g., an inverted threshold gate with a threshold of 4) at output out.

In some embodiments, conditioning circuitry 1302 sets the threshold to 5 in a reset phase by first enabling or turning on the pull-down device MN1, and then turning on or enabling the pull-up device MP1, and providing logic 1 to the first input 'a', logic 1 to the second input 'b', and logic 1 to the third input 'c', logic 1 to the fourth input 'd', and logic 1 to the fifth input 'e'. In some embodiments, conditioning circuitry 1302 sets the threshold to 5 in a reset phase by first enabling or turning on the pull-up device MP1, and then turning on or enabling the pull-down device MN1, and providing logic 1 to the first input 'a', logic 1 to the second input 'b', and logic 1 to the third input 'c', logic 1 to the fourth input 'd', and logic 0 to the fifth input 'e'. In some embodiments, when the threshold is set to 5 in a reset phase by a particular sequencing of turning on/off the pull-up and the pull-down devices and conditioning of the inputs 'a', 'b', 'c', 'd', and 'e'; it means that during an evaluation phase when all five inputs 'a', 'b' 'c', 'd', and 'e' are logic high, then voltage on node n1 is logic high. Continuing with this example, when any of the five inputs 'a' 'b', 'c', 'd', and 'e' is a logic low, then the voltage on node n1 resolves to logic low. As such, 5-input capacitive circuit 1300 is programmed or configured as a 5-input AND at node n1 and a 5-input NAND gate at output out (assuming that the driver circuitry 801 is an inverter).

In some embodiments, conditioning circuitry 1302 sets the threshold to 6 in a reset phase by first enabling or turning on the pull-up device MP1, and then turning on or enabling the pull-down device MN1, and providing logic 1 to the first input 'a', logic 1 to the second input 'b', and logic 1 to the third input 'c', logic 1 to the fourth input 'd', and logic 1 to the fifth input 'e'. A threshold of 6 for a 5-input capacitive circuit means that capacitive input circuit is an always off circuit regardless of the logic levels of the inputs. In one such embodiment, during the evaluation phase for the circuit configured with threshold of n+1 (e.g., 6, where 'n' is the number of capacitive inputs), the logic value on node n1 is floating and may eventually discharge to ground or charge to supply level. In some embodiments, the voltage on node n1 is zero volts regarding of input setting when the threshold in 6 (e.g., n+1).

So, the same circuit can be used as a majority/minority gate logic majority/minority gate-like logic (or threshold logic gate), AND/NAND, OR/NOR gate, a gate driving a predetermined output, or a disconnected gate by conditioning the inputs and resetting or setting the voltage on the summing node in a sequence during a reset phase. Subsequently, in the evaluation phase the circuit will behave as a 5-input majority/minority gate logic, 5-input majority/minority gate-like or threshold logic, 5-input AND/NAND gate, 5-input OR/NOR gate, an always-on gate, or a disconnected gate.

Table 17 illustrates an example of input conditioning to set various thresholds during a reset phase for 5-input capacitive circuit 1300. In various embodiments, during the sequence one of pull-up or pull-down device is on at a time to avoid crossbar current or short circuit current. For example, when the pull-down device MN1 is enabled, the pull-up device MP1 is disabled. Likewise, when the pull-up device MP1 is enabled, the pull-down device MN1 is disabled. Here, time T3 (or event T3) occurs after time T2 (or event T2) which occurs after time T1 (or event T1). In some embodiments, the separation between T1, T2, and T3 is between ½ cycle to 1 cycle, where a cycle is in GHz (e.g., 1 GHz or more).

TABLE 17

| a | b | c | d | e | T1 | T2 | T3 | Threshold |
|---|---|---|---|---|----|----|----|-----------|
| 0 | 0 | 0 | 0 | 0 | 1 (enable MN1) | 0 (disable MN1) | 0 (enable MP1) | 0 |
| 1 | 0 | 0 | 0 | 0 | 1 (enable MN1) | 0 (disable MN1) | 0 (enable MP1) | 1 |

TABLE 17-continued

| a | b | c | d | e | T1 | T2 | T3 | Threshold |
|---|---|---|---|---|----|----|----|-----------|
| 1 | 1 | 0 | 0 | 0 | 1 (enable MN1) | 0 (disable MN1) | 0 (enable MP1) | 2 |
| 1 | 1 | 1 | 0 | 0 | 1 (enable MN1) | 0 (disable MN1) | 0 (enable MP1) | 3 |
| 1 | 1 | 1 | 1 | 0 | 1 (enable MN1) | 0 (disable MN1) | 0 (enable MP1) | 4 |
| 1 | 1 | 1 | 1 | 1 | 1 (enable MN1) | 0 (disable MN1) | 0 (enable MP1) | 5 |
| 0 | 0 | 0 | 0 | 0 | 0 (enable MP1) | 1 (disable MP1) | 1 (enable MN1) | 1 |
| 1 | 0 | 0 | 0 | 0 | 0 (enable MP1) | 1 (disable MP1) | 1 (enable MN1) | 2 |
| 1 | 1 | 0 | 0 | 0 | 0 (enable MP1) | 1 (disable MP1) | 1 (enable MN1) | 3 |
| 1 | 1 | 1 | 0 | 0 | 0 (enable MP1) | 1 (disable MP1) | 1 (enable MN1) | 4 |
| 1 | 1 | 1 | 1 | 0 | 0 (enable MP1) | 1 (disable MP1) | 1 (enable MN1) | 5 |
| 1 | 1 | 1 | 1 | 1 | 0 (enable MP1) | 1 (disable MP1) | 1 (enable MN1) | 6 |

Table 18 illustrates a logic function achieved in the evaluation phase by configuring the threshold in the reset phase for 5-input capacitive circuit 1300. In various embodiments, the pull-up device MP1 and the pull-down device MN1 are disabled during the evaluation phase.

TABLE 18

| Threshold | Logic Function on node n1 | Logic function on node "out" |
|-----------|---------------------------|------------------------------|
| 0 | Logic 1 | Logic 0 |
| 1 | OR | NOR |
| 2 | Majority 0 gate-like (e.g., a threshold gate with a threshold of 2) | Minority 0 gate-like (e.g., an inverted threshold gate with a threshold of 2) |
| 3 | Majority gate | Minority gate |
| 4 | Majority 1 gate-like (e.g., a threshold gate with a threshold of 4) | Minority 1 gate-like (e.g., an inverted threshold gate with a threshold of 4) |
| 5 | AND | NAND |
| 6 | Logic 0 | Logic 1 |

By setting inputs to have a particular number of 0s and 1s and at the same time controlling the logic level appearing at the summation node (n1) by controlling the pull-up and pull-down devices in a sequence, two effects are accomplished, in accordance with various embodiments. First, each capacitor stores a deterministic charge. Second, a specific displacement charge is put on the summing or floating node n1. Setting a specific displacement charge value at the floating node n1 sets the threshold of when the floating node (n1) during the evaluation phase is allowed to go to the logic value of 0 or 1. For example, for an n-input threshold gate, if the threshold is set such that the floating node n1 goes closer to 1 logic level than 0 logic level, when all of the inputs are set to 1, then the capacitive input circuit becomes a NAND gate. Similarly, if it is desired that any one input becomes logic 1 in the evaluation phase to give voltage closer to logic level 1 at the floating node, then the circuit becomes an OR gate with n-inputs. Similarly, any intermediate threshold from 0 to n can be set. In some embodiments, a threshold of zero means that the gate becomes a buffer. For instance, the circuit is always turned on to input logic level 1. A threshold of n+1 for an n-input gate means that the summation node n1 may not go closer to logic level 1, even when all the inputs are set to 1. This would mean that that the capacitive input circuit becomes a disconnected circuit.

In general, the input capacitive circuit when configured as a threshold gate, it can be expressed as:

$$Y = 1 \text{ if } \sum_{j=1}^{m} W_j X_j \geq T,$$

$$Y = 0 \text{ if } \sum_{j=1}^{m} W_j X_j < T,$$

Where 'Y' is the output (logic level on node n1), 'X' is the input, 'W' is the capacitive weight, and 'T' is the threshold. Assuming all Ws are ones (e.g., all capacitors have the same capacitance), when T is equal to the number of inputs, and AND gate is realized at node n1. In this example, for a 3-input capacitive circuit, a 3 input AND gate is realized when threshold is set to 3. In another example, when T equals 1, a NOR gate is realized at node n1. In yet another example, when T is equal to 0, the input capacitive circuit is always on, and the voltage on node n1 is logic 1. In yet another example, when T is greater than the number of inputs to the circuit, the circuit is always off or disconnected. In this case, voltage on node n1 is floating and may over time leak away.

While the embodiments are described with reference to up-to 5-input capacitive circuit using equal ratio for the capacitance, the same idea can be expanded to any number of input capacitive circuit with equal or unequal ratio for capacitances. In various embodiments, the capacitances are ferroelectric capacitors. In some embodiments, the ferroelectric capacitors are planar capacitors. In some embodiments, the ferroelectric capacitors are pillar or trench capacitors. In some embodiments, the ferroelectric capacitors are vertically stacked capacitors to reduce the overall footprint of the multi-input capacitive circuit.

In some embodiments, the transistors (MP1 and MN1) that charge or discharge the summing node n1 are planar or non-planar transistors. In some embodiments, transistors MP1 and MN1 are fabricated in the front-end of the die on a substrate. In some embodiments, one of the transistors (e.g., MP1 or MN1) is fabricated in the front-end of the die while another one of the transistors is fabricated in the backend of the end such that the stack of capacitors is between the frontend of the die and the backend of the die or between the two transistors. As such, the footprint of the multi-input capacitive circuit may be a footprint of a single transistor or slightly more than that. These backed transistors or switches can be fabricated using any suitable technology such as IGZO (indium gallium zinc oxide). In some embodiments, the ferroelectric capacitors can be formed using transistors configured as capacitors, where transistor gates have ferroelectric material. These capacitors can be on the frontend or the backend of the die.

While the various embodiments are described with reference to driver circuitry 801 connected at node n1, driver circuitry 801 can be removed. When input capacitors for a capacitive input circuit are linear capacitors (e.g., comprising linear dielectric material), the voltage developed at node n1 may not reach rail-to-rail. As such, the subsequent driver circuitry 801 connected to node n1 may experience static leakage. Static leakage increases power consumption. In various embodiments, when input capacitors comprise nonlinear polar material (e.g., ferroelectric material), then the voltage developed on node n1 results in reduced static leakage in the subsequent driver circuitry 801. One reason for this reduced leakage is because ferroelectric material in the input capacitors allow for voltage on node n1 to reach closer to rail-to-rail voltage, which reduces static leakage in subsequent driver circuitry 801. Here, summation node n1 can maintain displacement charge (to provide logic 0 or logic 1 functions for the programmed threshold) for a longer period compared to linear capacitors. Consequently, the reset overhead of turning on/off the pull-up or pull-down devices is reduced. For example, when the leakage at the summation node n1 is low, the pull-up or pull-down devices may not need to turn on for tens of microseconds, which reduces the reset activity on node n1. Thus, circuit using nonlinear capacitors (e.g., ferroelectric capacitor) in this configuration becomes a viable option to realize low leakage logic circuits for advanced process technology nodes (e.g., advanced finFET process technology node).

Since the voltage on node n1 for the various threshold gates described herein is closer to rail-to-rail voltage compared to the case when linear input capacitors are used, subsequent driver circuitry 801 can be removed. As such, the input capacitors with nonlinear polar material can drive another capacitive input circuit directly. Here, closer to rail-to-rail voltage on node n1 using nonlinear polar material based capacitors (e.g., ferroelectric or paraelectric capacitors) implies that the static leakage in the subsequent driver 801 is reduced compared to the case when voltage on n1 is not close to rail-to-rail voltage. When linear capacitors are used, a voltage divider is formed on node n1 based on the number of capacitors and their logic inputs. Such a voltage divider results in non-rail-to-rail voltage on node n1 that results in static leakage in the subsequent driver 801. When nonlinear capacitors are used, the voltage divider is not a linear voltage divider. This results in a much closer rail-to-rail voltage on n1 which reduces static leakage in the subsequent driver 801. Higher the nonlinearity, the closer the voltage on node n1 is rail-to-rail. Nonlinear capacitors as shown in various embodiments allow the logic gate to have more inputs compared to the case when linear capacitors are used while keeping the leakage through diver 801 low.

Figure 14:
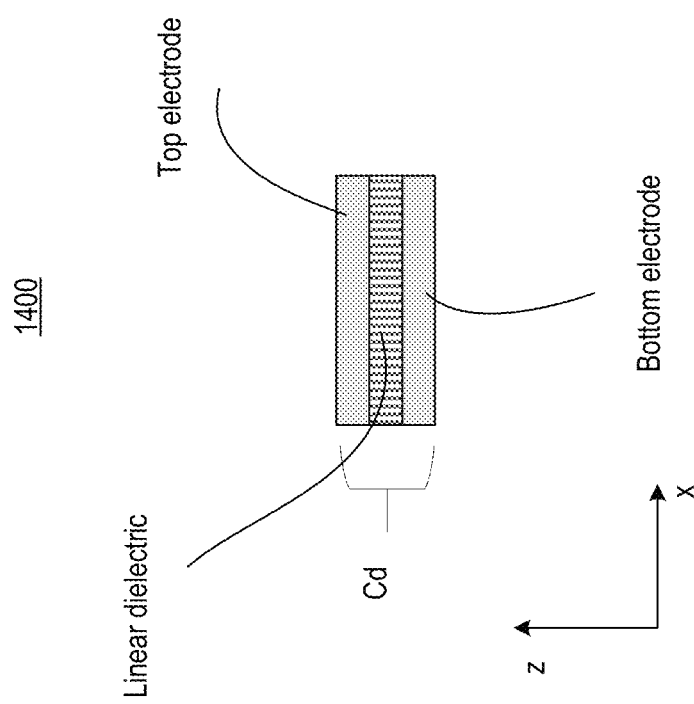
FIG. 14 illustrates a planar linear capacitor structure, in accordance with some embodiments.

FIG. 14 illustrates planar linear capacitor structure 1400, in accordance with some embodiments. In some embodiments, capacitors for the multi-input capacitive structures are linear capacitors. These capacitors can take any planar form. One such form is illustrated in FIG. 14. Here, planar capacitor structure 1400 is a metal-insulator-metal (MIM) capacitor comprising a bottom electrode, a top electrode, and a linear dielectric between the top electrode and the bottom electrode as shown. In some embodiments, conductive oxide layer(s) are formed between the bottom electrode and the linear dielectric. In some embodiments, conductive oxide layer(s) are formed between the top electrode and the linear dielectric. Examples of conductive oxides include: $IrO_2$, $RuO_2$, $PdO_2$, $OsO_2$, or $ReO_3$. In some examples, conductive oxides are of the form A2O3 (e.g., In2O3, Fe2O3) and ABO3 type, where 'A' is a rare earth element and B is Mn.

In some embodiments, the dielectric layer includes one or more of: SiO2, Al2O3, Li2O, HfSiO4, Sc2O3, SrO, HfO2, ZrO2, Y2O3, Ta2O5, BaO, WO3, MoO3, or TiO2. Any suitable conductive material may be used for the top electrode and the bottom electrode. For example, the material or the electrode may include one or more of: Cu, Al, Ag, Au, W, or Co. In some embodiments, the thickness along the z-axis of the top electrode and bottom electrode is in a range of 1 nm to 30 nm. In some embodiments, the thickness along the z-axis of the dielectric is in a range of 1 nm to 30 nm. In some embodiments, the thickness along the z-axis of the conductive oxide is in a range of 1 nm to 30 nm.

Figure 15A:
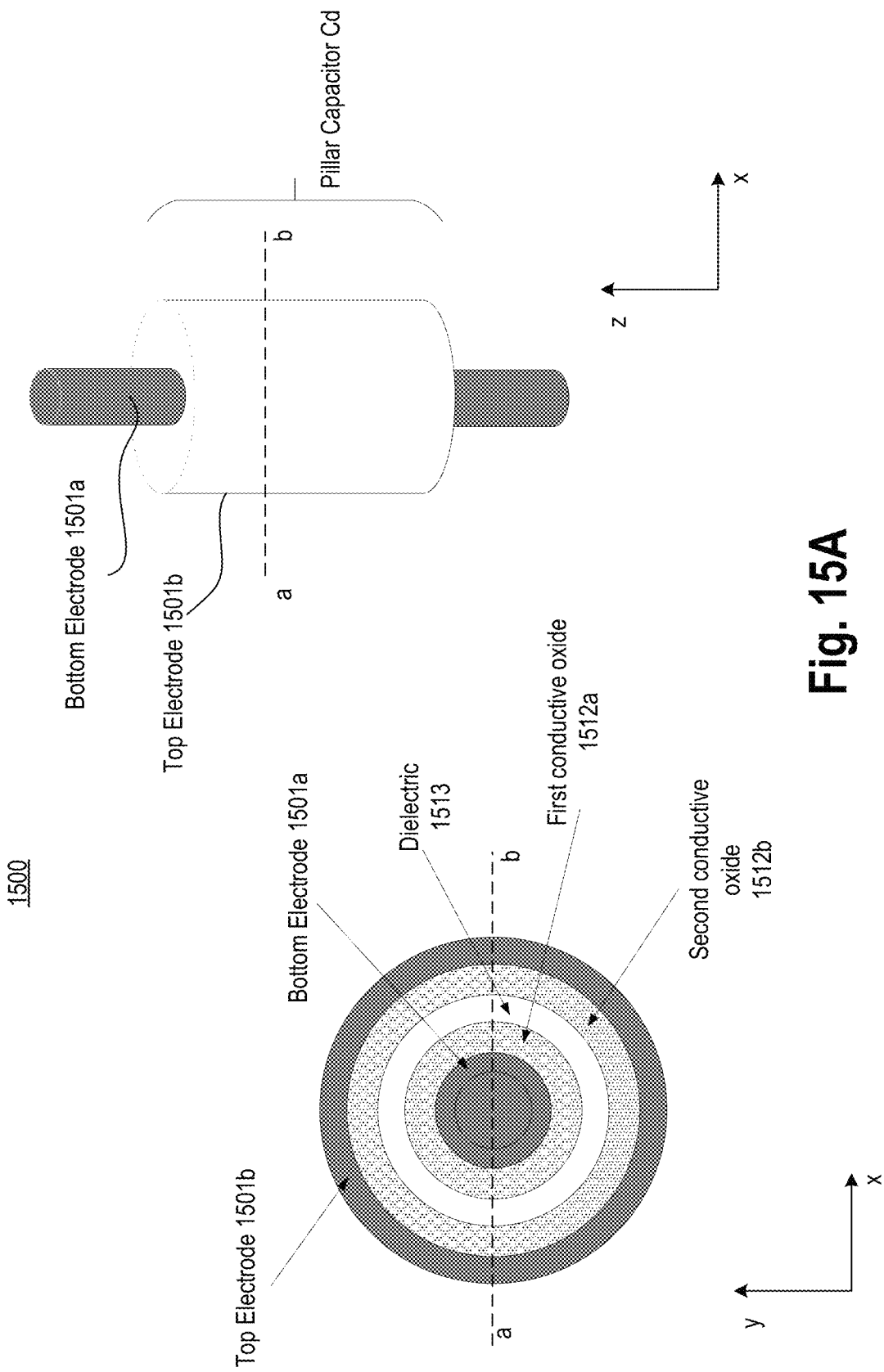
FIG. 15A illustrates a non-planar linear capacitor structure, in accordance with some embodiments.

FIG. 15A illustrates a non-planar linear capacitor structure 1500, in accordance with some embodiments. In some embodiments, non-planar capacitor structure 600 is rectangular in shape. Taking the cylindrical shaped case for example, in some embodiments, the layers of non-planar capacitor structure 1500 from the center going outwards include bottom electrode 1501a, first conductive oxide 1512a, linear dielectric material 1513, second conductive oxide 1512b, and top electrode 1501b. A cross-sectional view along the "ab" dashed line is illustrated in the middle of FIG. 15A. In some embodiments, conducting oxides are removed and the linear dielectric is directly connected to top electrode 1501b and bottom electrodes 1501a. In some embodiments, linear dielectric material 1513 can include any suitable dielectric, where the thickness of dielectric film is a range of 1 nm to 20 nm. In some embodiments, linear dielectric material 1513 comprises a higher-K dielectric material. In some embodiments, linear dielectrics include one of: SIO2, Al2O3, Li2O, HfSiO4, Sc2O3, SrO, HfO2, ZrO2, Y2O3, Ta2O5, BaO, WO3, MoO3, or TiO2. The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, and zirconium silicon oxide.

In some embodiments, first conductive oxide 1512a is conformally deposited over bottom electrode 1501a. In some embodiments, dielectric material 1513 is conformally deposited over first conductive oxide 1512a. In some embodiments, second conductive oxide 1512b is conformally deposited over dielectric material 1513. In some embodiments, top electrode 1501b is conformally deposited over second conductive oxide 1512b. In some embodiments, bottom electrode 1501a is in the center while top electrode 1501b is on an outer circumference of non-planar capacitor structure 1500.

In some embodiments, material for bottom electrode 1501a may include one or more of: Cu, Al, Ag, Au, W, or Co, or their alloys. In some embodiments, material for first conductive oxide 1512a include: $IrO_2$, $RuO_2$, $PdO_2$, $OsO_2$, or $ReO_3$. In some examples, conductive oxides are of the form A2O3 (e.g., In2O3, Fe2O3) and ABO3 type, where 'A' is a rare earth element and B is Mn. In some embodiments, material for second conductive oxide 1512b may be same as the material for first conductive oxide 1512a. In some embodiments, material for top electrode 1501b may include one or more of: Cu, Al, Ag, Au, W, or Co, or their alloys.

In some embodiments, a first refractive inter-metallic layer (not shown) is formed between dielectric material 1513 and first conductive oxide 1512a. In some embodiments, a second refractive inter-metallic layer (not shown) is formed between dielectric capacitor material 1513 and second conductive oxide 1512b. In these cases, the first and second refractive inter-metallic layers are directly adjacent to their respective conductive oxide layers and to dielectric capacitor material 1513. In some embodiments, refractive inter-metallic maintains the capacitive properties of the dielectric capacitor material 1513. In some embodiments, refractive inter-metallic comprises Ti and Al (e.g., TiAl compound). In some embodiments, refractive inter-metallic comprises one or more of Ta, W, and/or Co.

For example, refractive inter-metallic includes a lattice of Ta, W, and Co. In some embodiments, refractive inter-metallic includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B, and Mg can markedly enhance other properties. The thicknesses of the layers of capacitor 1500 in the x-axis are in the range of 1 nm to 30 nm. In some embodiment, refractive inter-metallic layers are not used for non-planar capacitor structure 1500.

Figure 15B:
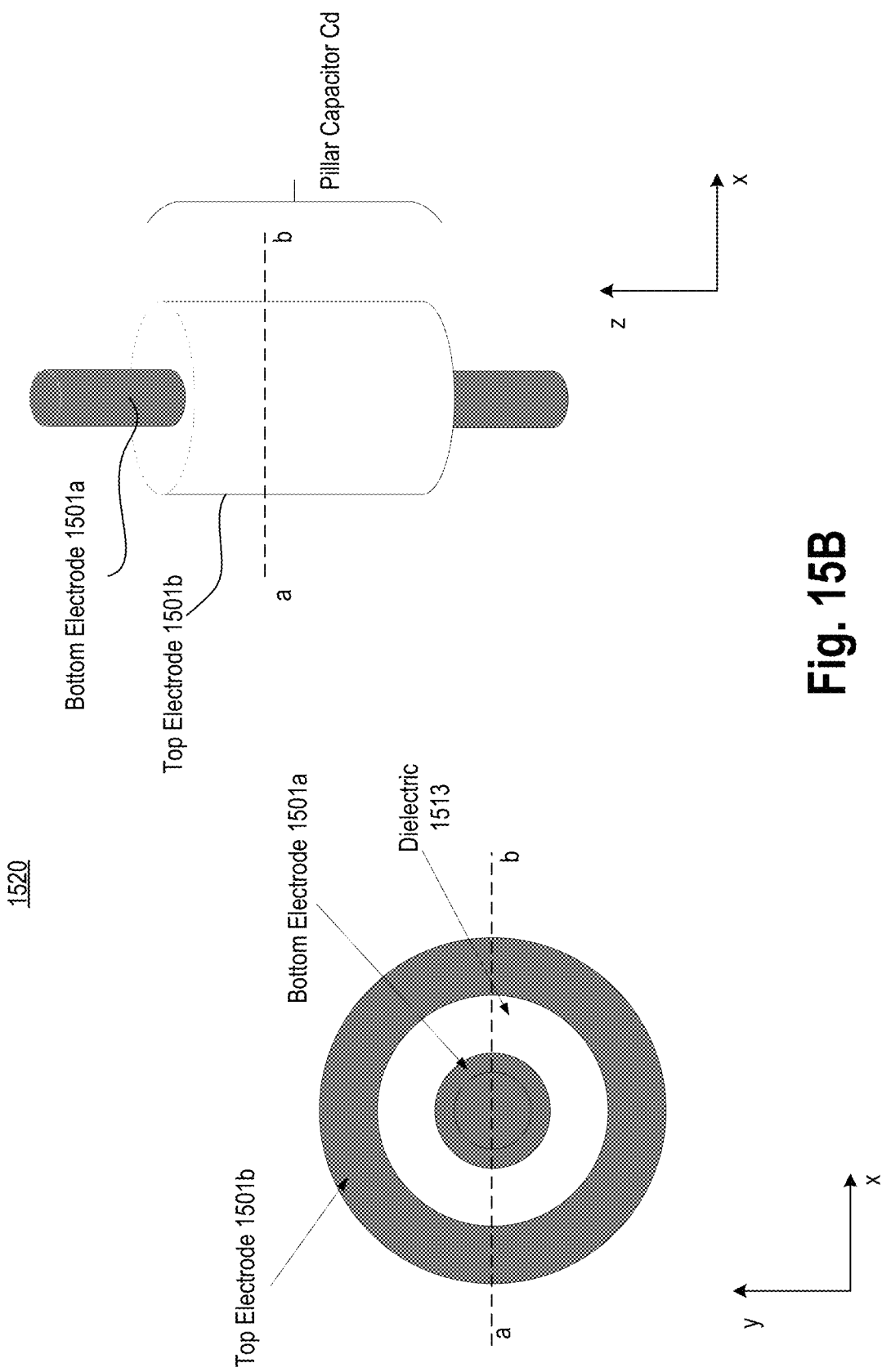
FIG. 15B illustrates a non-planar linear capacitor structure without conductive oxides, in accordance with some embodiments.

FIG. 15B illustrates non-planar linear capacitor structure 1520 without conductive oxides, in accordance with some embodiments. Compared to FIG. 15A, here the linear dielectric is adjacent to the top electrode and the bottom electrode.

Figure 16A:
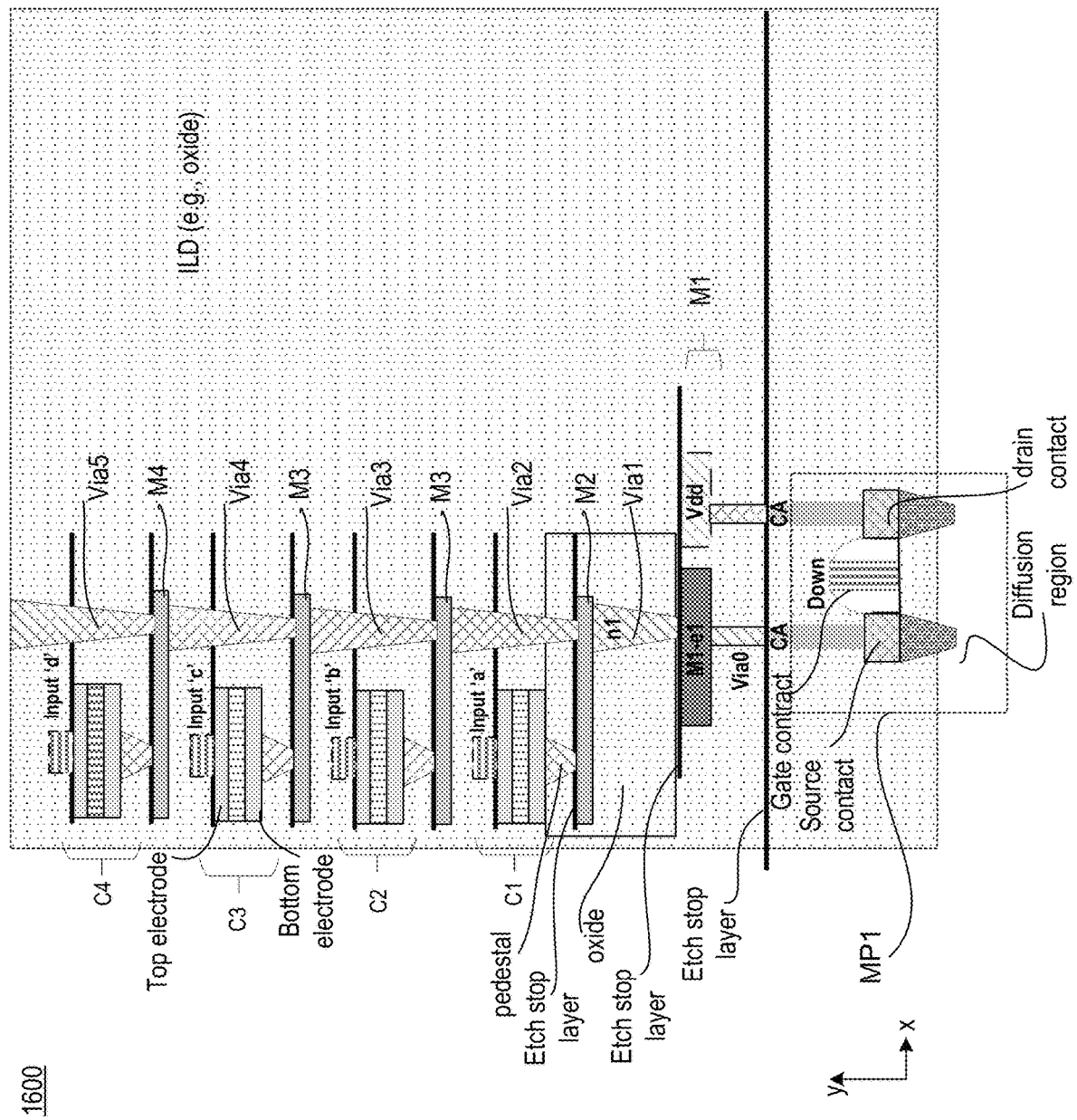
FIG. 16A illustrates a multi-input capacitive circuit with stacked planar capacitor structure, wherein the multi-input capacitive circuit includes a pull-up device, in accordance with some embodiments.

FIG. 16A illustrates multi-input capacitive circuit 1600 with stacked planar capacitor structure, wherein the multi-input capacitive circuit includes a pull-up device, in accordance with some embodiments. In this example, pull-up device is shown which is controlled by the Up control on its gate terminal. The source and drain terminals of transistor MP1 is coupled to contact (CA). Etch stop layer is used in the fabrication of vias (via0) to connect the source or drain of the transistors to summing node n1 on metal-1 (M1) layer. Another etch stop layer is formed over M1 layer to fabricate vias (via1) to couple to respective M1 layers. In some embodiments, metal-2 (M2) is deposited over vias (via1). M2 layer is then polished. In some embodiments, the capacitor can be moved further up in the stack, where the capacitor level processing is done between different layers.

In some embodiments, oxide is deposited over the etch stop layer. Thereafter, dry, or wet etching is performed to form holes for pedestals. The holes are filled with metal and land on the respective M2 layers. Fabrication processes such as interlayer dielectric (ILD) oxide deposition followed by ILD etch (to form holes for the pedestals), deposition of metal into the holes, and subsequent polishing of the surface are used to prepare for post pedestal fabrication.

A number of fabrication processes of deposition, lithography, and etching takes place to form the stack of layers for the planar capacitor. In some embodiments, the linear dielectric capacitors are formed in a backend of the die. In some embodiments, deposition of ILD is followed by surface polish. In some embodiments, a metal layer is formed over top electrode of each capacitor to connect to a respective input. For example, metal layer over the top electrode of capacitor C1 is connected to input 'a'. Metal layer over the top electrode of capacitor C2 is connected to input 'b'. Metal layer over the top electrode of capacitor C3 is connected to input 'c'. Metal layer over the top electrode of capacitor C4 is connected to input 'd'. The metal layers coupled to the bottom electrodes of capacitors C1, C2, C3, and C4 are coupled to summing node n1 through respective vias.

In this case, after polishing the surface, ILD is deposited, in accordance with some embodiments. Thereafter, holes are etched through the ILD to expose the top electrodes of the capacitors, in accordance with some embodiments. The holes are then filled with metal, in accordance with some embodiments. Followed by filling the holes, the top surface is polished, in accordance with some embodiments. As such, the capacitors are connected to input electrode (e.g., input 'a', input 'b', input 'c', and input 'd') and summing node n1 (through the pedestals), in accordance with some embodiments.

In some embodiments, ILD is deposited over the polished surface. Holes for via are then etched to contact the M2 layer, in accordance with some embodiments. The holes are filled with metal to form vias (via2), in accordance with some embodiments. The top surface is then polished, in accordance with some embodiments. In some embodiments, process of depositing metal over the vias (via2), depositing ILD, etching holes to form pedestals for the next capacitors of the stack, forming the capacitors, and then forming vias that contact the M3 layer are repeated. This process is repeated 'n' times for forming 'n' capacitors in a stack for 'n' number of inputs, in accordance with some embodiments.

In some embodiments, the bottom electrode of each capacitor is allowed to directly contact with the metal below. For example, the pedestals that connect to the top and bottom electrodes are removed. In this embodiment, the height of the stacked capacitors is lowered, and the fabrication process is simplified because the extra steps for forming the pedestals are removed.

In some embodiments, pedestals or vias are formed for both the top and bottom electrodes of the planar capacitors. In this embodiment, the height of the stacked capacitors is raised, and the fabrication process adds an additional step of forming a top pedestal or via which contacts with respective input electrodes (e.g., input 'a', input 'b', input 'c', and input 'd').

Figure 16B:
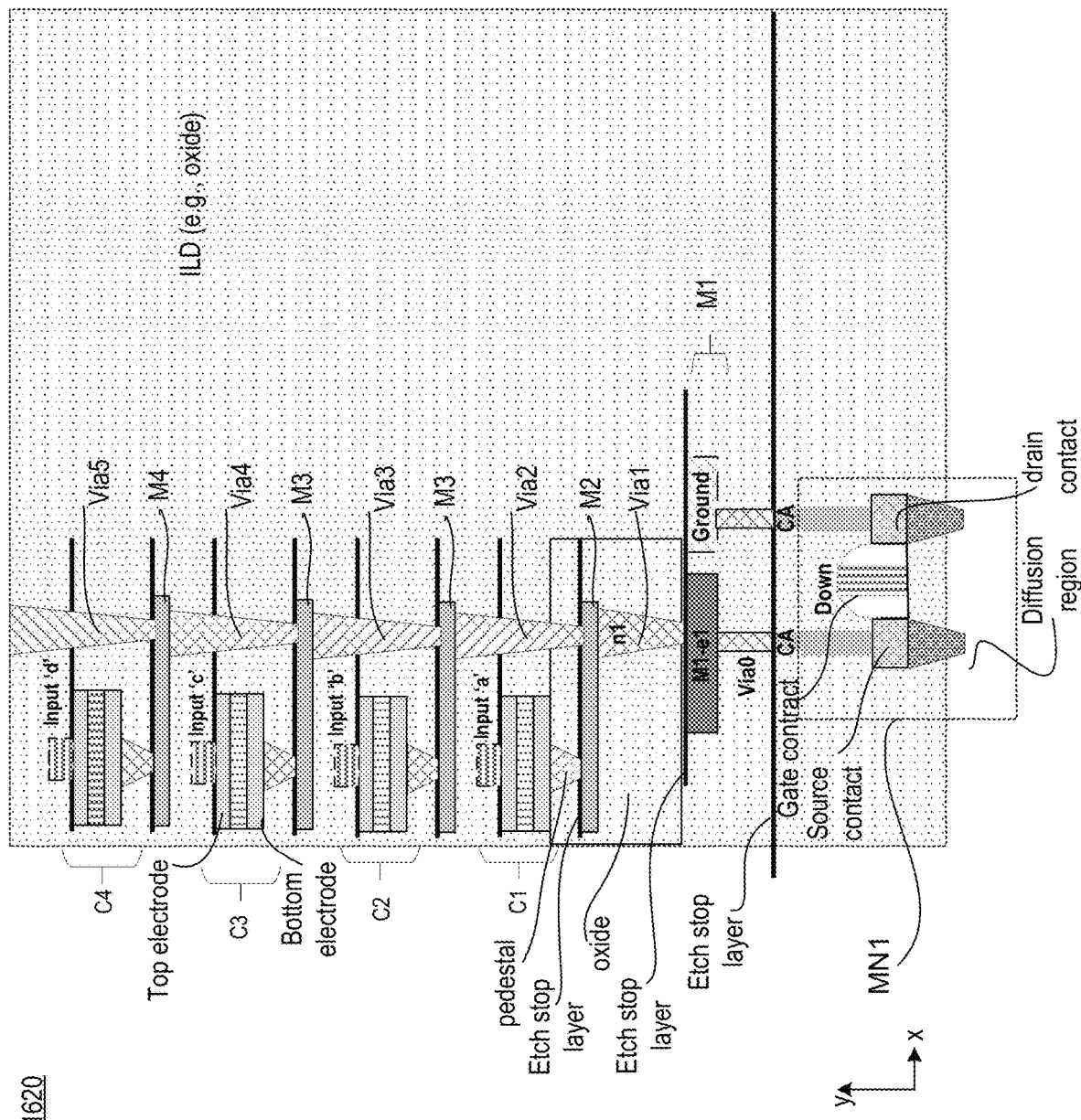
FIG. 16B illustrates a multi-input capacitive circuit with stacked planar capacitor structure, wherein the multi-input capacitive circuit includes a pull-down device, in accordance with some embodiments.

FIG. 16B illustrates multi-input capacitive circuit 1620 with stacked planar capacitor structure, wherein the multi-input capacitive circuit includes a pull-down device, in accordance with some embodiments. Multi-input capacitive circuit 1620 is like multi-input capacitive circuit 1600, but with pull-down device MN1. Here, pull-up device MP1 is removed from the summing node.

Figure 17A:
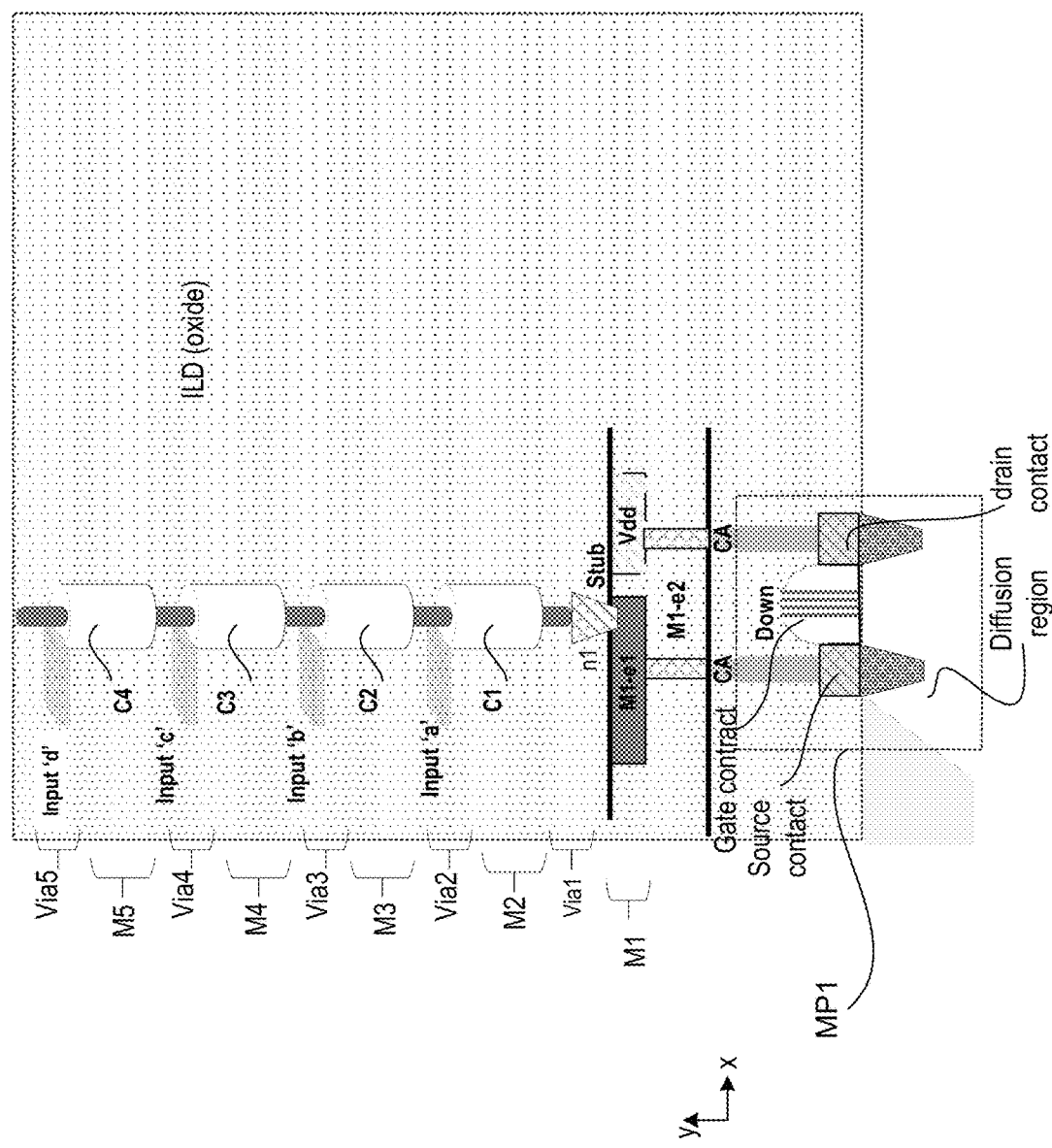
FIG. 17A illustrates a multi-input capacitive circuit with stacked non-planar capacitor structure, wherein the multi-input capacitive circuit includes a pull-up device, in accordance with some embodiments.

FIG. 17A illustrates multi-input capacitive circuit 1700 with stacked non-planar capacitor structure wherein the multi-input capacitive circuit includes a pull-up device, in accordance with some embodiments. In this example four capacitors are stacked. In some embodiments, a column of shared metal passes through the center of the capacitors, where the shared metal is the summing node n1 which is coupled to the stub and then to the source or drain terminals of the pull-up (MP1) transistor. Top electrode of each of the capacitor is partially adjacent to a respective input electrode. For example, the top electrode of capacitor C1 is coupled to input electrode 'a', the top electrode of capacitor C2 is coupled to input electrode 'b', the top electrode of capacitor C3 is coupled to input electrode 'c', and the top electrode of capacitor C4 is coupled to input electrode 'd'. In this instance, the capacitors are formed between regions reserved for Via1 through Via5 (e.g., between M1 through M6 layers). The capacitors here can be capacitors with linear dielectric or capacitors with paraelectric dielectric.

Figure 17B:
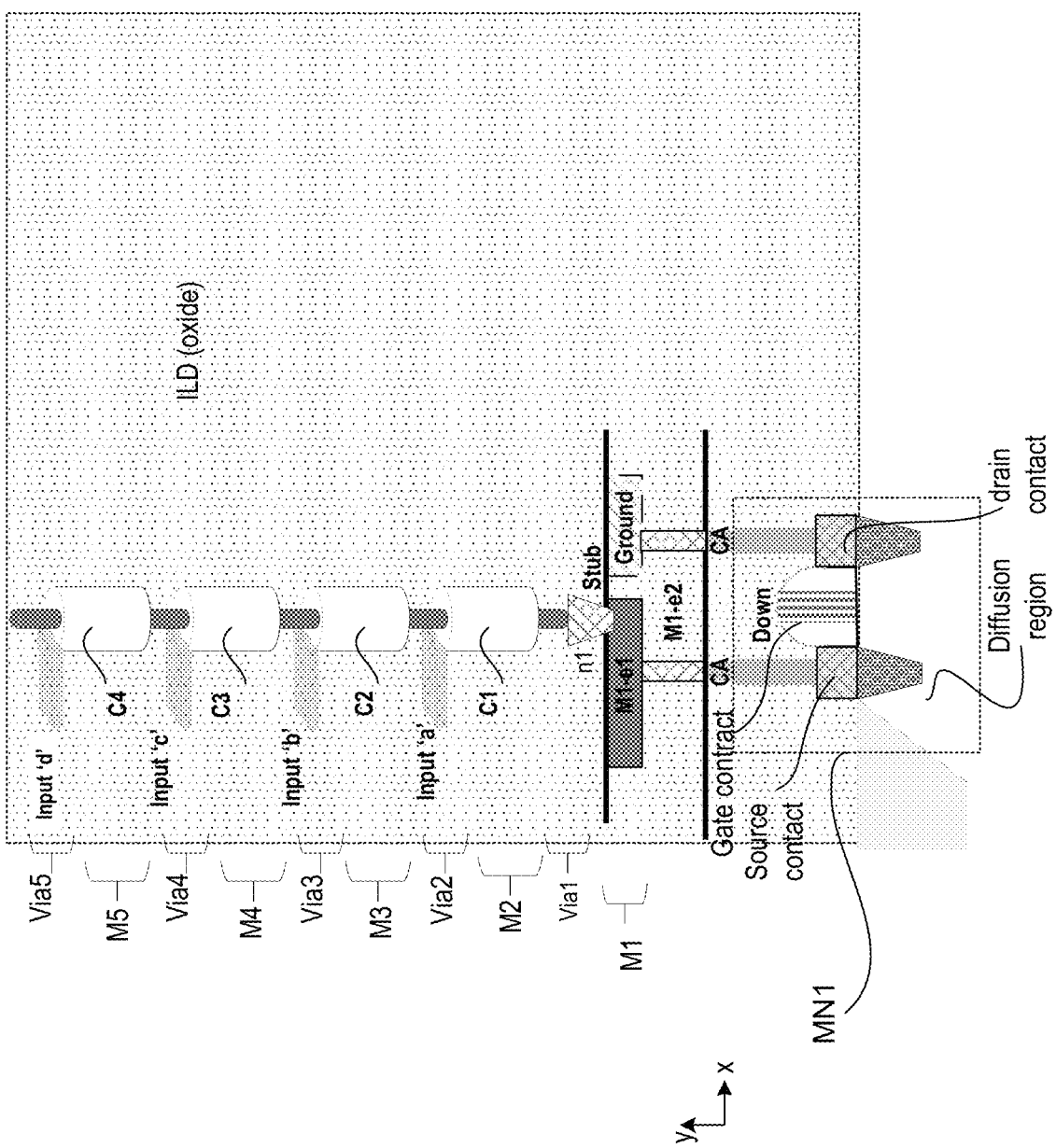
FIG. 17B illustrates a multi-input capacitive circuit with stacked non-planar capacitor structure, wherein the multi-input capacitive circuit includes a pull-up device, in accordance with some embodiments.

FIG. 17B illustrates multi-input capacitive circuit 1720 with stacked non-planar capacitor structure wherein the multi-input capacitive circuit includes a pull-down device, in accordance with some embodiments. Multi-input capacitive circuit 1720 is like multi-input capacitive circuit 1700, but with pull-down device MN1. Here, pull-up device MP1 is removed from the summing node. The capacitors here can comprise linear dielectric or paraelectric material.

Figures 18A, 18B:
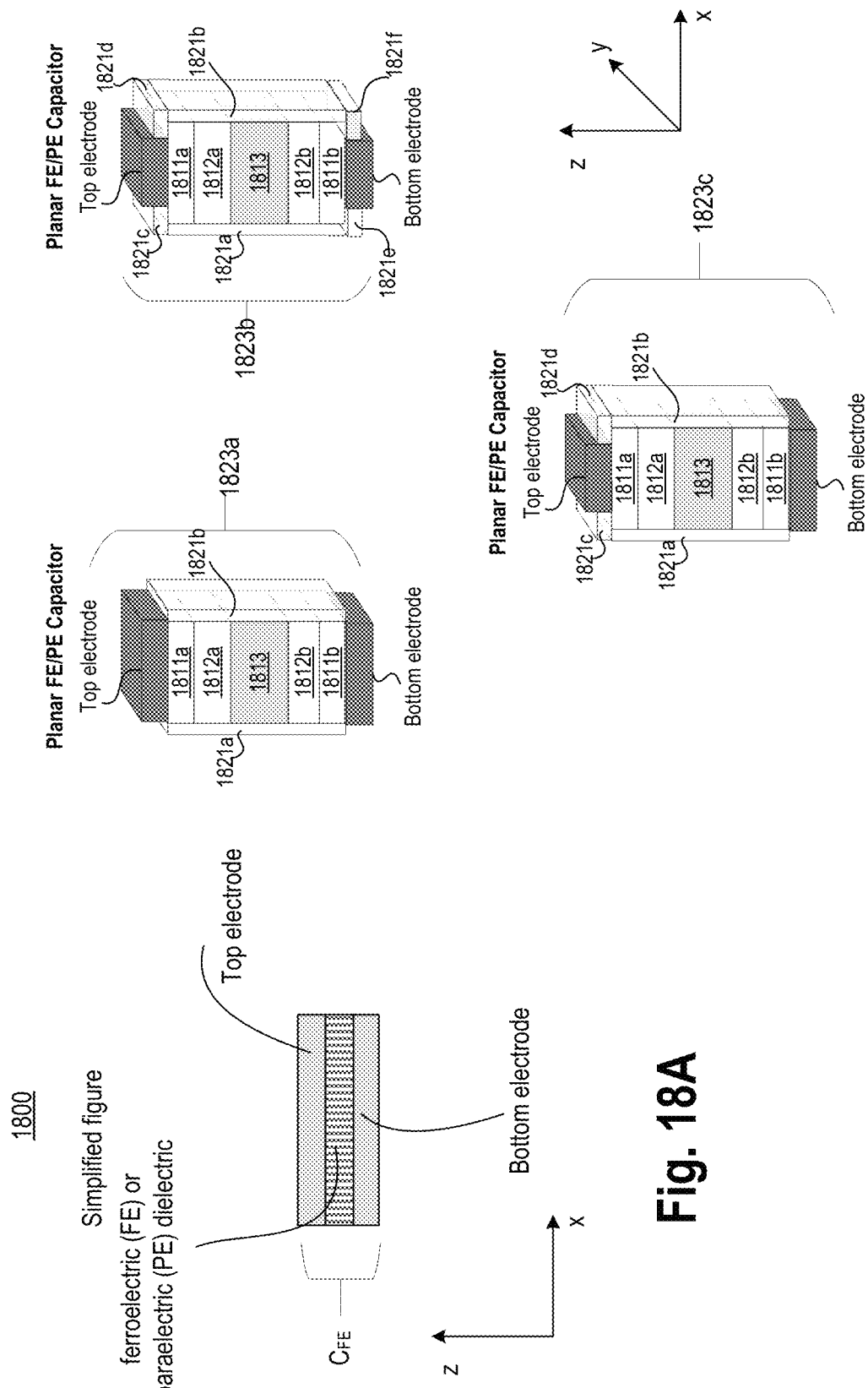
FIG. 18A illustrates a planar ferroelectric or paraelectric capacitor structure, in accordance with some embodiments.
FIG. 18B illustrates three planar ferroelectric or paraelectric capacitor structures, respectively, in accordance with some embodiments.

FIG. 18A illustrates planar ferroelectric or paraelectric capacitor structure 1800, in accordance with some embodiments. In some embodiments, capacitors for the multi-input capacitive structures are ferroelectric capacitors. These capacitors can take any planar form. One such simplified form is illustrated in FIG. 18A. Here, planar capacitor structure 1800 is a metal-insulator-metal (MIM) capacitor comprising a bottom electrode, a top electrode, and a ferroelectric dielectric between the top electrode and the bottom electrode as shown. In some embodiments, conductive oxide layer(s) are formed between the bottom electrode and the ferroelectric dielectric.

FIG. 18B illustrates three planar ferroelectric or paraelectric capacitor structures, respectively, in accordance with some embodiments. Here, any one of the three planar capacitor structures 1823a, 1823b, and 1823c is represented by the simplified planar capacitor structure 1800.

In some embodiments, planar capacitor 1823a incudes encapsulation portions 1821a and 1821b that are adjacent to the side walls of the plurality of layers of the planar capacitor. In some embodiments, planar capacitor 1823b incudes encapsulation portions 1821c and 1821d that are partially adjacent to sidewall barrier seal 1821a and 1821b, and refractive inter-metallic layers 1811a. In various embodiments, encapsulation portions 1821c and 1821d terminate into a via (not shown). The material for encapsulation portions 1821c and 1821d is same as those for sidewall barrier seal 1821a and 1821b. In some embodiments, the barrier material includes one or more of an oxide of: Ti, Al, or Mg.

In some embodiments, planar capacitor 1823c includes encapsulation portions 1821e and 1821f that are partially adjacent to sidewall barrier seal 1821a and 1821b, and refractive inter-metallic layers 1811b. In various embodiments, encapsulation portions 1821e and 1821f terminate into a via (not shown). The material for encapsulation portions 1821e and 1821f is same as those for sidewall barrier seal 1821a and 1821b. Material for 1812a and 1821b includes one or more of: Ti—Al—O, Al2O3, MgO, or nitride. Material for 1812a and 1821b is a sidewall barrier (e.g., insulative material) that protects the stack of layers from hydrogen and/or oxygen diffusion. In various embodiments, the sidewall barrier material is not an interlayer dielectric (ILD) material. In some embodiments, the lateral thickness (along x-axis) of the sidewall barrier seal 1821a/b (insulating material) is in a range of 0.1 nm to 20 nm. In some embodiments, sidewall barriers are in direct contact with ILD.

In some embodiments, planar capacitors 1823a, 1823b, and 1823c comprise a number of layers stacked together to form a planar capacitor. These layers may be extending in an x-plane when the capacitor is a planar capacitor. In some embodiments, the stack of layers includes refractive inter-metallic 1811a/b as a barrier material; conductive oxides 1812a/b, and FE material 1813. FE material 1813 can be any of the FE materials discussed herein. In some embodiments, refractive inter-metallic 1811a/b are removed, and electrodes are in direct contact with conductive oxides 1812a/b.

In some embodiments, refractive inter-metallic 1811a/b maintains the FE properties of the FE capacitor. In the absence of refractive inter-metallic 1811a/b, the ferroelectric material 1813 of the capacitor may lose its potency. In some embodiments, refractive inter-metallic 1811a/b comprises Ti and Al (e.g., TiAl compound). In some embodiments, refractive inter-metallic 1811a/b comprises one or more of Ta, W, and/or Co. For example, refractive inter-metallic 1811a/b includes a lattice of Ta, W, and Co.

In some embodiments, refractive inter-metallic 1811a/b is part of a barrier layer which is a super lattice of a first material and a second material, wherein the first material includes Ti and Al (e.g., TiAl) and the second material includes Ta, W, and Co (e.g., layers of Ta, W, and Co together). In various embodiments, the lattice parameters of the barrier layer are matched with the lattice parameters of the conductive oxides and/or FE material 1813.

In some embodiments, refractive inter-metallic 1811a/b includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B, and Mg can markedly enhance other properties. In some embodiments, barrier layer 1811a is coupled to a top electrode. In some embodiments, sidewall barrier seal 1821a/b (insulating material) is placed around layers 1811a, 1812a, 1813, 1812b, and 1811b along while the top and bottom surfaces of 1811a and 1811b are exposed for coupling to metal layers, vias, or a metallic pedestal.

In some embodiments, conductive oxide layer(s) are formed between the top electrode and the ferroelectric dielectric. Examples of conductive oxides include: IrO2, RuO2, PdO2, OsO2, or ReO3. In some examples, conductive oxides are of the form A2O3 (e.g., In2O3, Fe2O3) and ABO3 type, where 'A' is a rare earth element and B is Mn.

Any suitable conductive material may be used for the top electrode and the bottom electrode. For example, the material or the electrode may include one or more of: Cu, Al, Ag, Au, W, or Co. In some embodiments, the thickness along the z-axis of the top electrode and bottom electrode is in a range of 1 nm to 30 nm. In some embodiments, the thickness along the z-axis of the dielectric is in a range of 1 nm to 30 nm. In some embodiments, the thickness along the z-axis of the conductive oxide is in a range of 1 nm to 30 nm.

Figure 19A:
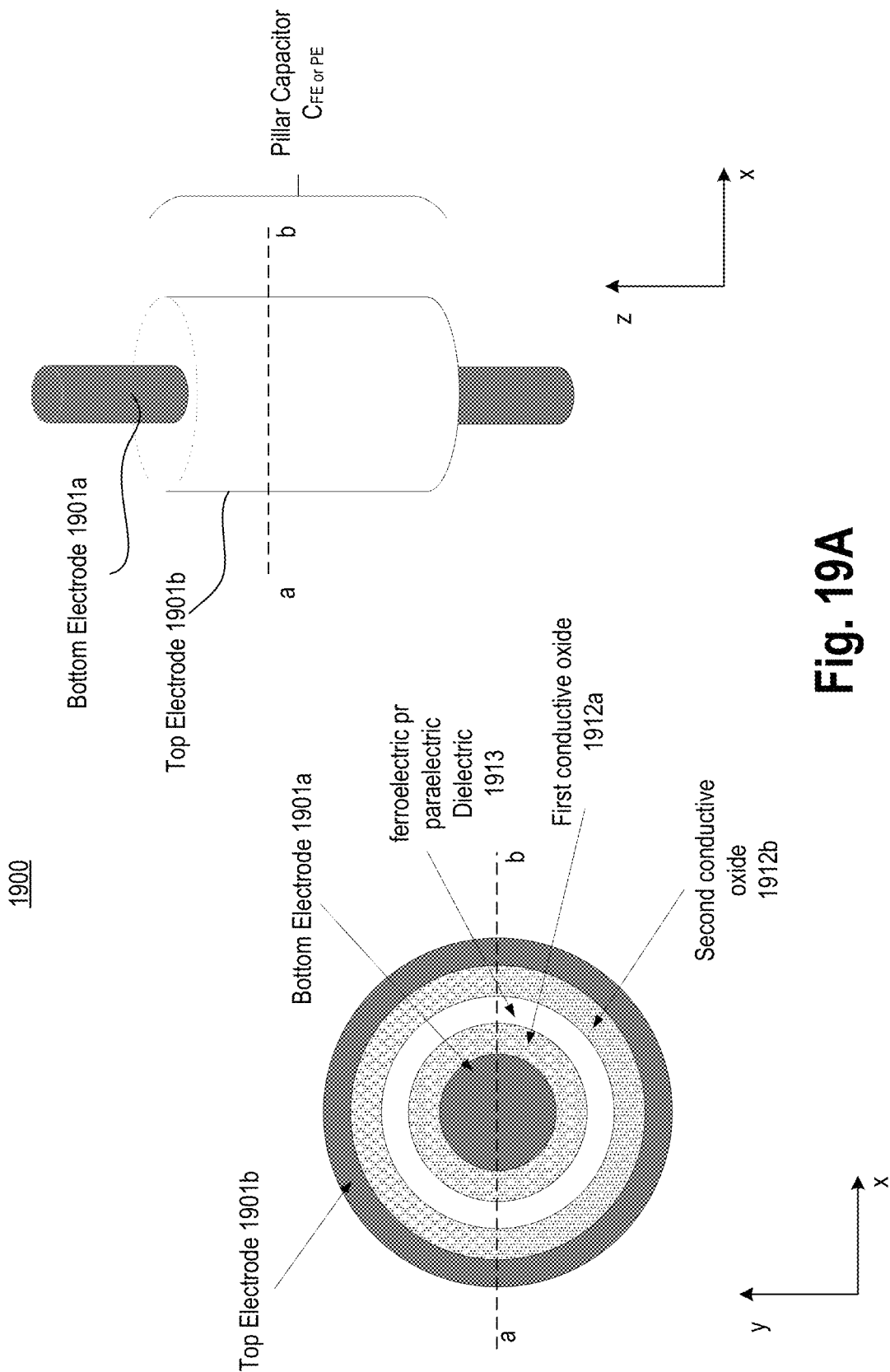
FIG. 19A illustrates a non-planar ferroelectric or paraelectric capacitor structure, in accordance with some embodiments.

FIG. 19A illustrates non-planar ferroelectric or paraelectric capacitor structure 1900, in accordance with some embodiments. In some embodiments, non-planar capacitor structure 1900 is rectangular in shape. Taking the cylindrical shaped case for example, in some embodiments, the layers of non-planar capacitor structure 1900 from the center going outwards include bottom electrode 1901a, first conductive oxide 1912a, ferroelectric dielectric material 1913, second conductive oxide 1912b, and top electrode 1901b. A cross-sectional view along the "ab" dashed line is illustrated in the middle of FIG. 19A. In some embodiments, conducting oxides are removed and the ferroelectric dielectric is directly connected to top electrode 1901b and bottom electrodes 1901a. In some embodiments, ferroelectric dielectric material 1913 can include any suitable dielectric, where the thickness of dielectric film is a range of 1 nm to 20 nm. In some embodiments, ferroelectric dielectric material 1913 include any one of the materials discussed herein for ferroelectrics.

In some embodiments, first conductive oxide 1912a is conformally deposited over bottom electrode 1901a. In some embodiments, dielectric material 1913 is conformally deposited over first conductive oxide 1912a. In some embodiments, second conductive oxide 1912b is conformally deposited over dielectric material 1913. In some embodiments, top electrode 1901b is conformally deposited over second conductive oxide 1912b. In some embodiments, bottom electrode 1901a is in the center while top electrode 1901b is on an outer circumference of non-planar capacitor structure 1900.

In some embodiments, material for bottom electrode 1901a may include one or more of: Cu, Al, Ag, Au, W, or Co, or their alloys. In some embodiments, material for first conductive oxide 1912a include: $IrO_2$, $RuO_2$, $PdO_2$, $OsO_2$, or $ReO_3$. In some examples, conductive oxides are of the form A2O3 (e.g., In2O3, Fe2O3) and ABO3 type, where 'A' is a rare earth element and B is Mn. In some embodiments, material for second conductive oxide 1912b may be same as the material for first conductive oxide 1912a. In some embodiments, material for top electrode 1901b may include one or more of: Cu, Al, Ag, Au, W, or Co, or their alloys.

In some embodiments, a first refractive inter-metallic layer (not shown) is formed between dielectric material 1913 and first conductive oxide 1912a. In some embodiments, a second refractive inter-metallic layer (not shown) is formed between dielectric capacitor material 1913 and second conductive oxide 1912b. In these cases, the first and second refractive inter-metallic layers are directly adjacent to their respective conductive oxide layers and to dielectric capacitor material 1913. In some embodiments, refractive inter-metallic maintains the capacitive properties of the dielectric capacitor material 1913. In some embodiments, refractive inter-metallic comprises Ti and Al (e.g., TiAl compound). In some embodiments, refractive inter-metallic comprises one or more of Ta, W, and/or Co.

For example, refractive inter-metallic includes a lattice of Ta, W, and Co. In some embodiments, refractive inter-metallic includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. The thicknesses of the layers of capacitor 1900 in the x-axis are in the range of 1 nm to 30 nm. In some embodiment, refractive inter-metallic layers are not used for non-planar capacitor structure 1900.

Figure 19B:
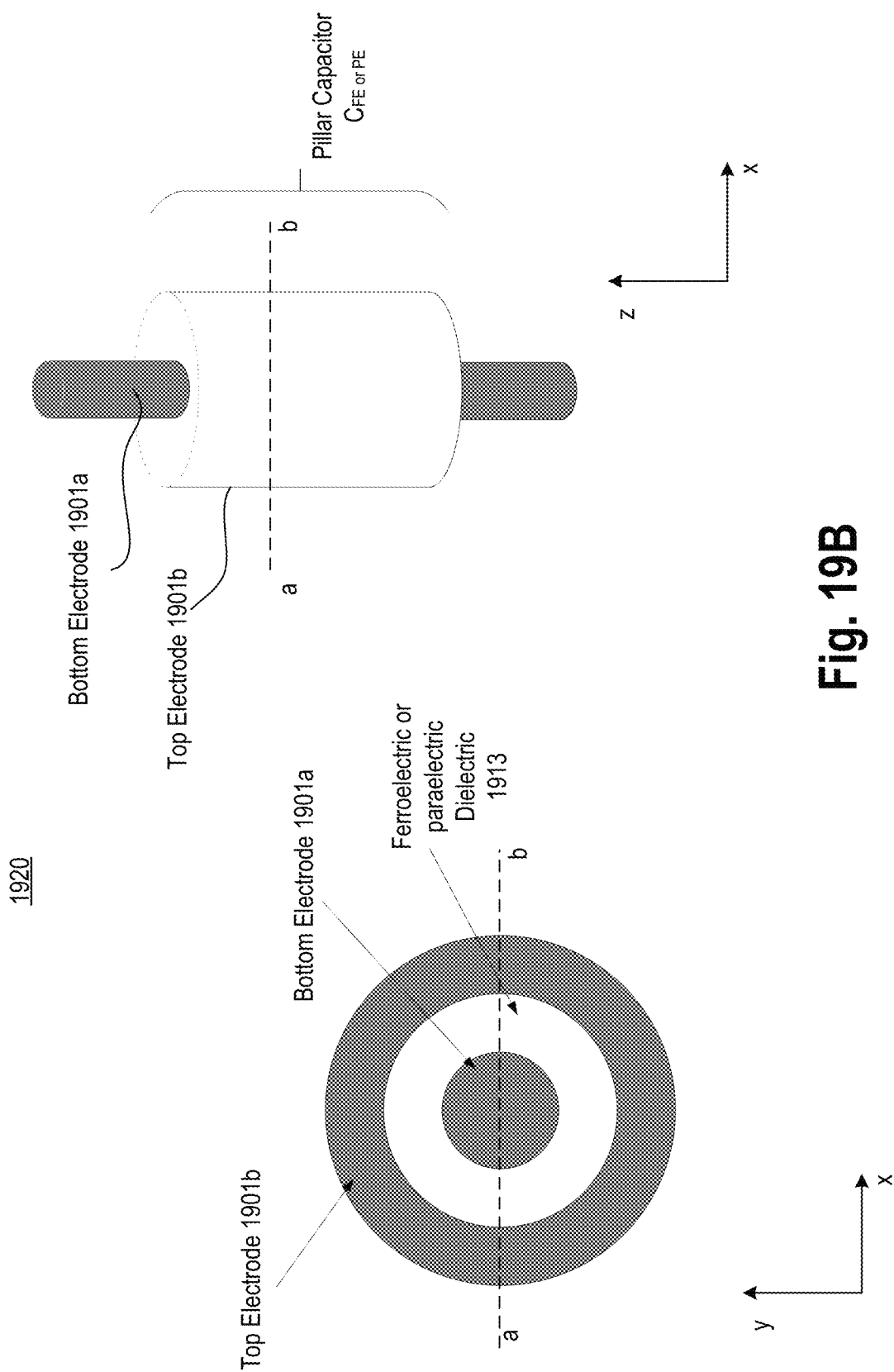
FIG. 19B illustrates a non-planar ferroelectric or paraelectric capacitor structure without conductive oxides, in accordance with some embodiments.

FIG. 19B illustrates non-planar ferroelectric or paraelectric capacitor structure 1920 without conductive oxides, in accordance with some embodiments. Compared to non-planar capacitor structure 1900, here first conductive oxide 1912a and second conductive oxide 1912b are removed and ferroelectric material 1913 is adjacent to top electrode 1901b and bottom electrode 1910a as shown.

Figure 20:
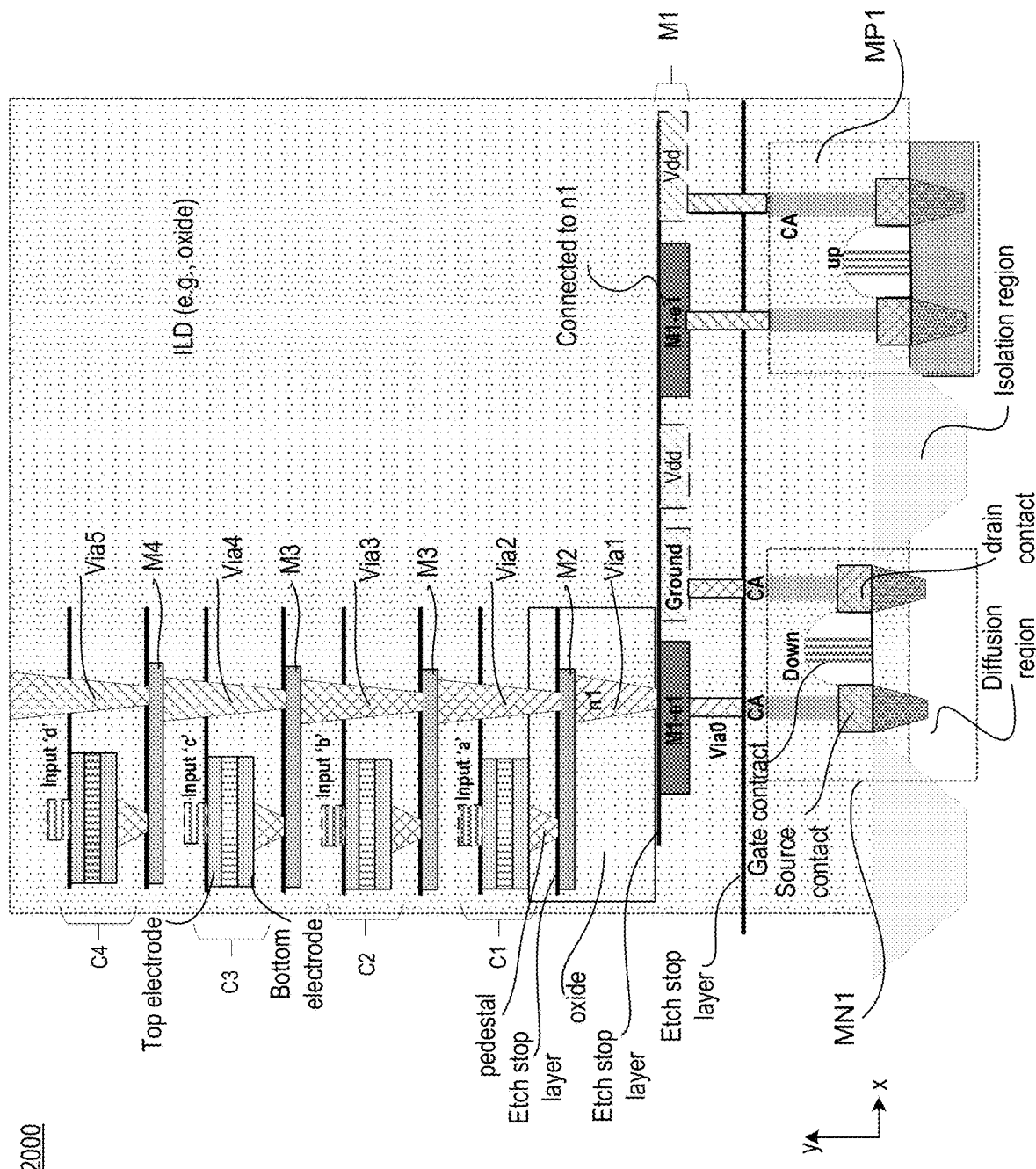
FIG. 20 illustrates a multi-input capacitive circuit with stacked planar ferroelectric or paraelectric capacitor structure, wherein the multi-input capacitive circuit includes a pull-up device and a pull-down device, in accordance with some embodiments.

FIG. 20 illustrates multi-input capacitive circuit 2000 with stacked planar ferroelectric or paraelectric capacitor structure, wherein the multi-input capacitive circuit includes a pull-up device and a pull-down device, in accordance with some embodiments. In this example, two transistors are shown, each controlled by its respective Up or Down controls on its gate terminal. The source and drain terminals of each transistor is coupled to respective contacts (CA). Etch stop layer is used in the fabrication of vias (via0) to connect the source or drain of the transistors to summing node n1 on metal-1 (M1) layer. Another etch stop layer is formed over M1 layer to fabricate vias (via1) to couple to respective M1 layers. In some embodiments, metal-2 (M2) is deposited over vias (via1). M2 layer is then polished. In some embodiments, the ferroelectric capacitor can be moved further up in the stack, where the capacitor level processing is done between different layers.

In some embodiments, oxide is deposited over the etch stop layer. Thereafter, dry, or wet etching is performed to form holes for pedestals. The holes are filled with metal and land on the respective M2 layers. Fabrication processes such as interlayer dielectric (ILD) oxide deposition followed by ILD etch (to form holes for the pedestals), deposition of metal into the holes, and subsequent polishing of the surface are used to prepare for post pedestal fabrication.

A number of fabrication processes of deposition, lithography, and etching takes place to form the stack of layers for the planar capacitor. In some embodiments, the ferroelectric dielectric capacitors are formed in a backend of the die. In some embodiments, deposition of ILD is followed by surface polish. In some embodiments, a metal layer is formed over top electrode of each capacitor to connect to a respective input. For example, metal layer over the top electrode of capacitor C1 is connected to input 'a'. Metal layer over the top electrode of capacitor C2 is connected to input 'b'. Metal layer over the top electrode of capacitor C3 is connected to input 'c'. Metal layer over the top electrode of capacitor C4 is connected to input 'd'. The metal layers coupled to the bottom electrodes of capacitors C1, C2, C3, and C4 are coupled to summing node n1 through respective vias.

In this case, after polishing the surface, ILD is deposited, in accordance with some embodiments. Thereafter, holes are etched through the ILD to expose the top electrodes of the capacitors, in accordance with some embodiments. The holes are then filled with metal, in accordance with some embodiments. Followed by filling the holes, the top surface is polished, in accordance with some embodiments. As such, the capacitors are connected to input electrode (e.g., input 'a', input 'b', input 'c', and input 'd') and summing node n1 (through the pedestals), in accordance with some embodiments.

In some embodiments, ILD is deposited over the polished surface. Holes for via are then etched to contact the M2 layer, in accordance with some embodiments. The holes are filled with metal to form vias (via2), in accordance with some embodiments. The top surface is then polished, in accordance with some embodiments. In some embodiments, process of depositing metal over the vias (via2), depositing ILD, etching holes to form pedestals for the next capacitors of the stack, forming the capacitors, and then forming vias that contact the M3 layer are repeated. This process is repeated 'n' times for forming 'n' capacitors in a stack for 'n' number of inputs, in accordance with some embodiments.

In some embodiments, the bottom electrode of each capacitor is allowed to directly contact with the metal below. For example, the pedestals that connect to the top and bottom electrodes are removed. In this embodiment, the height of the stacked capacitors is lowered, and the fabrication process is simplified because the extra steps for forming the pedestals are removed.

In some embodiments, pedestals or vias are formed for both the top and bottom electrodes of the planar capacitors. In this embodiment, the height of the stacked capacitors is raised, and the fabrication process adds an additional step of forming a top pedestal or via which contacts with respective input electrodes (e.g., input 'a', input 'b', input 'c', and input 'd').

Figure 21:
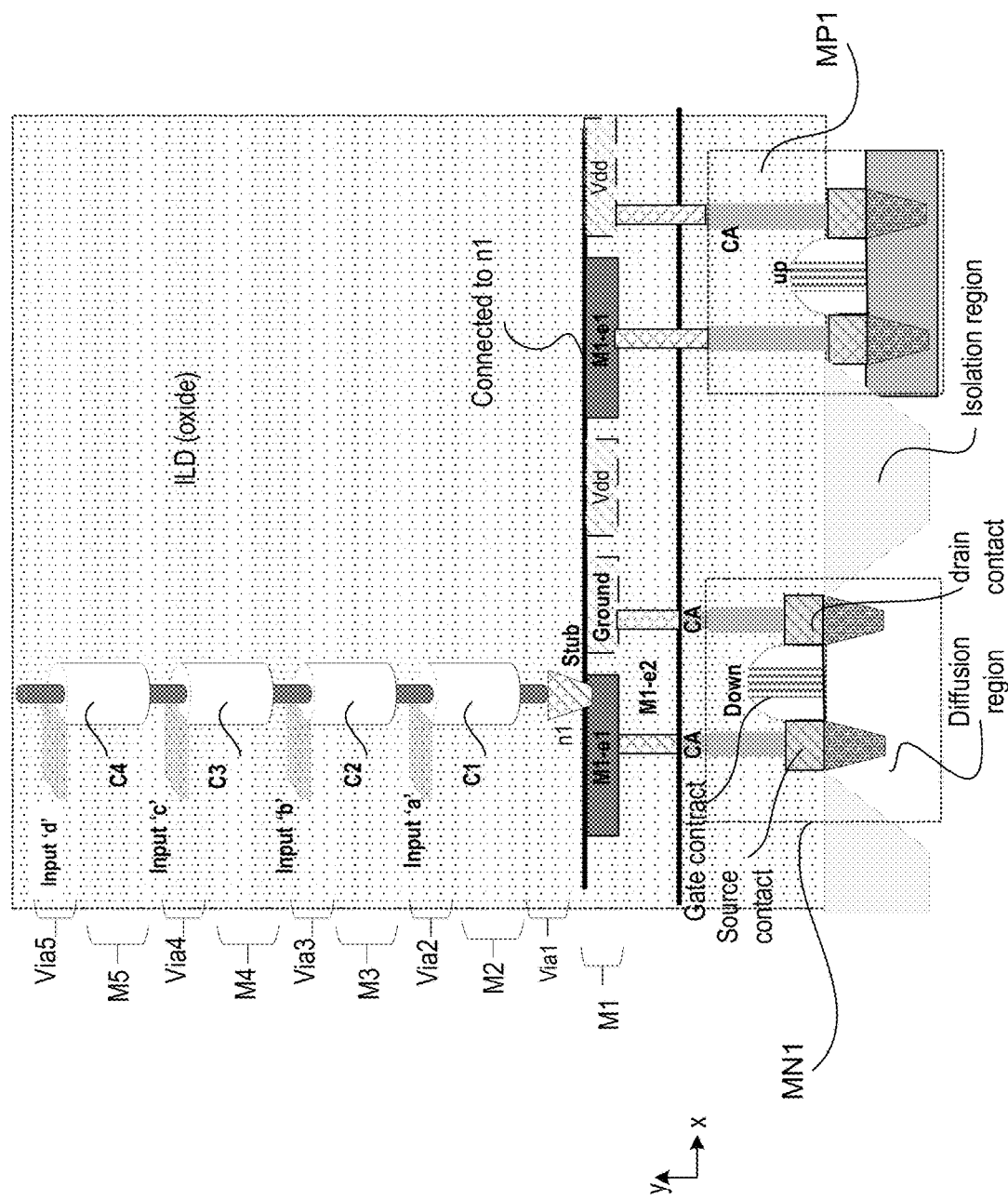
FIG. 21 illustrates a multi-input capacitive circuit with stacked non-planar ferroelectric or paraelectric capacitor structure wherein the multi-input capacitive circuit includes a pull-up device and a pull-down device, in accordance with some embodiments.

FIG. 21 illustrates multi-input capacitive circuit 2100 with stacked non-planar ferroelectric or paraelectric capacitor structure (e.g., structures of FIG. 18A or FIG. 18B), wherein the multi-input capacitive circuit includes a pull-down device and a pull-up device, in accordance with some embodiments. In this example four capacitors are stacked. In some embodiments, a column of shared metal passes through the center of the capacitors, where the shared metal is the summing node n1 which is coupled to the stub and then to the source or drain terminals of the pull-up (MP1) and pull-down (MN1) transistors. Top electrode of each of the capacitor is partially adjacent to a respective input electrode. For example, the top electrode of capacitor C1 is coupled to input electrode 'a', the top electrode of capacitor C2 is coupled to input electrode 'b', the top electrode of capacitor C3 is coupled to input electrode 'c', and the top electrode of capacitor C4 is coupled to input electrode 'd'. In this instance, the capacitors are formed between regions reserved for Via1 through Via5 (e.g., between M1 through M6 layers).

Figure 22:
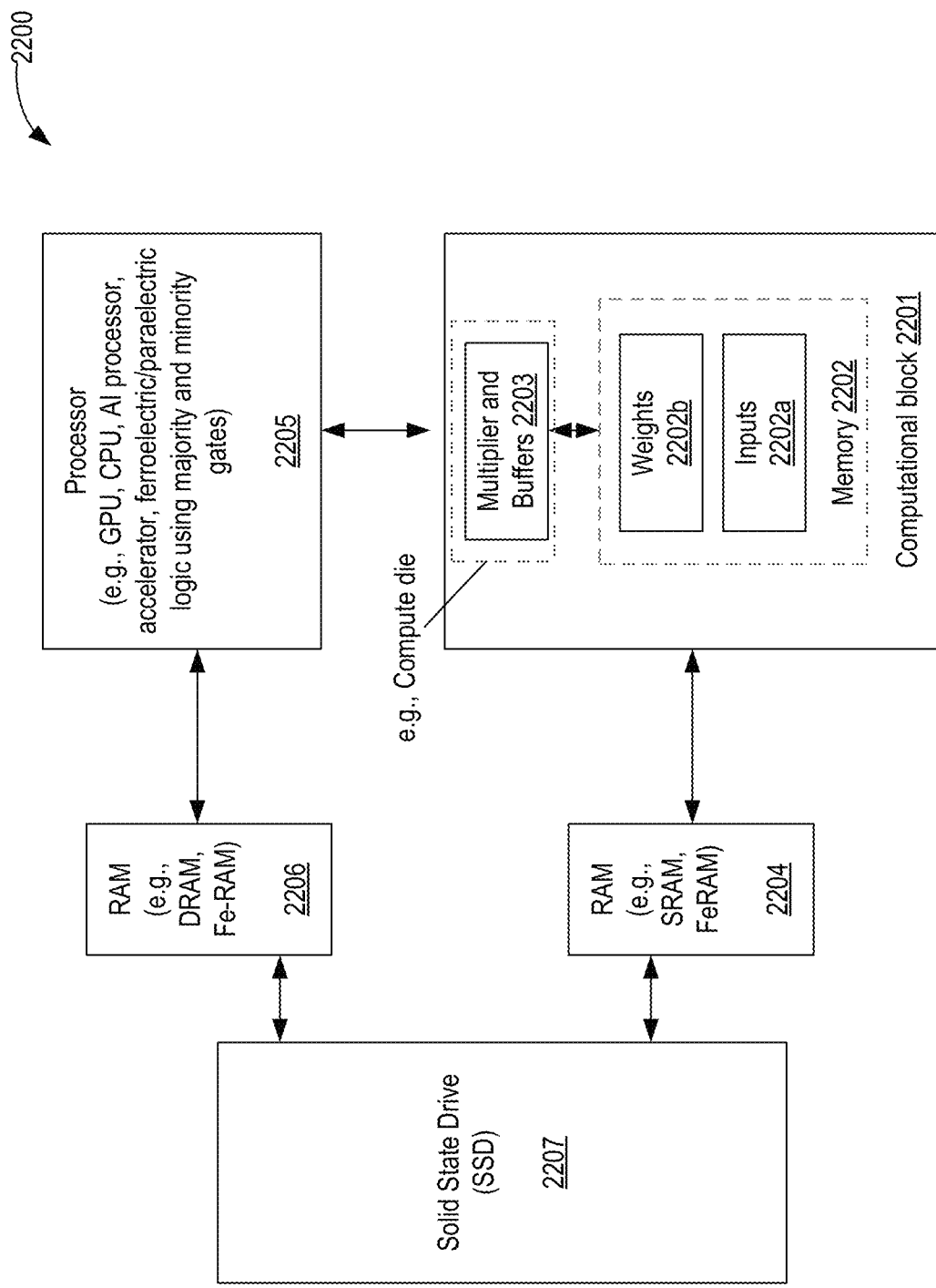
FIG. 22 illustrates a high-level architecture of an artificial intelligence (AI) machine comprising a compute die stacked with a memory die, wherein the compute die includes a c-element, completion tree, and/or validity tree with a multi-input capacitive circuit with configurable threshold, in accordance with some embodiments.

FIG. 22 illustrates a high-level architecture of an artificial intelligence (AI) machine 2200 comprising a compute die stacked with a memory die, wherein the compute die includes a c-element, completion tree, and/or validity tree with a multi-input capacitive circuit with configurable threshold, in accordance with some embodiments.

AI machine 2200 comprises computational block 2201 or processor having random-access memory (RAM) 2202 and computational logic 2203; first random-access memory 2204 (e.g., static RAM (SRAM), ferroelectric or paraelectric RAM (FeRAM), ferroelectric or paraelectric static random-access memory (FeSRAM)), main processor 2205, second random-access memory 2206 (dynamic RAM (DRAM), FeRAM), and solid-state memory or drive (SSD) 2207. In some embodiments, some, or all components of AI machine 2200 are packaged in a single package forming a system-on-chip (SoC). The SoC can be configured as a logic-on-logic configuration, which can be in a 3D configuration or a 2.5D configuration.

In some embodiments, computational block 2201 is packaged in a single package and then coupled to processor 2205 and memories 2204, 2206, and 2207 on a printed circuit board (PCB). In some embodiments, computational block 2201 is configured as a logic-on-logic configuration, which can be in a 3D configuration or a 2.5D configuration. In some embodiments, computational block 2201 comprises a special purpose compute die 2203 or microprocessor. For example, compute die 2203 is a compute chiplet that performs a function of an accelerator or inference. In some embodiments, memory 2202 is DRAM which forms a special memory/cache for the special purpose compute die 2203. The DRAM can be embedded DRAM (eDRAM) such as 1T1C (one transistor and one capacitor) based memories. In some embodiments, RAM 2202 is ferroelectric or paraelectric RAM (Fe-RAM).

In some embodiments, compute die 2203 is specialized for applications such as Artificial Intelligence, graph processing, and algorithms for data processing. In some embodiments, compute die 2203 further has logic computational blocks, for example, for multipliers and buffers, a special data memory block (e.g., buffers) comprising DRAM, FeRAM, or a combination of them. In some embodiments, RAM 2202 has weights and inputs stored to improve the computational efficiency. The interconnects between processor 2205 (also referred to as special purpose processor), first RAM 2204 and compute die 2203 are optimized for high bandwidth and low latency. The architecture of FIG. 22 allows efficient packaging to lower the energy, power, or cost and provides for ultra-high bandwidth between RAM 2202 and compute chiplet 2203 of computational block 2201.

In some embodiments, RAM 2202 is partitioned to store input data (or data to be processed) 2202a and weight factors 2202b. In some embodiments, input data 2202a is stored in a separate memory (e.g., a separate memory die) and weight factors 2202b are stored in a separate memory (e.g., separate memory die).

In some embodiments, computational logic or compute chiplet 2203 comprises matrix multiplier, adder, concatenation logic, buffers, and combinational logic. In various embodiments, compute chiplet 2203 performs multiplication operation on inputs 2202a and weights 2202b. In some embodiments, weights 2202b are fixed weights. For example, processor 2205 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 2202. In various embodiments, the input data that is to be analyzed using a trained model, is processed by computational block 2201 with computed weights 2202b to generate an output (e.g., a classification result).

In some embodiments, first RAM 2204 is ferroelectric or paraelectric based SRAM. For example, a six transistor (6T) SRAM bit-cells having ferroelectric or paraelectric transistors are used to implement a non-volatile FeSRAM. In some embodiments, SSD 2207 comprises NAND flash cells. In some embodiments, SSD 2207 comprises NOR flash cells. In some embodiments, SSD 2207 comprises multi-threshold NAND flash cells.

In various embodiments, the non-volatility of FeRAM is used to introduce new features such as security, functional safety, and faster reboot time of AI machine 2200. The non-volatile FeRAM is a low power RAM that provides fast access to data and weights. FeRAM 2204 can also serve as a fast storage for computational block 2201 (which can be an inference die or an accelerator), which typically has low capacity and fast access requirements.

In various embodiments, FeRAM (FeDRAM or FeSRAM) includes ferroelectric or paraelectric material. The ferroelectric or paraelectric material may be in a transistor gate stack or in a capacitor of the memory. The ferroelectric material can be any suitable low voltage FE material discussed with reference to various embodiments. While embodiments here are described with reference to ferroelectric material, the embodiments are applicable to any of the nonlinear polar materials described herein.

Figure 23:
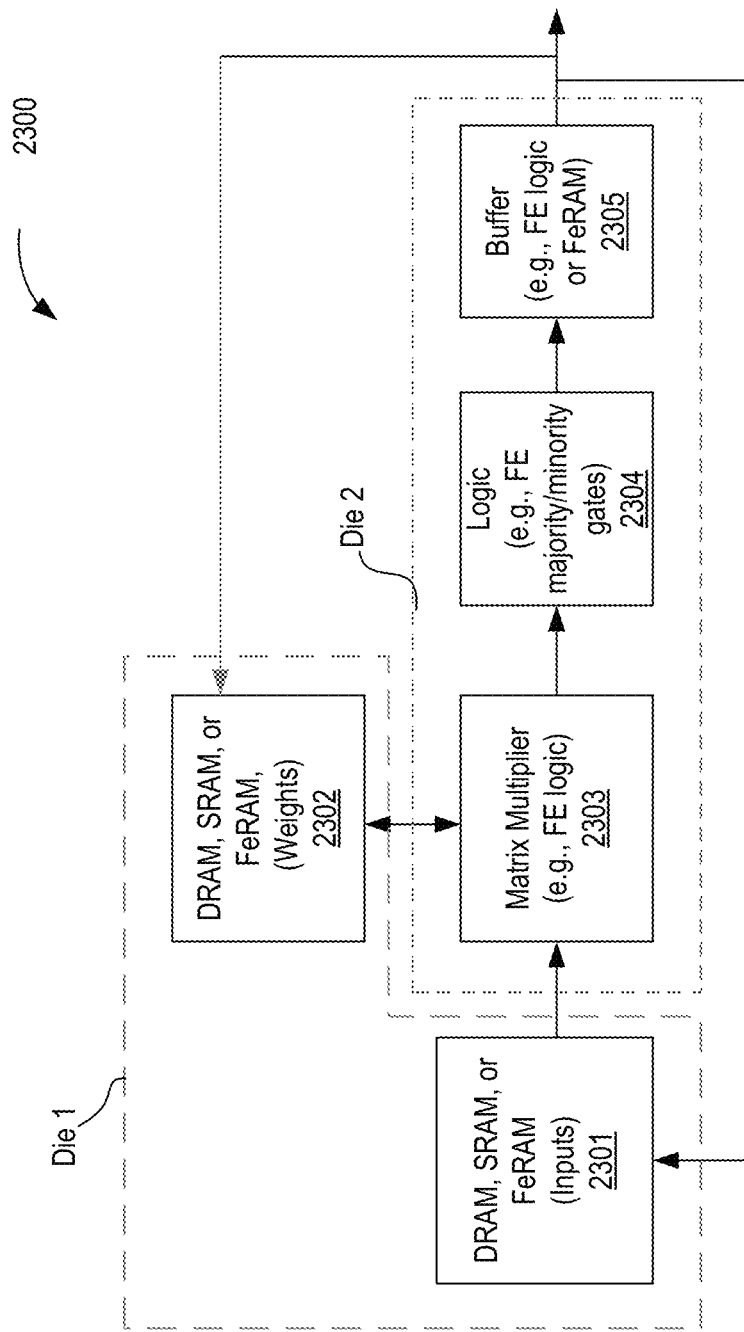
FIG. 23 illustrates an architecture of a computational block comprising a compute die stacked with a memory die, wherein the compute die includes a c-element, completion tree, and/or validity tree with a multi-input capacitive circuit with configurable threshold, in accordance with some embodiments.

FIG. 23 illustrates an architecture of a computational block 2300 comprising a compute die stacked with a memory die, wherein the compute die includes a c-element, completion tree, and/or validity tree with a multi-input capacitive circuit with configurable threshold, in accordance with some embodiments. The architecture of FIG. 23 illustrates an architecture for a special purpose compute die where RAM memory buffers for inputs and weights are split on die-1 and logic and optional memory buffers are split on die-2.

In some embodiments, memory die (e.g., Die 1) is positioned below a compute die (e.g., Die 2) such that a heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first die 2301 to store input data and a second die 2302 to store weight factors. In some embodiments, the memory die is a single die that is partitioned such that first partition 2301 of the memory die is used to store input data and second partition 2302 of the memory die is used to store weights. In some embodiments, the memory die comprises DRAM. In some embodiments, the memory die comprises FE-SRAM or FE-DRAM. In some embodiments, the memory die comprises MRAM. In some embodiments, the memory die comprises SRAM. For example, memory partitions 2301 and 2302, or memory dies 2301 and 2302 include one or more of: DRAM, FE-SRAM, FE-DRAM, SRAM, and/or MRAM. In some embodiments, the input data stored in memory partition or die 2301 is the data to be analyzed by a trained model with fixed weights stored in memory partition or die 2302.

In some embodiments, the compute die comprises ferroelectric or paraelectric logic (e.g., majority, minority, and/or threshold gates) to implement matrix multiplier 2303, logic 2304, and temporary buffer 2305. Matrix multiplier 2303 performs multiplication operation on input data 'X' and weights 'W' to generate an output 'Y'. This output may be further processed by logic 2304. In some embodiments, logic 2304 performs a threshold operation, pooling and drop out operations, and/or concatenation operations to complete the AI logic primitive functions.

In some embodiments, the output of logic 2304 (e.g., processed output 'Y') is temporarily stored in buffer 2305. In some embodiments, buffer 2305 is memory such as one or more of: DRAM, Fe-SRAM, Fe-DRAM, MRAM, resistive RAM (Re-RAM) and/or SRAM. In some embodiments, buffer 2305 is part of the memory die (e.g., Die 1). In some embodiments, buffer 2305 performs the function of a re-timer. In some embodiments, the output of buffer 2305 (e.g., processed output 'Y') is used to modify the weights in memory partition or die 2302. In one such embodiment, computational block 2300 not only operates as an inference circuitry, but also as a training circuitry to train a model. In some embodiments, matrix multiplier 2303 includes an array of multiplier cells, wherein the DRAMs 2301 and 2302 include arrays of memory bit-cells, respectively, wherein each multiplier cell is coupled to a corresponding memory bit-cell of DRAM 2301 and/or DRAM 2302. In some embodiments, computational block 2300 comprises an interconnect fabric coupled to the array of multiplier cells such that each multiplier cell is coupled to the interconnect fabric.

Architecture 2300 provides reduced memory access for the compute die (e.g., die 2) by providing data locality for weights, inputs, and outputs. In one example, data from and to the AI computational blocks (e.g., matrix multiplier 2303) is locally processed within a same packaging unit. Architecture 2300 also segregates the memory and logic operations onto a memory die (e.g., Die 1) and a logic die (e.g., Die 2), respectively, allowing for optimized AI processing. Desegregated dies allow for improved yield of the dies. A high-capacity memory process for Die 1 allows reduction of power of the external interconnects to memory, reduces cost of integration, and results in a smaller footprint.

Figure 24:
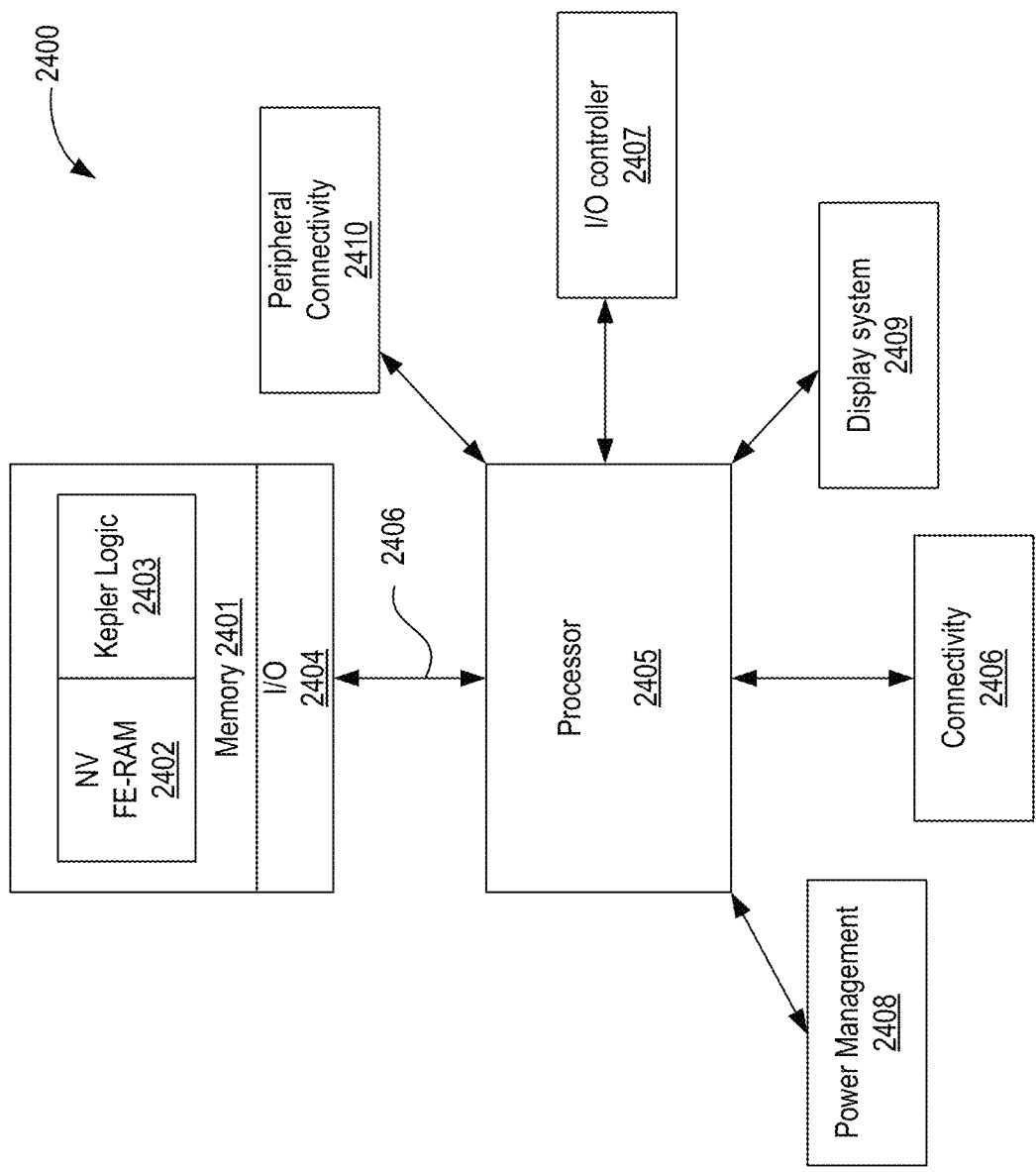
FIG. 24 illustrates a system-on-chip (SOC) that uses a c-element, completion tree, and/or validity tree with a multi-input capacitive circuit with configurable threshold, in accordance with some embodiments.

FIG. 24 illustrates a system-on-chip (SOC) 2400 that uses a c-element, completion tree, and/or validity tree with a multi-input capacitive circuit with configurable threshold, in accordance with some embodiments. SoC 2400 comprises memory 2401 having static random-access memory (SRAM) or FE based random-access memory FE-RAM, or any other suitable memory. The memory can be non-volatile (NV) or volatile memory. Memory 2401 may also comprise logic 2403 to control memory 2402. For example, write and read drivers are part of logic 2403. These drivers and other logic are implemented using the majority or threshold gates of various embodiments. The logic can comprise majority or threshold gates and traditional logic (e.g., CMOS based NAND, NOR etc.).

SoC further comprises a memory I/O (input-output) interface 2404. The interface may be a double-data rate (DDR) compliant interface or any other suitable interface to communicate with a processor. Processor 2405 of SoC 2400 can be a single core or multiple core processor. Processor 2405 can be a general-purpose processor (CPU), a digital signal processor (DSP), or an Application Specific Integrated Circuit (ASIC) processor. In some embodiments, processor 2405 is an artificial intelligence (AI) processor (e.g., a dedicated AI processor, a graphics processor configured as an AI processor). In various embodiments, processor 2405 executes instructions that are stored in memory 2401.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, the AI processor has reduced latency of computing the training model and using the training model, which reduces the power consumption of such AI processor systems.

Processor 2405 may be coupled to a number of other chiplets that can be on the same die as SoC 2400 or on separate dies. These chiplets include connectivity circuitry 2406, I/O controller 2407, power management 2408, and display system 2409, and peripheral connectivity 2406.

Connectivity 2406 represents hardware devices and software components for communicating with other devices. Connectivity 2406 may support various connectivity circuitries and standards. For example, connectivity 2406 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 2406 may support non-cellular standards such as WiFi.

I/O controller 2407 represents hardware devices and software components related to interaction with a user. I/O controller 2407 is operable to manage hardware that is part of an audio subsystem and/or display subsystem. For example, input through a microphone or other audio device can provide input or commands for one or more applications or functions of SoC 2400. In some embodiments, I/O controller 2407 illustrates a connection point for additional devices that connect to SoC 2400 through which a user might interact with the system. For example, devices that can be attached to the SoC 2400 might include microphone devices, speaker or stereo systems, video systems or other display devices, keyboard or keypad devices, or other I/O devices for use with specific applications such as card readers or other devices.

Power management 2408 represents hardware or software that performs power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 2408 may accordingly put such logic into low power state without the worry of losing data. Power management may select a power state according to Advanced Configuration and Power Interface (ACPI) specification for one or all components of SoC 2400.

Display system 2409 represents hardware (e.g., display devices) and software (e.g., drivers) components that provide a visual and/or tactile display for a user to interact with the processor 2405. In some embodiments, display system 2409 includes a touch screen (or touch pad) device that provides both output and input to a user. Display system 2409 may include a display interface, which includes the particular screen or hardware device used to provide a display to a user. In some embodiments, the display interface includes logic separate from processor 2405 to perform at least some processing related to the display.

Peripheral connectivity 2410 may represent hardware devices and/or software devices for connecting to peripheral devices such as printers, chargers, cameras, etc. In some embodiments, peripheral connectivity 2410 may support communication protocols, e.g., PCIe (Peripheral Component Interconnect Express), USB (Universal Serial Bus), Thunderbolt, High-Definition Multimedia Interface (HDMI), Firewire, etc.

In various embodiments, SoC 2400 includes a coherent cache or memory-side buffer chiplet (not shown) which include ferroelectric or paraelectric memory. The coherent cache or memory-side buffer chiplet can be coupled to processor 2405 and/or memory 2401 according to the various embodiments described herein (e.g., via silicon bridge or vertical stacking).

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth to describe example embodiments of the disclosure, it should be apparent to one skilled in the art that the disclosure can be practiced without, or with variation of, these specific details. The description is thus to be regarded as illustrative instead of limiting.

The structures of various embodiments described herein can also be described as method of forming those structures, and method of operation of these structures.

Following examples are provided that illustrate the various embodiments. The examples can be combined with other examples. As such, various embodiments can be combined with other embodiments without changing the scope of the invention.

Example 1: An apparatus comprising: a first input; a second input; a third input; a control; a circuitry to adjust logic levels of the first input, the second input, and the control in a first operation mode; and a gate to receive the first input, the second input, and the third input, wherein the third input is coupled to an output of the gate, wherein the gate comprises: a first capacitor having a first terminal coupled to the first input, and a second terminal coupled to a summing node; a second capacitor having a third terminal coupled to the second input, and a fourth terminal coupled to the summing node; a third capacitor having a fifth terminal coupled to the third input, and a sixth terminal coupled to the summing node; and a device coupled to the summing node and a supply rail, wherein the device is controllable by the control, wherein the circuitry is to adjust a function of the gate in the first operation mode, and wherein the circuitry is to allow the gate to operate in accordance with the function in a second operation mode.

Example 2: The apparatus of example 1, wherein the function is a majority function.

Example 3: The apparatus of example 1, wherein the first capacitor, the second capacitor, and the third capacitor comprise linear dielectric material.

Example 4: The apparatus of example 3, wherein the linear dielectric material includes one of: SiO2, Al2O3, Li2O, HfSiO4, Sc2O3, SrO, HfO2, ZrO2, Y2O3, Ta2O5, BaO, WO3, MoO3, or TiO2.

Example 5: The apparatus of example 1, wherein the device is a pull-up device, wherein the circuitry is to set logic levels of the first input, the second input, and the third input to logic high, and the control to enable or turn on the pull-up device in the first operation mode to adjust a threshold of the gate to 2.

Example 6: The apparatus of example 1, wherein the first capacitor, the second capacitor, and the third capacitor include: a linear dielectric material includes one or more of: Si, Al, Li, Hf, Sc, Sr, Zr, Y, Ta, Ba, W, Mo, or Ti; and a top electrode and a bottom electrode, wherein the linear dielectric material is between the top electrode and the bottom electrode, wherein the top electrode or the bottom electrode include one or more of: Cu, Al, Ag, Au, W, or Co.

Example 7: The apparatus of example 1, wherein the first capacitor, the second capacitor, and the third capacitor include paraelectric material which includes one of: SrTiO3, Ba(x)Sr(y)TiO3 (where x is −0.5, and y is 0.95), HfZrO2, Hf—Si—O, BaTiO3, La-substituted PbTiO3, lead zirconate titanate, or PMN-PT (lead magnesium niobate-lead titanate) based relaxor ferroelectrics.

Example 8: The apparatus of example 1, wherein the first capacitor, the second capacitor, and the third capacitor include ferroelectric material.

Example 9: The apparatus of example 1, wherein the device is a first device, wherein the supply rail is a power supply rail, wherein the control is a first control, wherein the gate comprises a second device coupled to the summing node and a ground supply rail, wherein the second device is controllable by a second control.

Example 10: The apparatus of example 9, wherein, in the first operation mode, the circuitry is to adjust a threshold of the gate to 2 after the second device is enabled first, and then the second device is disabled, and then the first device is enabled, and the first input is set to logic 1, the second input is set to logic 1, and the third input is set to logic 0.

Example 11: The apparatus of example 9, wherein, in the first operation mode, the circuitry is to adjust a threshold of the gate to 2 after the first device is enabled first, and then the first device is disabled, and then the second device is enabled, and the first input is set to logic 1, the second input is set to logic 0, and the third input is set to logic 0.

Example 12: The apparatus of example 9, wherein the first capacitor, the second capacitor, and the third capacitor include ferroelectric material, wherein the ferroelectric material includes one or more of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; a relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); a perovskite which includes one of: BaTiO3, PbTiO3, KNbO3, or NaTaO3; a hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1−x Ex Oy, where E can be Al, Ca, Ce, Dy, er, Gd, Ge, La, Sc, Si, Sr, Sn, or Y; Al(1−x)Sc(x)N, Ga(1−x)Sc(x)N, Al(1−x)Y(x)N or Al(1−x−y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or an improper ferroelectric which includes one of: [PTO/STO]n or [LAO/STO] n, where 'n' is between 1 to 100.

Example 13: An apparatus comprising: a first input; a second input; a third input; a fourth input; a fifth input; and a gate to provide an output which is a consensus of the first input, the second input, and the third input, wherein the gate receives the fourth input and the fifth input, wherein the output is coupled to the fourth input and the fifth input, wherein the gate has an adjustable threshold.

Example 14: The apparatus of example 13, wherein the output is a logic high when the first input, the second input, and the third input are logic high, wherein the output is a logic low when the first input, the second input, and the third input are logic low, wherein the output retains its logic state when at least one of the first input, the second input, or the third input is a logic 1 and when the at least one of the first input, the second input, or the third input is a logic 0.

Example 15: The apparatus of example 13, wherein the gate comprises: a first capacitor having a first terminal coupled to the first input, and a second terminal coupled to a summing node; a second capacitor having a third terminal coupled to the second input, and a fourth terminal coupled to the summing node; a third capacitor having a fifth terminal coupled to the third input, and a sixth terminal coupled to the summing node; a fourth capacitor having a seventh terminal coupled to the fourth input and the fifth input, and an eighth terminal coupled to the summing node; a fifth capacitor having a ninth terminal coupled to the fourth input and the fifth input, and a tenth terminal coupled to the summing node; and a device coupled to the summing node and a supply rail, wherein the device is controllable by a control.

Example 16: The apparatus of example 13 comprises a circuitry to adjust a function of the gate by controlling the adjustable threshold in a first operation mode, and wherein the circuitry is to allow the gate to operate in accordance with the function in a second operation mode.

Example 17: A system comprising: a memory to store one or more instructions; a processor circuitry to execute the one or more instructions; and a communication device to allow the processor circuitry to communicate with another device, wherein the processor circuitry includes a consensus circuitry which comprises an apparatus according to any one of examples 1 to 12 or examples 13 to 16.

Example 1a: An apparatus comprising: a first consensus circuitry to determine a first consensus between a first input and a second input, the first consensus circuitry to generate a first output which is representative of the first consensus; a second consensus circuitry to determine a second consensus between a third input and a fourth input, the second consensus circuitry to generate a second output which is representative of the second consensus; and a third consensus circuitry coupled to the first consensus circuitry and the second consensus circuitry, wherein the third consensus circuitry is to determine a third consensus between the first output and the second output, the third consensus circuitry to generate a third output which is representative of the third consensus, wherein the first consensus circuitry, the second consensus circuitry, and the third consensus circuitry comprises a first gate with a first adjustable threshold, a second gate with a second adjustable threshold, and a third gate with a third adjustable threshold, respectively.

Example 2a: The apparatus of example 1a comprising: a fourth consensus circuitry to determine a fourth consensus between a fifth input and an sixth input, the fourth consensus circuitry to generate a fourth output which is representative of the fourth consensus; a fifth consensus circuitry to determine a fifth consensus between a seventh input and an eighth input, the fifth consensus circuitry to generate a fifth output which is representative of the fifth consensus; and a sixth consensus circuitry coupled to the fourth consensus circuitry and the fifth consensus circuitry, wherein the sixth consensus circuitry is to determine a sixth consensus between the fourth output and the fifth output, the sixth consensus circuitry to generate a sixth output which is representative of the sixth consensus, wherein the fourth consensus circuitry, the fifth consensus circuitry, and the sixth consensus circuitry comprises a fourth gate with a fourth adjustable threshold, a fifth gate with a fifth adjustable threshold, and a sixth gate with a sixth adjustable threshold, respectively.

Example 3a: The apparatus of example 2a comprising seventh consensus circuitry coupled to the third consensus circuitry and the sixth consensus circuitry, wherein the seventh consensus circuitry is to determine a seventh consensus between the third output and the sixth output, the seventh consensus circuitry to generate a seventh output representative of the seventh consensus.

Example 4a: The apparatus of example 3a, wherein the seventh consensus indicates a consensus of the first input, the second input, the third input, the fourth input, the fifth input, the sixth input, the seventh input, and the eighth input.

Example 5a: The apparatus of example 3a, wherein the seventh consensus circuitry comprises a seventh gate with a seventh adjustable threshold.

Example 6a: The apparatus of example 1a, wherein the first gate comprises: a first input node to receive the first input; a second input node to receive the second input; a third input node; a control; a circuitry to adjust logic levels of the first input, the second input, and the control in a first operation mode; and a multi-input gate to receive the first input, the second input, and the third input, wherein and the third input node is coupled to an output of the multi-input gate, wherein the multi-input gate comprises: a first capacitor having a first terminal coupled to the first input node, and a second terminal coupled to a summing node; a second capacitor having a third terminal coupled to the second input node, and a fourth terminal coupled to the summing node; a third capacitor having a fifth terminal coupled to the third input node, and a sixth terminal coupled to the summing node; and a device coupled to the summing node and a supply rail, wherein the device is controllable by the control, wherein the circuitry is to adjust a function of the multi-input gate in the first operation mode, and wherein the circuitry is to allow the multi-input gate to operate in accordance with the function in a second operation mode.

Example 7a: The apparatus of example 6a, wherein the function is a majority function.

Example 8a: The apparatus of example 6a, wherein the first capacitor, the second capacitor, and the third capacitor comprise linear dielectric material.

Example 9a: The apparatus of example 8a, wherein the linear dielectric material includes one of: $SiO_2$, $Al_2O_3$, $Li_2O$, $HfSiO_4$, $Sc_2O_3$, $SrO$, $HfO_2$, $ZrO_2$, $Y_2O_3$, $Ta_2O_5$, $BaO$, $WO_3$, $MoO_3$, or $TiO_2$.

Example 10a: The apparatus of example 6a, wherein the device is a pull-up device, wherein the circuitry is to set logic levels of the first input, the second input, and the third input to logic high, and the control to enable or turn on the pull-up device in the first operation mode to adjust a threshold of the multi-input gate to 2.

Example 11a: The apparatus of example 6a, wherein the first capacitor, the second capacitor, and the third capacitor include: a linear dielectric material includes one or more of: Si, Al, Li, Hf, Sc, Sr, Zr, Y, Ta, Ba, W, Mo, or Ti; and a top electrode and a bottom electrode, wherein the linear dielectric material is between the top electrode and the bottom electrode, wherein the top electrode or the bottom electrode include one or more of: Cu, Al, Ag, Au, W, or Co.

Example 12a: The apparatus of example 6a, wherein the first capacitor, the second capacitor, and the third capacitor include paraelectric material which includes one of: $SrTiO_3$, $Ba(x)Sr(y)TiO_3$ (where x is −0.5, and y is 0.95), $HfZrO_2$, Hf—Si—O, $BaTiO_3$, La-substituted $PbTiO_3$, lead zirconate titanate, or PMN-PT (lead magnesium niobate-lead titanate) based relaxor ferroelectrics.

Example 13a: The apparatus of example 6, wherein the first capacitor, the second capacitor, and the third capacitor include ferroelectric material.

Example 14a: The apparatus of example 6a, wherein the device is a first device, wherein the supply rail is a power supply rail, wherein the control is a first control, wherein the multi-input gate comprises a second device coupled to the summing node and a ground supply rail, wherein the second device is controllable by a second control.

Example 15a: The apparatus of example 14a, wherein, in the first operation mode, the circuitry is to adjust a threshold of the multi-input gate to 2 after the second device is enabled first, and then the second device is disabled, and then the first device is enabled, and the first input is set to logic 1, the second input is set to logic 1, and the third input is set to logic 0.

Example 16a: The apparatus of example 14a, wherein, in the first operation mode, the circuitry is to adjust a threshold of the multi-input gate to 2 after the first device is enabled first, and then the first device is disabled, and then the second device is enabled, and the first input is set to logic 1, the second input is set to logic 0, and the third input is set to logic 0.

Example 17a: The apparatus of example 14a, wherein the first capacitor, the second capacitor, and the third capacitor include ferroelectric material, wherein the ferroelectric material according to the ferroelectric materials discussed herein.

Example 18a: An apparatus comprising: an m-input consensus circuitry comprising a first plurality of consensus circuitries coupled to generate a first output indicative of a first consensus of m number of inputs; an n-input consensus circuitry comprising a second plurality of consensus circuitries coupled to generate a second output indicative of a second consensus of n number of inputs; and a 2-input consensus circuitry coupled to the m-input consensus circuitry and the n-input consensus circuitry, wherein the 2-input consensus circuitry is to generate a third output, wherein the m-input consensus circuitry, the n-input consensus circuitry, and the 2-input consensus circuitry comprise gates with adjustable threshold.

Example 19a: The apparatus of example 18a, wherein the gates with adjustable threshold are configured as majority or minority gates.

Example 20a: A system comprising: a memory to store one or more instructions; a processor circuitry to execute the one or more instructions; and a communication device to allow the processor circuitry to communicate with another device, wherein the processor circuitry includes a completion tree which comprises an apparatus according to any one of examples 1a to 17a or examples 18a to 19a.

Example 1b: An apparatus comprising: a first OR gate to generate a first output which is indicative of a first OR function between a first input and a second input; a second OR gate to generate a second output which is indicative of a second OR function between a third input and a fourth input; and a first consensus circuitry to determine a first consensus between the first output and the second output, the first consensus circuitry to generate a first consensus output which is representative of the first consensus, wherein the first consensus circuitry comprises a first gate with a first adjustable threshold.

Example 2b: The apparatus of example 1b further comprising: a third OR gate to generate a third output which is indicative of a third OR function between a fifth input and a sixth input; a fourth OR gate to generate a fourth output which is indicative of a fourth OR function between a seventh input and an eighth input; and a second consensus circuitry to determine a second consensus between the third output and the fourth output, the second consensus circuitry to generate a second consensus output which is representative of the second consensus, wherein the second consensus circuitry comprises a second gate with a second adjustable threshold.

Example 3b: The apparatus of example 2b further comprising a third consensus circuitry coupled to the first consensus circuitry and the second consensus circuitry, wherein the third consensus circuitry is to determine a third consensus between the first consensus output and the second consensus output, the third consensus circuitry to generate a third consensus output which is representative of the third consensus.

Example 4b: The apparatus of example 3b, wherein the third consensus circuitry comprises a third gate with a third adjustable threshold.

Example 5b: The apparatus of example 3b, wherein the third consensus output indicates a valid state or a neutral state based on logic values of the first input, the second input, the third input, the fourth input, the fifth input, the sixth input, the seventh input, and the eighth input.

Example 6b: The apparatus of example 1b, wherein the first OR gate comprises a first threshold gate with a threshold which is adjusted to function the first threshold gate as an OR gate.

Example 7b: The apparatus of example 6b, wherein the threshold is adjusted to 1.

Example 8b: The apparatus of example 1b, wherein the first consensus circuitry comprises: a first input node to receive the first input; a second input node to receive the second input; a third input node; a control; a conditioning circuitry to adjust logic levels of the first input, the second input, and the control in a first operation mode; and a multi-input gate to receive the first input, the second input, and the third input, wherein and the third input node is coupled to an output of the multi-input gate, wherein the multi-input gate comprises: a first capacitor having a first terminal coupled to the first input node, and a second terminal coupled to a summing node; a second capacitor having a third terminal coupled to the second input node, and a fourth terminal coupled to the summing node; a third capacitor having a fifth terminal coupled to the third input node, and a sixth terminal coupled to the summing node; and a device coupled to the summing node and a supply rail, wherein the device is controllable by the control, wherein the conditioning circuitry is to adjust a function of the multi-input gate in the first operation mode, and wherein the conditioning circuitry is to allow the multi-input gate to operate in accordance with the function in a second operation mode.

Example 9b: The apparatus of example 8b, wherein the function is a majority function.

Example 10b: The apparatus of example 8b, wherein the first capacitor, the second capacitor, and the third capacitor comprise linear dielectric material, and wherein the linear dielectric material includes one of: $SiO_2$, $Al_2O_3$, $Li_2O$, $HfSiO_4$, $Sc_2O_3$, $SrO$, $HfO_2$, $ZrO_2$, $Y_2O_3$, $Ta_2O_5$, $BaO$, $WO_3$, $MoO_3$, or $TiO_2$.

Example 11b: The apparatus of example 8b, wherein the device is a pull-up device, wherein the conditioning circuitry is to set logic levels of the first input, the second input, and the third input to logic high, and the control to enable or turn on the pull-up device in the first operation mode to adjust a threshold of the multi-input gate to 2.

Example 12b: The apparatus of example 8b, wherein the first capacitor, the second capacitor, and the third capacitor include: a linear dielectric material includes one or more of: Si, Al, Li, Hf, Sc, Sr, Zr, Y, Ta, Ba, W, Mo, or Ti; and a top electrode and a bottom electrode, wherein the linear dielectric material is between the top electrode and the bottom electrode, wherein the top electrode or the bottom electrode include one or more of: Cu, Al, Ag, Au, W, or Co.

Example 13b: The apparatus of example 8b, wherein the first capacitor, the second capacitor, and the third capacitor include paraelectric material which includes one of: $SrTiO_3$, $Ba(x)Sr(y)TiO_3$ (where x is −0.5, and y is 0.95), $HfZrO_2$, Hf—Si—O, $BaTiO_3$, La-substituted $PbTiO_3$, lead zirconate titanate, or PMN-PT (lead magnesium niobate-lead titanate) based relaxor ferroelectrics.

Example 14b: The apparatus of example 8b, wherein the first capacitor, the second capacitor, and the third capacitor include ferroelectric material.

Example 15b: The apparatus of example 8b, wherein the device is a first device, wherein the supply rail is a power supply rail, wherein the control is a first control, wherein the multi-input gate comprises a second device coupled to the summing node and a ground supply rail, wherein the second device is controllable by a second control.

Example 16b: The apparatus of example 15b, wherein, in the first operation mode, the conditioning circuitry is to adjust a threshold of the multi-input gate to 2 after the second device is enabled first, and then the second device is disabled, and then the first device is enabled, and the first input is set to logic 1, the second input is set to logic 1, and the third input is set to logic 0.

Example 17b: The apparatus of example 16b, wherein, in the first operation mode, the conditioning circuitry is to adjust a threshold of the multi-input gate to 2 after the first device is enabled first, and then the first device is disabled, and then the second device is enabled, and the first input is set to logic 1, the second input is set to logic 0, and the third input is set to logic 0.

Example 18b: An apparatus comprising: an m-input validity circuitry to generate a first output indicative of a first validity of m number of inputs; an n-input validity circuitry to generate a second output indicative of a second validity of n number of inputs; and a 2-input consensus circuitry coupled to the m-input validity circuitry and the n-input validity circuitry, wherein the 2-input consensus circuitry is to generate a third output, wherein the m-input validity circuitry, the n-input validity circuitry, and the 2-input consensus circuitry comprise gates with adjustable threshold.

Example 19b: The apparatus of example 18b, wherein the gates with the adjustable threshold are configured as majority, minority gates, or OR gates.

Example 20b: A system comprising: a memory to store one or more instructions; a processor circuitry to execute the one or more instructions; and a communication device to allow the processor circuitry to communicate with another device, wherein the processor circuitry includes a validity tree which comprises an apparatus according to any one of examples 1b to 17b, or examples 18b to 19b.

Example 1c: An apparatus comprising: a first input; a second input; and a consensus circuitry coupled to the first input and the second input, wherein the consensus circuitry is to generate a consensus output which is indicative of a consensus of the first input and the second input, wherein the consensus circuitry comprises a gate to receive the first input, the second input, and a third input, wherein and the third input is coupled to an output of the gate which is the consensus output, wherein the gate comprises: a first capacitor having a first terminal coupled to the first input, and a second terminal coupled to a summing node; a second capacitor having a third terminal coupled to the second input, and a fourth terminal coupled to the summing node; and a third capacitor having a fifth terminal coupled to the third input, and a sixth terminal coupled to the summing node, wherein the first capacitor, the second capacitor, and the third capacitor are planar stacked capacitors.

Example 2c: The apparatus of example 1c comprising a circuitry to adjust logic levels of the first input, the second input, and a control in a first operation mode.

Example 3c: The apparatus of example 2c, wherein the gate comprises a device coupled to the summing node and a supply rail, wherein the device is controllable by the control, wherein the circuitry is to adjust a function of the gate in the first operation mode, and wherein the circuitry is to allow the gate to operate in accordance with the function in a second operation mode.

Example 4c: The apparatus of example 3c, wherein the function is a majority function.

Example 5c: The apparatus of example 1c, wherein the first capacitor, the second capacitor, and the third capacitor comprise linear dielectric material or paraelectric material.

Example 6c: The apparatus of example 1c, wherein the gate comprises: a first metal layer extending along an x-plane; a second metal layer extending along the x-plane, wherein the second metal layer is above the first metal layer; a first via extending along a y-plane, wherein the y-plane is orthogonal to the x-plane, wherein the first via couples the first metal layer with the second metal layer; a second via extending along the y-plane, wherein the second via couples the second metal layer, wherein the second via is above the first via; a first pedestal on the first metal layer, wherein the first pedestal is laterally offset from the first via; a second pedestal on the second metal layer, wherein the second pedestal is laterally offset from the second via, wherein the summing node is coupled to the first via; a first input line extending along a z-plane, wherein the z-plane is orthogonal to the x-plane and the y-plane, wherein the first input is coupled to the first input line; and a second input line extending along the z-plane, wherein the second input is coupled to the second input line.

Example 7c: The apparatus of example 6c, wherein the first capacitor comprises a first planar stack of materials including a first linear dielectric material or a first paraelectric material, wherein the first planar stack of materials has a first top electrode and a first bottom electrode, wherein the first linear dielectric material or the first paraelectric material is between the first top electrode and the first bottom electrode, wherein the first bottom electrode is on the first pedestal, wherein the first input line is on the first top electrode.

Example 8c: The apparatus of example 7c, wherein the second capacitor comprises a second planar stack of materials including a second linear dielectric material or a second paraelectric material, wherein the second planar stack of materials has a second top electrode and a second bottom electrode, wherein the second linear dielectric material or the second paraelectric material is between the second top electrode of the second planar stack of materials and the second bottom electrode and the second planar stack of materials, wherein the second bottom electrode is on the second pedestal, wherein the second input line is on the second top electrode of the second planar stack of materials.

Example 9c: The apparatus of example 7c, wherein the first linear dielectric material includes one of: SiO2, Al2O3, Li2O, HfSiO4, Sc2O3, SrO, HfO2, ZrO2, Y2O3, Ta2O5, BaO, WO3, MoO3, or TiO2.

Example 10c: The apparatus of example 3c, wherein the device is a pull-up device coupled to the summing node and a power supply rail.

Example 11c: The apparatus of example 10c, wherein the circuitry is to set logic levels of the first input, the second input, and the third input to logic high, and the control to enable or turn on the pull-up device in the first operation mode to adjust a threshold of the gate to 2.

Example 12c: The apparatus of example 10c, wherein the pull-up device is controlled by the control, wherein voltages on the first input, the second input, and the control are set in the first operation mode to adjust a threshold of the apparatus, wherein the control is to cause the pull-up device to be off in the second operation mode, wherein the second operation mode occurs after the first operation mode.

Example 13c: The apparatus of example 1c, wherein the first capacitor, the second capacitor, or the third capacitor include: a linear dielectric material includes one or more of: Si, Al, Li, Hf, Sc, Sr, Zr, Y, Ta, Ba, W, Mo, or Ti; and a top electrode and a bottom electrode, wherein the linear dielectric material is between the top electrode and the bottom electrode, wherein the top electrode or the bottom electrode include one or more of: Cu, Al, Ag, Au, W, or Co.

Example 14c: The apparatus of example 1c, wherein the first capacitor, the second capacitor, or the third capacitor include paraelectric material which includes one of: SrTiO3, Ba(x)Sr(y)TiO3 (where x is −0.5, and y is 0.95), HfZrO2, Hf—Si—O, BaTiO3, La-substituted PbTiO3, lead zirconate titanate, or PMN-PT (lead magnesium niobate-lead titanate) based relaxor ferroelectrics.

Example 15c: An apparatus comprising: a first input; a second input; a third input; a fourth input; a fifth input; and a gate to provide an output which is a consensus of the first input, the second input, and the third input, wherein the output is coupled to the fourth input and the fifth input, wherein the gate has a plurality of capacitors that are planar capacitors, and wherein the planar capacitors are vertically stacked.

Example 16c: The apparatus of example 15c, wherein the output is a logic high when the first input, the second input, and the third input are logic high, wherein the output is a logic low when the first input, the second input, and the third input are logic low, wherein the output retains its logic state when at least one of the first input, the second input, or the third input is a logic 1 and when the at least one of the first input, the second input, or the third input is a logic 0.

Example 17c: The apparatus of example 15c, wherein the gate comprises: a first capacitor having a first terminal coupled to the first input, and a second terminal coupled to a summing node; a second capacitor having a third terminal coupled to the second input, and a fourth terminal coupled to the summing node; a third capacitor having a fifth terminal coupled to the third input, and a sixth terminal coupled to the summing node; a fourth capacitor having a seventh terminal coupled to the fourth input and the fifth input, and an eighth terminal coupled to the summing node; a fifth capacitor having a ninth terminal coupled to the fourth input and the fifth input, and a tenth terminal coupled to the summing node, wherein the first capacitor, the second capacitor, the third capacitor, the fourth capacitor, and the fifth capacitor are part of the plurality of capacitors; and a device coupled to the summing node and a supply rail, wherein the device is controllable by a control.

Example 18c: The apparatus of example 15c comprises a circuitry to adjust a function of the gate by controlling the adjustable threshold in a first operation mode, and wherein the circuitry is to allow the gate to operate in accordance with the function in a second operation mode.

Example 19c: A system comprising: a memory to store one or more instructions; a processor circuitry to execute the one or more instructions; and a communication device to allow the processor circuitry to communicate with another device, wherein the processor circuitry includes a consensus circuitry which comprises an apparatus according to any one of examples 1c to 14c, or examples 15c to 18c.

Example 1d: An apparatus comprising: a first input; a second input; and a consensus circuitry coupled to the first input and the second input, wherein the consensus circuitry is to generate a consensus output which is indicative of a consensus of the first input and the second input, wherein the consensus circuitry comprises a gate to receive the first input, the second input, and a third input, wherein and the third input is coupled to an output of the gate which is the consensus output, wherein the gate comprises: a first capacitor having a first terminal coupled to the first input, and a second terminal coupled to a summing node; a second capacitor having a third terminal coupled to the second input, and a fourth terminal coupled to the summing node; and a third capacitor having a fifth terminal coupled to the third input, and a sixth terminal coupled to the summing node, wherein the first capacitor, the second capacitor, and the third capacitor are non-planar stacked capacitors.

Example 2d: The apparatus of example 1d comprising a circuitry to adjust logic levels of the first input, the second input, and a control in a first operation mode.

Example 3d: The apparatus of example 2d, wherein the gate comprises a device coupled to the summing node and a supply rail, wherein the device is controllable by the control, wherein the circuitry is to adjust a function of the gate in the first operation mode, and wherein the circuitry is to allow the gate to operate in accordance with the function in a second operation mode.

Example 4d: The apparatus of example 3d, wherein the function is a majority function.

Example 5d: The apparatus of example 1d, wherein the first capacitor, the second capacitor, and the third capacitor comprise linear dielectric material or paraelectric material.

Example 6d: The apparatus of example 1d, wherein the gate comprises a via extending along a y-plane, wherein the y-plane is orthogonal to an x-plane, wherein the via couples to a first metal layer; a first input line extending along the x-plane or a z-plane, wherein the z-plane is orthogonal to the x-plane and the y-plane, wherein the first input line is on an outer portion of the first capacitor, wherein the first input line is coupled to the first input; a second input line extending along the x-plane or the z-plane, wherein the second input line is on an output portion of the second capacitor, wherein the second input line is coupled to the second input; and a first transistor coupled to the via and a supply rail, wherein: the first capacitor includes a first linear dielectric material or a first paraelectric material, wherein the first capacitor includes an electrode coupled to the via, wherein the electrode is in a middle of the first capacitor; the second capacitor includes a second linear dielectric material or a second paraelectric material, wherein the electrode passes through a middle of the second capacitor; and the third capacitor including a third linear dielectric material or a third paraelectric material, wherein the electrode passes through a middle of the third capacitor.

Example 7d: The apparatus of example 6d, wherein the first capacitor includes: a first layer coupled to the electrode, wherein the first layer comprises metal; a second layer comprising the first linear dielectric material, wherein the second layer is around the first layer; and a third layer around the second layer, wherein the third layer comprises metal, wherein the second input line is adjacent to part of the third layer.

Example 8d: The apparatus of example 7d, wherein: the first layer has a first circumference; the second layer has a second circumference; and the third layer has a third circumference, wherein the third circumference is larger than the second circumference, wherein the second circumference is larger than the first circumference.

Example 9d: The apparatus of example 6d, wherein the first linear dielectric material includes one of: $SiO_2$, $Al_2O_3$, $Li_2O$, $HfSiO_4$, $Sc_2O_3$, $SrO$, $HfO_2$, $ZrO_2$, $Y_2O_3$, $Ta_2O_5$, $BaO$, $WO_3$, $MoO_3$, or $TiO_2$.

Example 10d: The apparatus of example 3d, wherein the device is a pull-up device coupled to the summing node and a power supply rail.

Example 11d: The apparatus of example 10d, wherein the circuitry is to set logic levels of the first input, the second input, and the third input to logic high, and the control to enable or turn on the pull-up device in the first operation mode to adjust a threshold of the gate to 2.

Example 12d: The apparatus of example 10d, wherein the pull-up device is controlled by the control, wherein voltages on the first input, the second input, and the control are set in the first operation mode to adjust a threshold of the apparatus, wherein the control is to cause the pull-up device to be off in the second operation mode, wherein the second operation mode occurs after the first operation mode.

Example 13d: The apparatus of example 1d, wherein the first capacitor, the second capacitor, or the third capacitor include: a linear dielectric material includes one or more of: Si, Al, Li, Hf, Sc, Sr, Zr, Y, Ta, Ba, W, Mo, or Ti; and a top electrode and a bottom electrode, wherein the linear dielectric material is between the top electrode and the bottom electrode, wherein the top electrode or the bottom electrode include one or more of: Cu, Al, Ag, Au, W, or Co.

Example 14d: The apparatus of example 1d, wherein the first capacitor, the second capacitor, or the third capacitor include paraelectric material which includes one of: SrTiO3, Ba(x)Sr(y)TiO3 (where x is −0.5, and y is 0.95), HfZrO2, Hf—Si—O, BaTiO3, La-substituted PbTiO3, lead zirconate titanate, or PMN-PT (lead magnesium niobate-lead titanate) based relaxor ferroelectrics.

Example 15d: An apparatus comprising: a first input; a second input; a third input; a fourth input; a fifth input; and a gate to provide an output which is a consensus of the first input, the second input, and the third input, wherein the output is coupled to the fourth input and the fifth input, wherein the gate has a plurality of capacitors that are non-planar capacitors, wherein the non-planar capacitors are vertically stacked.

Example 16d: The apparatus of example 15d, wherein the output is a logic high when the first input, the second input, and the third input are logic high, wherein the output is a logic low when the first input, the second input, and the third input are logic low, wherein the output retains its logic state when at least one of the first input, the second input, or the third input is a logic 1 and when the at least one of the first input, the second input, or the third input is a logic 0.

Example 17d: The apparatus of example 15d, wherein the gate comprises: a first transistor, the first transistor having a source region and a drain region, and a gate, wherein the first transistor is controllable by a first control; a first via coupled to the source region; a second via coupled to the drain region; a first metal layer over the first via, the first metal layer extending along an x-plane; a third via over the first metal layer, the third via in direct connection to the first metal layer, wherein the third via extends along a y-plane, wherein the y-plane is orthogonal to an x-plane; a first non-planar stack of materials including a first linear dielectric material or a first paraelectric material, wherein the first non-planar stack of materials includes an electrode coupled to the third via, wherein the electrode is in a middle of the first non-planar stack of materials; a second non-planar stack of materials including a second linear dielectric material or a second paraelectric material, wherein the electrode passes through a middle of the second non-planar stack of materials; a first input line extending along the x-plane or a z-plane, wherein the z-plane is orthogonal to the x-plane and the y-plane, wherein the first input line is on a portion of the first non-planar stack of materials, wherein the first input is coupled to the first input line; and a second input line extending along the x-plane or the z-plane, wherein the second input line is on a portion of the second non-planar stack of materials, wherein the second input is coupled to the second input line.

Example 18d: The apparatus of example 15d comprises a circuitry to adjust a function of the gate by controlling the adjustable threshold in a first operation mode, and wherein the circuitry is to allow the gate to operate in accordance with the function in a second operation mode.

Example 19d: A system comprising: a memory to store one or more instructions; a processor circuitry to execute the one or more instructions; and a communication device to allow the processor circuitry to communicate with another device, wherein the processor circuitry includes a consensus circuitry which comprises an apparatus according to any one of examples 1d to 14d, or examples 15d to 18d.

Example 1e: An apparatus comprising: a first input; a second input; and a consensus circuitry coupled to the first input and the second input, wherein the consensus circuitry is to generate a consensus output which is indicative of a consensus of the first input and the second input, wherein the consensus circuitry comprises a gate to receive the first input, the second input, and a third input, wherein and the third input is coupled to an output of the gate which is the consensus output, wherein the gate comprises: a first capacitor having a first terminal coupled to the first input, and a second terminal coupled to a summing node, wherein the first capacitor includes a first ferroelectric material; a second capacitor having a third terminal coupled to the second input, and a fourth terminal coupled to the summing node, wherein the second capacitor includes a second ferroelectric material; and a third capacitor having a fifth terminal coupled to the third input, and a sixth terminal coupled to the summing node, wherein the third capacitor includes a third ferroelectric material, wherein the first capacitor, the second capacitor, and the third capacitor are planar stacked capacitors.

Example 2e: The apparatus of example 1e comprising a circuitry to adjust logic levels of the first input, the second input, and a control in a first operation mode.

Example 3e: The apparatus of example 2e, wherein the gate comprises: a pull-up device coupled to the summing node and a supply rail, wherein the pull-up device is controllable by a first control, wherein the circuitry is to adjust a function of the gate in the first operation mode, and wherein the circuitry is to allow the gate to operate in accordance with the function in a second operation mode; and a pull-down device coupled to the summing node and a ground.

Example 4e: The apparatus of example 3e, wherein the function is a majority function.

Example 5e: The apparatus of example 1e, wherein the gate comprises: a first metal layer extending along an x-plane; a second metal layer extending along the x-plane, wherein the second metal layer is above the first metal layer; a first via extending along a y-plane, wherein the y-plane is orthogonal to the x-plane, wherein the first via couples the first metal layer with the second metal layer; a second via extending along the y-plane, wherein the second via couples the second metal layer, wherein the second via is above the first via; a first pedestal on the first metal layer, wherein the first pedestal is laterally offset from the first via; a second pedestal on the second metal layer, wherein the second pedestal is laterally offset from the second via; a summing node coupled to the first via; a first input line extending along a z-plane, wherein the z-plane is orthogonal to the x-plane and the y-plane, wherein the first input line is coupled to the first input; and a second input line extending along the z-plane, wherein the second input line is coupled to the second input.

Example 6e: The apparatus of example 5e, wherein the first capacitor comprises a first planar stack of materials including the first ferroelectric material, wherein the first planar stack of materials has a first top electrode and a first bottom electrode, wherein the first ferroelectric material is between the first top electrode and the first bottom electrode, wherein the first bottom electrode is on the first pedestal, wherein the first input line is on the first top electrode.

Example 7e: The apparatus of example 6e, wherein the second capacitor comprises a second planar stack of materials including the second ferroelectric material, wherein the second planar stack of materials has a second top electrode and a second bottom electrode, wherein the second ferroelectric material is between the second top electrode of the second planar stack of materials and the second bottom electrode and the second planar stack of materials, wherein the second bottom electrode is on the second pedestal, wherein the second input line is on the second top electrode of the second planar stack of materials.

Example 8e: The apparatus of example 7e, wherein the first ferroelectric material or the second ferroelectric material includes any of the ferroelectric materials discussed herein.

Example 9e: The apparatus of example 6e, wherein the first top electrode and the first bottom electrode of the first planar stack of materials includes one or more of: Cu, Al, Ag, Au, W, or Co.

Example 10e: The apparatus of example 3e, wherein the pull-up device is controlled by a first control, wherein the pull-down device is controlled by a second control, wherein voltages of the first input, the second input, the first control, and the second control are set in a first operation mode to adjust a threshold of the apparatus, wherein the first control is to cause the pull-up device to be off in a second operation mode, wherein the second control is to wherein the second operation mode occurs after the first operation mode.

Example 11e: An apparatus comprising: a first input; a second input; a third input; a fourth input; a fifth input; and a gate to provide an output which is a consensus of the first input, the second input, and the third input, wherein the output is coupled to the fourth input and the fifth input, wherein the gate has a plurality of capacitors that are planar capacitors having ferroelectric material, wherein the planar capacitors are vertically stacked.

Example 12e: The apparatus of example 11e, wherein the output is a logic high when the first input, the second input, and the third input are logic high, wherein the output is a logic low when the first input, the second input, and the third input are logic low, wherein the output retains its logic state when at least one of the first input, the second input, or the third input is a logic 1 and when the at least one of the first input, the second input, or the third input is a logic 0.

Example 13e: The apparatus of example 11e, wherein the gate comprises: a first transistor, the first transistor having a first source region and a first drain region, and a first gate, wherein the first gate is controllable by a first control; a second transistor, the second transistor having a second source region and a second drain region, and a second gate, wherein the second gate is controllable by a second control; a first via is coupled to the first source region; a second via is coupled to the first drain region; a first metal layer over the first via, the first metal layer extending along an x-plane; a second etch stop layer over the first metal layer; a third via, over the first metal layer, and etched through the second etch stop layer, the third via in direct connection to the first metal layer; a second metal layer extending along the x-plane, wherein the second metal layer is above the first metal layer, wherein the second metal layer couples the third via; an interlayer dielectric between the first metal layer and the second metal layer; a first pedestal filled with metal, wherein the first pedestal is coupled to the second metal layer; a first plurality of layers to form a first planar capacitor, wherein the first plurality of layers includes a first ferroelectric dielectric material, wherein a first layer of the first plurality of layers is in contact with a top portion of the first pedestal, wherein a second layer of the first plurality of layers is coupled to a first input line, wherein the first input line is coupled to the first input; a fourth via in direct connection to the second metal layer; a third metal layer over the fourth via, wherein the first plurality of layers is between the second metal layer and the third metal layer; a second pedestal filled with metal, wherein the second pedestal is coupled to the third metal layer; and a second plurality of layers to form a second planar capacitor, wherein the second plurality of layers includes a second ferroelectric dielectric material, wherein a first layer of the second plurality of layers is in direct contact with a top portion of the second pedestal, wherein a second layer of the second plurality of layers is coupled to a second input line, wherein the second input line is coupled to the second input.

Example 14e: The apparatus of example 11e, wherein the gate comprises: a first capacitor having a first terminal coupled to the first input, and a second terminal coupled to a summing node; a second capacitor having a third terminal coupled to the second input, and a fourth terminal coupled to the summing node; a third capacitor having a fifth terminal coupled to the third input, and a sixth terminal coupled to the summing node; a fourth capacitor having a seventh terminal coupled to the fourth input and the fifth input, and an eighth terminal coupled to the summing node; a fifth capacitor having a ninth terminal coupled to the fourth input and the fifth input, and a tenth terminal coupled to the summing node, wherein the first capacitor, the second capacitor, the third capacitor, the fourth capacitor, and the fifth capacitor are part of the plurality of capacitors; a pull-up device coupled to the summing node and a supply rail, wherein the pull-up device is controllable by a first control; and a pull-down device coupled to the summing node a ground rail, wherein the pull-down device is controllable by a second control.

Example 15e: The apparatus of example 11e comprises a circuitry to adjust a function of the gate by controlling the adjustable threshold in a first operation mode, and wherein the circuitry is to allow the gate to operate in accordance with the function in a second operation mode.

Example 16e: A system comprising: a memory to store one or more instructions; a processor circuitry to execute the one or more instructions; and a communication device to allow the processor circuitry to communicate with another device, wherein the processor circuitry includes a consensus circuitry which comprises an apparatus according to any one of examples 1e to 10e, or examples 11e to 15e.

Example 1f: An apparatus comprising: a first input; a second input; and a consensus circuitry coupled to the first input and the second input, wherein the consensus circuitry is to generate a consensus output which is indicative of a consensus of the first input and the second input, wherein the consensus circuitry comprises a gate to receive the first input, the second input, and a third input, wherein and the third input is coupled to an output of the gate which is the consensus output, wherein the gate comprises: a first capacitor having a first terminal coupled to the first input, and a second terminal coupled to a summing node, wherein the first capacitor includes a first ferroelectric material; a second capacitor having a third terminal coupled to the second input, and a fourth terminal coupled to the summing node, wherein the second capacitor includes a second ferroelectric material; and a third capacitor having a fifth terminal coupled to the third input, and a sixth terminal coupled to the summing node, wherein the third capacitor includes a third ferroelectric material, wherein the first capacitor, the second capacitor, and the third capacitor are non-planar stacked capacitors.

Example 2f: The apparatus of example 1f comprising a circuitry to adjust logic levels of the first input, the second input, and a control in a first operation mode.

Example 3f: The apparatus of example 2f, wherein the gate comprises: a pull-up device coupled to the summing node and a supply rail, wherein the pull-up device is controllable by a first control, wherein the circuitry is to adjust a function of the gate in the first operation mode, and wherein the circuitry is to allow the gate to operate in accordance with the function in a second operation mode; and a pull-down device coupled to the summing node and a ground.

Example 4f: The apparatus of example 3f, wherein the function is a majority function.

Example 5f: The apparatus of example 1f, wherein the gate comprises: a via extending along a y-plane, wherein the y-plane is orthogonal to an x-plane, wherein the via couples to a first metal layer; a first input line extending along the x-plane or a z-plane, wherein the z-plane is orthogonal to the x-plane and the y-plane, wherein the first input line is on an outer portion of the first capacitor; a second input line extending along the x-plane or the z-plane, wherein the second input line is on an output portion of the second capacitor; a first transistor coupled to the via and a supply rail; and a second transistor coupled to the via and a ground, wherein: the first capacitor includes an electrode coupled to the via, wherein the electrode is in a middle of the first capacitor; the electrode passes through a middle of the second capacitor; and the electrode passes through a middle of the third capacitor.

Example 6f: The apparatus of example 5f, wherein the first transistor is controlled by a first control, wherein the second transistor is controlled by a second control, wherein voltages on the first input line, the second input line, the first control, and the second control are set in a first operation mode to adjust a threshold of the apparatus.

Example 7f: The apparatus of example 6f, wherein the first control is to cause the first transistor to be off in a second operation mode, wherein the second control is to cause the second transistor to be off in the second operation mode, wherein the second operation mode occurs after the first operation mode.

Example 8f: The apparatus of example 5f, wherein the first capacitor includes: a first layer coupled to the electrode, wherein the first layer comprises metal; a second layer around the first layer, wherein the second layer comprises a first conductive oxide; a third layer comprising the first ferroelectric material, wherein the third layer is around the second layer; a fourth layer around the third layer, wherein the fourth layer comprises a second conductive oxide, wherein the fourth layer is around the third layer; and a fifth layer around the fourth layer, wherein the fifth layer comprises metal, wherein the first input line is adjacent to part of the fifth layer.

Example 9f: The apparatus of example 8f, wherein: the first layer has a first circumference; the second layer has a second circumference; the third layer has a third circumference; the fourth layer has a fourth circumference; and the fifth layer has a fifth circumference, wherein the fifth circumference is larger than the fourth circumference, wherein the fourth circumference is larger than the third circumference, wherein the third circumference is larger than the second circumference, wherein the second circumference is larger than the first circumference.

Example 10f: The apparatus of example 1f, wherein the first ferroelectric material or the second ferroelectric material includes any one of the ferroelectric materials discussed herein.

Example 11f: The apparatus of example 6f, wherein the electrode includes one or more of: Cu, Al, Ag, Au, W, or Co.

Example 12f: The apparatus of example 3f, wherein the pull-up device is controlled by a first control, wherein the pull-down device is controlled by a second control, wherein voltages of the first input, the second input, the first control, and the second control are set in a first operation mode to adjust a threshold of the apparatus, wherein the first control is to cause the pull-up device to be off in a second operation mode, wherein the second control is to wherein the second operation mode occurs after the first operation mode.

Example 13f: An apparatus comprising: a first input; a second input; a third input; a fourth input; a fifth input; and a gate to provide an output which is a consensus of the first input, the second input, and the third input, wherein the output is coupled to the fourth input and the fifth input, wherein the gate has a plurality of capacitors that are non-planar capacitors having ferroelectric material, wherein the non-planar capacitors are vertically stacked.

Example 14f: The apparatus of example 13f, wherein the output is a logic high when the first input, the second input, and the third input are logic high, wherein the output is a logic low when the first input, the second input, and the third input are logic low, wherein the output retains its logic state when at least one of the first input, the second input, or the third input is a logic 1 and when the at least one of the first input, the second input, or the third input is a logic 0.

Example 15f: The apparatus of example 13f, wherein the gate comprises: a first transistor, the first transistor having a source region and a drain region, and a gate, wherein the first transistor is controllable by a first control; a first via coupled to the source region; a second via coupled to the drain region; a first metal layer over the first via, the first metal layer extending along an x-plane; a third via over the first metal layer, the third via in direct connection to the first metal layer, wherein the third via extends along a y-plane, wherein the y-plane is orthogonal to an x-plane; a first non-planar stack of materials including a first ferroelectric material, wherein the first non-planar stack of materials includes an electrode coupled to the third via, wherein the electrode is in a middle of the first non-planar stack of materials; a second non-planar stack of materials including a second ferroelectric material, wherein the electrode passes through a middle of the second non-planar stack of materials; a first input line extending along the x-plane or a z-plane, wherein the z-plane is orthogonal to the x-plane and the y-plane, wherein the first input line is on a portion of the first non-planar stack of materials, wherein the first input is coupled to the first input line; and a second input line extending along the x-plane or the z-plane, wherein the second input line is on a portion of the second non-planar stack of materials, wherein the second input is coupled to the second input line.

Example 16f: The apparatus of example 13f comprises a circuitry to adjust a function of the gate by controlling the adjustable threshold in a first operation mode, and wherein the circuitry is to allow the gate to operate in accordance with the function in a second operation mode.

Example 17f: A system comprising: a memory to store one or more instructions; a processor circuitry to execute the one or more instructions; and a communication device to allow the processor circuitry to communicate with another device, wherein the processor circuitry includes a consensus circuitry which comprises an apparatus according to any of the examples 1f to 12f, and examples 13f to 16f.

Example 1g: An apparatus comprising: a first input; a second input; a third input; and a gate to receive the first input, the second input, and the third input, wherein and the third input is coupled to an output of the gate, wherein the output is a consensus of the first input and the second input, wherein the gate comprises: a first capacitor having a first terminal connected to the first input, and a second terminal coupled to a summing node, wherein the first capacitor comprises a first nonlinear polar material; a second capacitor having a third terminal connected to the second input, and a fourth terminal coupled to the summing node, wherein the first capacitor comprises a second nonlinear polar material; a third capacitor having a fifth terminal connected to the third input, and a sixth terminal coupled to the summing node, wherein the third capacitor comprises a third nonlinear polar material; and a device connected to the summing node and a supply rail, wherein the device has a gate terminal controllable by a control separate from the summing node.

Example 2g: The apparatus of example 1g, wherein first capacitor, the second capacitor, and the third capacitor are configured such that a voltage on the summing node is to reduce static leakage through the device.

Example 3g: The apparatus of example 2g, wherein the voltage on the summing node is close to rail-to-rail.

Example 4g: The apparatus of example 1g, wherein the first nonlinear polar material includes paraelectric material which includes one of: SrTiO3, Ba(x)Sr(y)TiO3 (where x is −0.5, and y is 0.95), HfZrO2, Hf—Si—O, BaTiO3, La-substituted PbTiO3, lead zirconate titanate, or PMN-PT (lead magnesium niobate-lead titanate) based relaxor ferroelectrics.

Example 5g: The apparatus of example 1g, wherein the first nonlinear polar material comprises a first ferroelectric material which includes any of the ferroelectric materials discussed herein.

Example 6g: The apparatus of example 1g, wherein the gate is to perform a majority or a minority function of the first input, the second input, and the third input.

Example 7g: The apparatus of example 1g, wherein the device is turned on in a reset mode, and wherein the device turned off in an evaluation mode separate from the reset mode.

Example 8g: An apparatus comprising: a first input; a second input; a third input; a fourth input; a fifth input; and a gate to provide an output which is a consensus of the first input, the second input, and the third input, wherein the output is coupled to the fourth input and the fifth input, wherein the gate includes a plurality of capacitors that are coupled to the first input, the second input, the third input, the fourth input, and the fifth input, and wherein the plurality of capacitors comprises nonlinear polar material, wherein the gate includes a device connected to the gate and controllable by a control disconnected from the plurality of capacitors.

Example 9g: The apparatus of example 8g, wherein the plurality of capacitors is configured such that a voltage on a summing node is to reduce static leakage through the device, wherein the plurality of capacitors is connected to the summing node.

Example 10g: The apparatus of example 9g, wherein the voltage on the summing node is close to rail-to-rail.

Example 11g: The apparatus of example 8g, wherein the nonlinear polar material includes paraelectric material which includes one of: SrTiO3, Ba(x)Sr(y)TiO3 (where x is −0.5, and y is 0.95), HfZrO2, Hf—Si—O, BaTiO3, La-substituted PbTiO3, lead zirconate titanate, or PMN-PT (lead magnesium niobate-lead titanate) based relaxor ferroelectrics.

Example 12g: The apparatus of example 8g, wherein the nonlinear polar material includes ferroelectric material.

Example 13g: The apparatus of example 8g, wherein the gate is to perform a majority or a minority function of the first input, the second input, the third input, the fourth input, and the fifth input.

Example 14g: The apparatus of example 8g, wherein the device is turned on in a reset mode, and wherein the device turned off in an evaluation mode separate from the reset mode.

Example 15g: A system comprising: a memory to store one or more instructions; a processor circuitry to execute the one or more instructions; and a communication device to allow the processor circuitry to communicate with another device, wherein the processor circuitry includes a consensus circuitry which comprises an apparatus according to any one of the examples 1g to 7g, or examples 8g to 14g.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first OR gate to generate a first output which is indicative of a first OR function between a first input and a second input;
a second OR gate to generate a second output which is indicative of a second OR function between a third input and a fourth input; and
a first consensus circuitry to determine a first consensus between the first output and the second output, wherein the first consensus circuitry is to generate a first consensus output which is representative of the first consensus, and wherein the first consensus circuitry comprises a first gate with a first adjustable threshold.

2. The apparatus of claim 1 further comprising:
a third OR gate to generate a third output which is indicative of a third OR function between a fifth input and a sixth input;
a fourth OR gate to generate a fourth output which is indicative of a fourth OR function between a seventh input and an eighth input; and
a second consensus circuitry to determine a second consensus between the third output and the fourth output, wherein the second consensus circuitry is to generate a second consensus output which is representative of the second consensus, and wherein the second consensus circuitry comprises a second gate with a second adjustable threshold.

3. The apparatus of claim 2 further comprising a third consensus circuitry coupled to the first consensus circuitry and the second consensus circuitry, wherein the third consensus circuitry is to determine a third consensus between the first consensus output and the second consensus output, and wherein the third consensus circuitry is to generate a third consensus output which is representative of the third consensus.

4. The apparatus of claim 3, wherein the third consensus circuitry comprises a third gate with a third adjustable threshold.

5. The apparatus of claim 3, wherein the third consensus output indicates a valid state or a neutral state based on logic values of the first input, the second input, the third input, the fourth input, the fifth input, the sixth input, the seventh input, and the eighth input.

6. The apparatus of claim 1, wherein the first OR gate comprises a first threshold gate with a threshold which is adjusted to function the first threshold gate as an OR gate.

7. The apparatus of claim 6, wherein the threshold is adjusted to 1.

8. The apparatus of claim 1, wherein the first consensus circuitry comprises:
a first input node to receive the first input;
a second input node to receive the second input;
a third input node;
a control;
a conditioning circuitry to adjust logic levels of the first input, the second input, and the control in a first operation mode; and
a multi-input gate to receive the first input, the second input, and the third input, wherein and the third input node is coupled to an output of the multi-input gate, and wherein the multi-input gate comprises:
a first capacitor having a first terminal coupled to the first input node, and a second terminal coupled to a summing node;
a second capacitor having a third terminal coupled to the second input node, and a fourth terminal coupled to the summing node;
a third capacitor having a fifth terminal coupled to the third input node, and a sixth terminal coupled to the summing node; and
a device coupled to the summing node and a supply rail, wherein the device is controllable by the control, wherein the conditioning circuitry is to adjust a function of the multi-input gate in the first operation mode, and wherein the conditioning circuitry is to allow the multi-input gate to operate in accordance with the function in a second operation mode.

9. The apparatus of claim 8, wherein the function is a majority function.

10. The apparatus of claim 8, wherein the first capacitor, the second capacitor, and the third capacitor comprise linear dielectric material, and wherein the linear dielectric material includes one of: SiO2, Al2O3, Li2O, HfSiO4, Sc2O3, SrO, HfO2, ZrO2, Y2O3, Ta2O5, BaO, WO3, MoO3, or TiO2.

11. The apparatus of claim 8, wherein the device is a pull-up device, wherein the conditioning circuitry is to set logic levels of the first input, the second input, and the third input to logic high, and the control to enable or turn on the pull-up device in the first operation mode to adjust a threshold of the multi-input gate to 2.

12. The apparatus of claim 8, wherein the first capacitor, the second capacitor, and the third capacitor include:
a linear dielectric material includes one or more of: Si, Al, Li, Hf, Sc, Sr, Zr, Y, Ta, Ba, W, Mo, or Ti; and
a top electrode and a bottom electrode, wherein the linear dielectric material is between the top electrode and the bottom electrode, and wherein the top electrode or the bottom electrode include one or more of: Cu, Al, Ag, Au, W, or Co.

13. The apparatus of claim 8, wherein the first capacitor, the second capacitor, and the third capacitor include paraelectric material which includes one of: SrTiO3, Ba(x)Sr(y)TiO3, HfZrO2, Hf—Si—O, BaTiO3, La-substituted PbTiO3, lead zirconate titanate, or PMN-PT (lead magnesium niobate-lead titanate) based relaxor ferroelectrics.

14. The apparatus of claim 8, wherein the first capacitor, the second capacitor, and the third capacitor include ferroelectric material.

15. The apparatus of claim 8, wherein the device is a first device, wherein the supply rail is a power supply rail, wherein the control is a first control, wherein the multi-input gate comprises a second device coupled to the summing node and a ground supply rail, and wherein the second device is controllable by a second control.

16. The apparatus of claim 15, wherein, in the first operation mode, the conditioning circuitry is to adjust a threshold of the multi-input gate to 2 after the second device is enabled first, and then the second device is disabled, and then the first device is enabled, and the first input is set to a logic 1, the second input is set to a logic 1, and the third input is set to a logic 0.

17. The apparatus of claim 16, wherein, in the first operation mode, the conditioning circuitry is to adjust a threshold of the multi-input gate to 2 after the first device is enabled first, and then the first device is disabled, and then the second device is enabled, and the first input is set to a logic 1, the second input is set to a logic 0, and the third input is set to a logic 0.

18. An apparatus comprising:
an m-input validity circuitry to generate a first output indicative of a first validity of m number of inputs;
an n-input validity circuitry to generate a second output indicative of a second validity of n number of inputs; and
a 2-input consensus circuitry coupled to the m-input validity circuitry and the n-input validity circuitry, wherein the 2-input consensus circuitry is to generate a third output, and wherein the m-input validity circuitry, the n-input validity circuitry, and the 2-input consensus circuitry comprise gates with adjustable threshold.

19. The apparatus of claim 18, wherein the gates with the adjustable threshold are configured as majority gates, minority gates, or OR gates.

20. A system comprising:
a memory to store one or more instructions;
a processor circuitry to execute the one or more instructions; and
a communication device to allow the processor circuitry to communicate with another device, wherein the processor circuitry includes a validity tree which comprises:
an m-input validity circuitry to generate a first output indicative of a first validity of m number of inputs;
an n-input validity circuitry to generate a second output indicative of a second validity of n number of inputs; and
a 2-input consensus circuitry coupled to the m-input validity circuitry and the n-input validity circuitry, and wherein the 2-input consensus circuitry is to generate a third output, and wherein the m-input validity circuitry, the n-input validity circuitry, and the 2-input consensus circuitry comprise gates with adjustable threshold.

\* \* \* \* \*